(12) United States Patent
Lowery, Jr. et al.

(10) Patent No.: US 9,568,575 B2
(45) Date of Patent: Feb. 14, 2017

(54) CONDUIT-CONTAINING DEVICES AND METHODS FOR ANALYTE PROCESSING AND DETECTION

(75) Inventors: Thomas Jay Lowery, Jr., Belmont, MA (US); Parris S. Wellman, Reading, MA (US); John J. McDonough, Sudbury, MA (US); James Franklin Chepin, Arlington, MA (US); Charles William Rittershaus, Malden, MA (US); Vasiliki Demas, Arlington, MA (US); Alison Skelley, Medford, MA (US)

(73) Assignee: T2 Biosystems, Inc., Lexington, MA (US)

( * ) Notice: Subject to any disclaimer, the term of this patent is extended or adjusted under 35 U.S.C. 154(b) by 965 days.

(21) Appl. No.: 13/878,935

(22) PCT Filed: Oct. 19, 2011

(86) PCT No.: PCT/US2011/056867
§ 371 (c)(1),
(2), (4) Date: Jun. 24, 2013

(87) PCT Pub. No.: WO2012/054589
PCT Pub. Date: Apr. 26, 2012

(65) Prior Publication Data
US 2013/0265054 A1 Oct. 10, 2013

Related U.S. Application Data

(60) Provisional application No. 61/405,929, filed on Oct. 22, 2010.

(51) Int. Cl.
*G01V 3/00* (2006.01)
*G01R 33/465* (2006.01)
*G01R 33/28* (2006.01)
*G01R 33/30* (2006.01)
*G01R 33/44* (2006.01)

(52) U.S. Cl.
CPC .......... *G01R 33/465* (2013.01); *G01R 33/281* (2013.01); *G01R 33/30* (2013.01); *G01R 33/448* (2013.01); *G01R 33/302* (2013.01)

(58) Field of Classification Search
CPC ......... G01V 8/20; G01R 33/30; G01R 33/302; G01R 33/4808; G01N 2015/149; H04N 1/00307; H04N 1/00355
USPC ........ 324/300, 311–319, 331, 345, 350, 463, 324/200, 213–219, 228, 232, 244–257, 324/750.12, 750.21, 500, 754.17; 600/407–435; 378/65, 378/153
See application file for complete search history.

(56) References Cited

U.S. PATENT DOCUMENTS

| 8,268,249 B2 * | 9/2012 | Carson ............... G01N 21/0303 204/452 |
| 2007/0155024 A1 | 7/2007 | Miethe et al. |
| 2008/0160622 A1 * | 7/2008 | Su ........................ G01N 1/4044 436/86 |

OTHER PUBLICATIONS

International Preliminary Report on Patentability for International Application No. PCT/US2011/056865, issued Apr. 23, 2013 (10 pages).

(Continued)

*Primary Examiner* — Melissa Koval
*Assistant Examiner* — Trung Nguyen
(74) *Attorney, Agent, or Firm* — Clark & Elbing LLP

(57) ABSTRACT

This invention features devices and methods for analyte processing and detection, and use of such methods, e.g., in the treatment and diagnosis of disease or determining the presence of a pathogen.

26 Claims, 19 Drawing Sheets

(56) References Cited

OTHER PUBLICATIONS

International Preliminary Report on Patentability for International Application No. PCT/US2011/056867, issued Apr. 23, 2013 (9 pages).
International Search Report and Written Opinion for International Application No. PCT/US2011/056865, mailed Apr. 20, 2012 (18 pages).
International Search Report and Written Opinion for International Application No. PCT/US2011/056867, mailed Apr. 20, 2012 (17 pages).

* cited by examiner

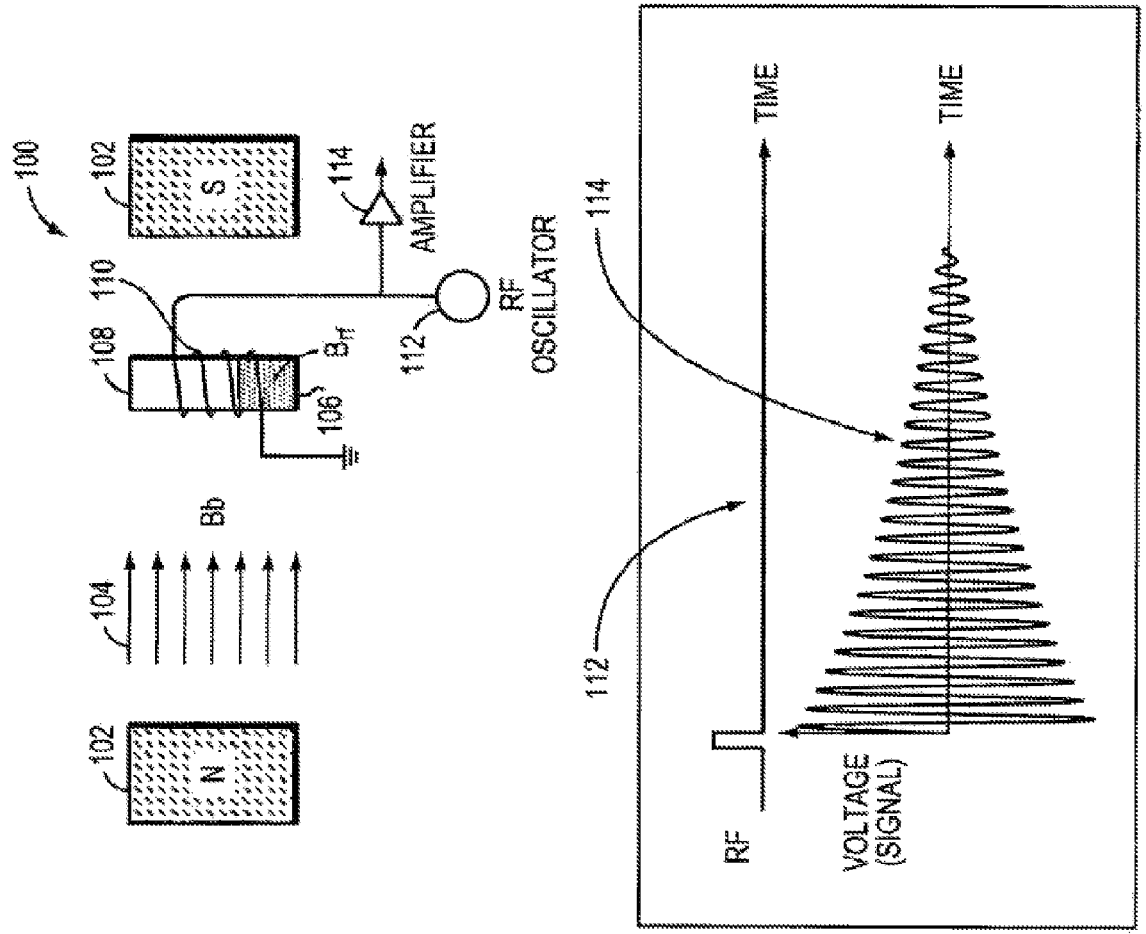

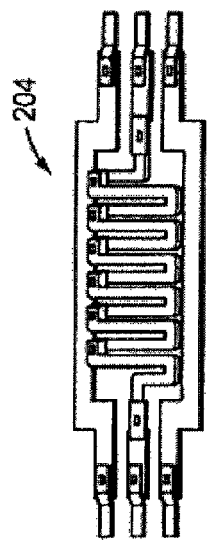
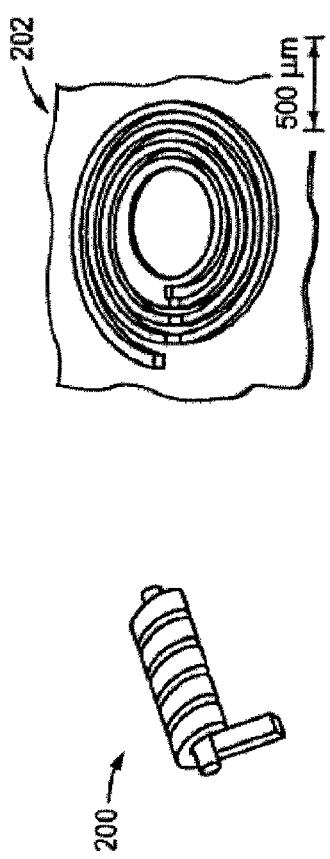
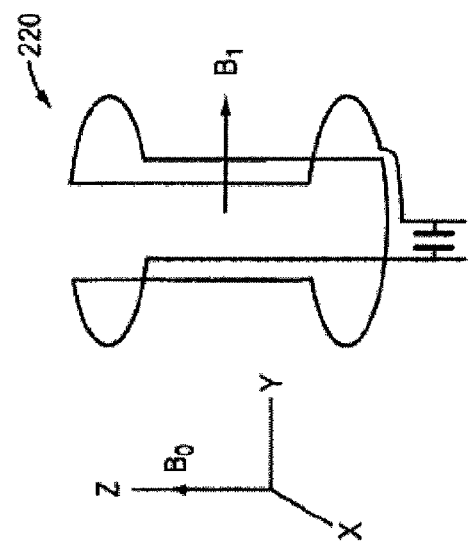
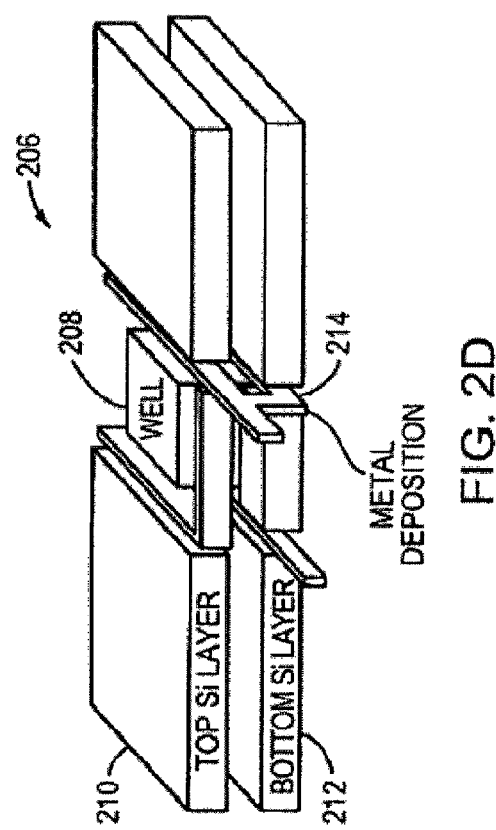
FIGURES 2A-2E

Tube Used for Sequential Reagent Storage

CONDUIT-CONTAINING DEVICES AND METHODS FOR ANALYTE PROCESSING AND DETECTION

CROSS-REFERENCE TO RELATED APPLICATIONS

This application is the U.S. National Stage filing under 35 U.S.C. §371 of International Application No. PCT/US2011/056867, filed on Oct. 19, 2011, which claims the benefit of U.S. Provisional Application No. 61/405,929, filed on Oct. 22, 2010.

BACKGROUND OF THE INVENTION

This invention features devices and methods for analyte processing and detection, and use of such methods in the treatment and diagnosis of disease.

Biocompatible magnetic sensors have been designed to detect molecular interactions in biological media. Upon target binding, these sensors cause changes in the spin-spin relaxation times of neighboring water molecules (or any solvent molecule with free hydrogens) of a sample, which can be detected by magnetic resonance techniques. Thus, by using these sensors in a sample, it is possible to detect the presence of an analyte at very low concentration—for example, small molecules, specific DNA, RNA, proteins, carbohydrates, organisms, and pathogens (e.g., viruses).

In general, magnetic sensors are superparamagnetic particles that bind or otherwise link to their intended molecular target to form clusters (aggregates). It is thought that when superparamagnetic particles assemble into clusters and the effective cross sectional area becomes larger, the ability of the clustered superparamagnetic particles to dephase the spins of surrounding water (or other solvent) protons is altered, leading to a change in the measured relaxation rates (e.g., 1/T2). Additionally, cluster formation is designed to be reversible (e.g., by temperature shift, chemical cleavage, pH shift, etc.) so that "forward" or "reverse" assays can be developed for detection of specific analytes. Forward (clustering) and reverse (declustering) types of assays can be used to detect a wide variety of biologically relevant materials.

There is a need in the art for a rapid, commercially realizable, fluidics-based device capable of multiplexed analyte detection suitable for use with magnetic nanosensors.

SUMMARY OF THE INVENTION

In general, the invention features devices and methods for analyte processing and detection.

The invention features a device that includes: (a) a conduit including: (a1) a conduit inlet configured for introduction of a sample at a first site of the conduit; (a2) a conduit outlet at a second site of the conduit; and (a3) a detection site configured for attachment or proximity of a detector capable of detecting an analyte; and (b) a plurality of magnets disposed downstream of the conduit inlet along at least a portion of the length of the conduit, each magnet creating a bias magnetic field, wherein: (b1) each magnet is capable of being adjusted to create a magnetic field gradient inside the conduit of sufficient strength to hold magnetic particles having binding moieties linked thereto in a particular volume in the conduit proximal to the magnet; (b2) each magnet is capable of being adjusted to create a magnetic field gradient inside the conduit of insufficient strength to hold the magnetic particles in a particular volume in the conduit proximal to the magnet; and (b3) the magnets are disposed along the conduit such that the bias magnetic fields of the plurality of magnets do not overlap significantly inside the conduit, wherein the device is configured to allow a plurality of analytes to bind to the binding moieties of the magnetic particles when the magnetic particles are held by the magnets in a particular volume in the conduit or are released from the particular volume in the conduit.

In some embodiments, the device features a plurality of conduits, wherein: (a) each conduit includes: (a1) a conduit inlet configured for introduction of a sample at a first site of the conduit, wherein the conduit inlet is common to all the conduits; (a2) a conduit outlet at a second site of the conduit, wherein the conduit outlet is common to all the conduits; (a3) a detection site configured for attachment or proximity of a detector capable of detecting an analyte, wherein the detection site is common to all the conduits; and (b) a corresponding plurality of magnets disposed downstream of the conduit inlet along at least a portion of the length of a corresponding conduit, each magnet creating a bias magnetic field, wherein: (b1) each magnet is capable of being adjusted to create a magnetic field gradient inside the corresponding conduit of sufficient strength to hold magnetic particles having binding moieties linked thereto in a particular volume in the corresponding conduit proximal to the magnet; and (b2) each magnet is capable of being adjusted to create a magnetic field gradient inside the corresponding conduit of insufficient strength to hold the magnetic particles in a particular volume in the corresponding conduit proximal to the magnet; and (b3) each magnet is disposed along the corresponding conduit such that the bias magnetic fields of the plurality of magnets do not overlap significantly inside the conduits, wherein the device is configured to allow a plurality of analytes to bind to the binding moieties of the magnetic particles when the magnetic particles are held by the magnets in a particular volume in the corresponding conduit or are released from the particular volume in the corresponding conduit.

The invention further features a device including: (a) a conduit including: (a1) a conduit inlet configured for introduction of a sample at a first site of the conduit; (a2) a conduit outlet at a second site of the conduit; (a3) a magnetizable foam insert inside the conduit between the conduit inlet and the conduit outlet; and (a4) a detection site configured for attachment or proximity of a detector capable of detecting an analyte; and (b) a magnet disposed outside the conduit proximal to the magnetizable foam insert, the magnet creating a bias magnetic field, wherein: (b1) the magnet is capable of being adjusted to create a magnetic field gradient inside the conduit of sufficient strength to hold magnetic particles having binding moieties linked thereto in or on the magnetizable foam insert; and (b2) the magnet is capable of being adjusted to create a magnetic field gradient inside the conduit of insufficient strength to hold the magnetic particles in or on the magnetizable foam insert; wherein the device is configured to allow the analyte to bind to the binding moieties of the magnetic particles when the magnetic particles are held in or on the magnetizable foam insert or are released from the magnetizable foam insert.

In some embodiments, the conduit further includes: (a3) a plurality of magnetizable foam inserts inside the conduit between the conduit inlet and the conduit outlet; and (b) a corresponding plurality of magnets disposed outside the conduit proximal to each corresponding magnetizable foam insert, each magnet creating a bias magnetic field, wherein: (b1) each magnet is capable of being adjusted to create a magnetic field gradient inside the conduit of sufficient strength to hold magnetic particles having binding moieties linked thereto in or on the corresponding magnetizable foam insert; and (b2) each magnet is capable of being adjusted to create a magnetic field gradient inside the conduit of insufficient strength to hold the magnetic particles in or on the corresponding magnetizable foam insert; wherein the device is configured to allow a plurality of analytes to bind to the binding moieties of the magnetic particles when the magnetic particles are held in or on a corresponding magnetizable foam insert or are released from the corresponding magnetizable foam insert.

In some embodiments, the device further includes a plurality of conduits, wherein: (a) each conduit includes: (a1) a conduit inlet configured for introduction of a sample at a first site of the conduit, wherein the conduit inlet is common to all the conduits; (a2) a conduit outlet at a second site of the conduit, wherein the conduit outlet is common to all the conduits; (a3) a magnetizable foam insert inside the conduit between the conduit inlet and the conduit outlet; (a4) a detection site configured for attachment or proximity of a detector capable of detecting an analyte, wherein the detection site is common to all the conduits; and (b) a corresponding plurality of magnets each disposed outside a corresponding conduit proximal to a corresponding magnetizable foam insert, the magnet creating a bias magnetic field, wherein: (b1) each magnet is capable of being adjusted to create a magnetic field gradient inside the corresponding conduit of sufficient strength to hold magnetic particles having binding moieties linked thereto in or on the corresponding magnetizable foam insert; and (b2) each magnet is capable of being adjusted to create a magnetic field gradient inside the corresponding conduit of insufficient strength to hold the magnetic particles in or on the corresponding magnetizable foam insert; wherein the device is configured to allow a plurality of analytes to bind to the binding moieties of the magnetic particles when the magnetic particles are held in or on the corresponding magnetizable foam insert or are released from the corresponding magnetizable foam insert.

In some embodiments of the devices of the invention, the conduit or plurality of conduits includes tubing, e.g., including high-density polyethylene, of driving hydraulic dimension (DHD) of between 10 µm and 20 mm, e.g., about 0.5 mm or 1.0 mm. In some embodiments, the thickness of the tubing is between 1% and 20%, e.g., about 10%, of the DHD.

In some embodiments, the conduit or plurality of conduits includes a channel, the walls of the channel including silicone, acrylic, nylon, acetal, thermoplastic polymers/rubber, polyethylene, HDPE, LDPE, polyurethane, polybutylene, glass, polypropylene, polycarbonate, polyoxymethylene, polypropylene, ethylene/propylene copolymer, polyvinyl chloride, polyester; polyamide, polyimide, polyurethane, polyacrylonitrile, ABS, PEEK, terpolymer of acrylates, styrene, acrylonitrile, styrene/acrylonitrile, styrene/butadiene, polybutylene, polystyrene, chlorinated polyethylene, fluoropolymers, Teflon, polycarbonate, polymethylmethacrylate, polyphenylene oxide, polypropylene oxide, cyclic olefin copolymer, cyclo olefin polymer, polyetheretherketone, polyketone, polysulfone, polyethylene terephthalate, acrylonitrile butadiene styrene, phenol/formaldehyde resin, or epoxy resin. In particular embodiments, the channel is between 10 µm and 20 mm in width, or between 10 µm and 20 mm in depth, or between 10 µm and 20 mm in diameter.

In some embodiments, the device further includes a fluidic actuation device fluidically connected to the conduit or plurality of conduits. In particular embodiments, the fluidic actuation device includes a vacuum source or syringe pump, or is capable of generating a plurality of flow rates, including reversed flow, or of generating laminar, turbulent, or mixed flow of a sample inside the conduit or plurality of conduits.

In some embodiments, the device is configured for measuring the presence or concentrations of the analyte or plurality of analytes, and wherein the device is further configured for introduction of one or more samples including the analyte or plurality of analytes. In particular embodiments, the one or more samples include one or more liquid samples, or the one or more samples include a biological sample, plant material, a plant by-product, an oil, other natural materials, or one or more samples derived therefrom. In particular embodiments, the biological sample is selected from the group consisting of blood, sweat, tears, urine, saliva, semen, seminal fluid, serum, plasma, cerebrospinal fluid (CSF), ascites, lymph, feces, vaginal fluid, vaginal tissue, sputum, nasopharyngeal aspirate or swab, lacrimal fluid, mucous, epithelial swab, buccal swab, tissue, tissue extract, skin, hair, organ, bone, tooth, tumor, and one or more samples derived therefrom. For example, the biological sample includes blood or urine.

In some embodiments, the analyte or plurality of analytes are selected from the group consisting of a protein, a peptide, a polypeptide, an amino acid, a nucleic acid, an oligonucleotide, RNA, DNA, an antibody, a carbohydrate, a polysaccharide, glucose, a lipid, a gas, an electrolyte, a lipoprotein, cholesterol, a fatty acid, a glycoprotein, a proteoglycan, a lipopolysaccharide, a cell surface marker, a cytoplasmic marker, a therapeutic agent, a metabolite of a therapeutic agent, a marker for the detection of a chemical weapon, a marker for the detection of a biological weapon, an organism, a pathogen, a parasite, a protist, a fungus, a bacterium, an actinomycete, a cell, a tumor cell, a stem cell, a white blood cell, a virus, a prion, a plant component, a plant by-product, algae, an algae by-product, plant growth hormone, an insecticide, a man-made toxin, an environmental toxin, an oil component, and components derived therefrom. In particular embodiments, the analyte or plurality of analytes include pathogens or components derived therefrom. In particular embodiments, the pathogens include fungi, e.g., *Candida* or a plurality of *Candida* strains, e.g., *C. albicans, C. glabrata, C. krusei, C. tropicalis*, or *C. parapsilosis*.

In some embodiments, the analyte or plurality of analytes include a general chemistry analyte, e.g., creatinine or an immunosuppressive drug, e.g., tacrolimus. In particular embodiments, the plurality of analytes include creatinine and tacrolimus. In other embodiments, the analyte or plurality of analytes include an antifungal drug, e.g., fluconazole.

In some embodiments, the analyte or plurality of analytes further include fungi including a plurality of *Candida* strains.

In some embodiments, the device is configured for measuring the presence or concentrations of, e.g., three, four, or more analytes, e.g., creatinine, tacrolimus, and a plurality of *Candida* strains. The device may further be configured for measuring the presence or concentration of fluconazole.

In some embodiments, the one or more samples including the analyte or plurality of analytes include from $1 \times 10^6$ to $1 \times 10^{16}$ of one or more of the analyte or plurality of analytes per milliliter of the one or more samples, or include from $1 \times 10^7$ to $1 \times 10^{11}$ of one or more of the analyte or plurality of analytes per milliliter of the one or more samples.

In some embodiments, the binding moieties of the magnetic particles have distinct specificities for the plurality of pathogens or the plurality of analytes, e.g., creatinine and tacrolimus; a plurality of *Candida* strains; creatinine, tacrolimus, and a plurality of *Candida* strains; or creatinine, tacrolimus, a plurality of *Candida* strains, and fluconazole.

In some embodiments, measuring the presence or concentrations of the analyte or plurality of analytes is used to diagnose a medical condition or a plant condition. In particular embodiments, the medical condition is an adverse drug response, e.g., an infection or a renal disorder, or is selected from the group consisting of pain, fever, infection, a cardiac condition, stroke, thrombosis, heart attack, a gastrointestinal disorder, a urinary tract disorder, a skin disorder, a blood disorder, and a cancer.

In some embodiments, the diagnosis of the plant condition includes measuring the presence or concentration of plant growth hormone, insecticide, a man-made toxin, an environmental toxin, a nucleic acid sequence associated with insect resistance or susceptibility, algae, or algae by-products.

In some embodiments, measuring the presence or concentrations of the analyte or plurality of analytes is used to determine an appropriate dose of a therapeutic agent in a patient from whom the one or more samples are derived.

In some embodiments, the device further includes a detector disposed at the detection site, wherein the detection site is attached or proximal to the conduit or plurality of conduits. In particular embodiments, the detector is fluidically connected to the detection site, wherein the detector includes a support defining a well for holding a sample including an analyte to be detected. In particular embodiments, the detection site includes the conduit outlet.

In some embodiments, the detector includes a nuclear magnetic resonance detector, magnetometer, SQUID detector, magnetoresistance detector, gradiometric detector, impedance detector, magneto-optical relaxation detector, acoustic membrane detector, frustrated total internal reflection detector, a fluorescence detector, a spectrophotometer, a mass spectrometer, a pH detector, an electrical conductivity detector, or an ultrasonic particle detector.

In some embodiments, the detector is configured to detect magnetic relaxation, magnetic resonance, diffusion, susceptibility, magnetometry, magnetism, magnetic particles, magnetoresistance (e.g., giant magnetoresistance or tunnel magnetoresistance), fluorescence, concentration, density, turbidity, UV or visible absorbance, pH change, luminosity, or reflectivity. In particular embodiments, the detector is configured to detect T1, T2, $T1_{rho}$, $T2_{rho}$, T2*, T1/T2, or T1-T2 hybrid relaxation times, diffusion, susceptibility, spectral width, or spectral shift or combinations of these detectors, e.g. fluorescence with NMR detection, or other multiplexing method as described herein.

In some embodiments, the detector is configured to determine whether an analyte is present or absent, or is configured to detect the amount of an analyte that is present.

In some embodiments, the device further includes a plurality of detectors disposed at a plurality of detection sites along the conduit or plurality of conduits.

In some embodiments, the conduit or plurality of conduits are disposed in a straight configuration, a looped configuration, or a multi-loop configuration.

In some embodiments, the conduit inlet is fluidically connected to a sample processing unit, which, e.g., is configured to load a sample. In particular embodiments, the sample processing unit includes an aliquotor; is configured to concentrate or perform extraction or lysis of a sample, e.g., to concentrate a sample or other fluid within the conduit or plurality of conduits at the sample processing unit; or is configured to expose a sample to a plurality of temperatures. In some embodiments, the sample processing unit includes a bead-beater, e.g., wherein the bead-beater is configured to lyse a pathogen and capture nucleic acid from the pathogen, e.g., a *Candida* cell.

In some embodiments, the conduit outlet is fluidically connected to a sample processing unit or detector. In particular embodiments, the sample processing unit is configured to assist in agglomeration of the magnetic particles, e.g., is configured to employ magnetic assisted agglomeration, e.g., gradient or homogenous field magnetic assisted agglomeration.

In some embodiments, the sample processing unit is configured to agitate a sample; to heat or incubate a sample; or to collect waste.

In some embodiments, the device is further configured to assist in agglomeration of the magnetic particles, e.g., is configured to employ magnetic assisted agglomeration, e.g., gradient or homogenous field magnetic assisted agglomeration.

In some embodiments, the magnetizable foam insert, e.g., comprising nickel, is disposed to assist in agglomeration of the magnetic particles.

In some embodiments, the device includes a detector that includes: i. a detector magnet creating a bias magnetic field inside a defined region including a sample including an analyte to be detected; and ii. an RF coil disposed about the defined region, the RF coil configured to detect a response produced by exposing the sample including an analyte to be detected to the bias magnetic field and an RF excitation, thereby detecting the analyte. In particular embodiments, the response results from application of an appropriate RF pulse sequence which allows probing of one or more MR parameters that can be detected in the acquired signal. In particular embodiments, the detector is configured to measure an NMR relaxation rate of a sample selected from T1, T2, $T1_{rho}$, $T2_{rho}$, T2*, T1/T2, or T1/T2 hybrid, and on the basis of the NMR relaxation rate to quantify a concentration or one or more analytes present in the sample. In particular embodiments, for at least a subset of the magnetic particles, the binding moieties are operative to alter an aggregation of the magnetic particles in the presence of an analyte.

In some embodiments, the RF coil is disposed about the detection site, and the defined region includes a region of the conduit or plurality of conduits at the detection site.

In some embodiments, the RF coil and the defined region are configured to provide a filling factor of at least about 0.01.

In some embodiments, the RF coil is disposed adjacent to the detection site but is not disposed about the detection site.

In some embodiments, the plurality of magnets includes, e.g., 2, 3, 4, 5, 10, 20, 30, 40, 50, 75, or 100 magnets. In particular embodiments, at least one of the plurality of magnets is a permanent magnet; is an electromagnet; or is a magnet of variable field.

In some embodiments, at least one of the plurality of magnets creates a field gradient between 0.1 mT/mm and 10 T/mm within the conduit or plurality of conduits.

In some embodiments, the plurality of magnets generate bias magnetic fields of average field strength between 0.01 T and 10.0 T and magnetic field gradients between 0.1 mT/mm and 10 T/mm within the conduit or plurality of conduits. In particular embodiments, the plurality of magnets generate bias magnetic fields of average field strength between 0.1 T and 1.0 T and field gradients between 10 mT/mm and 500 mT/mm within the conduit or plurality of conduits.

In some embodiments, the plurality of magnets are shaped and positioned to minimize the overlap of the bias magnetic fields of the plurality of magnets.

In some embodiments, the conduit or plurality of conduits are shaped to minimize overlap of the bias magnetic fields of the plurality of magnets.

In some embodiments, the detection site is disposed proximate to one of the plurality of magnets.

In some embodiments, the device further includes: (c) a plurality of supports defining a plurality of wells for holding samples or buffers, the plurality of supports disposed upstream of the magnet or plurality of magnets and fluidically connected to the conduit or plurality of conduits; (d) a plurality of valves fluidically connected to one or more of the plurality of supports defining the plurality of wells, wherein the plurality of valves modulate flow from the one or more of the plurality of supports defining the plurality of wells; (e) a sample processing unit configured to concentrate or perform extraction or lysis of a sample and fluidically connected to the conduit or said plurality of conduits; and (f) a first fluidic actuation device fluidically connected to the conduit or plurality of conduits.

In some embodiments, the sample processing unit includes a bead-beater.

In some embodiments, the sample processing unit configured to concentrate or perform extraction or lysis of a sample is further configured to receive a second fluidic actuation device, e.g., a syringe pump, to actuate the sample processing unit.

In some embodiments, the device is configured to amplify nucleic acid from a pathogen in the sample, thereby producing an amplicon from the nucleic acid, and is further configured to detect the amplicon. In some embodiments, the device further includes: (g) a plurality of zones including thermally conductive material, wherein the temperature of each zone is maintained or modulated independently of the other zones, and wherein the conduit or the plurality of conduits pass through the plurality of zones; and (h) a thermal controller coupled to the plurality of zones, wherein the thermal controller is programmed to maintain or modulate the temperature of each zone in a pre-defined manner.

In some embodiments, the sample processing unit includes a bead-beater configured to lyse the pathogen and capture nucleic acid from the pathogen. In some embodiments, a first of the plurality of wells is pre-filled with a first buffer capable of lysing the pathogen. In additional embodiments, a second of the plurality of wells is pre-filled with a second buffer capable of increasing binding of the nucleic acid of the pathogen to beads of the bead-beater. In some embodiments, a third of the plurality of wells is pre-filled with a third buffer that is operative to facilitate amplification of the nucleic acid of the pathogen and production of the amplicon. In some embodiments, the third buffer includes first and second oligonucleotides, the first oligonucleotide operative to bind to a first segment of the amplicon and the second oligonucleotide operative to bind to a second segment of the amplicon. In some embodiments, a fourth of the plurality of wells is pre-filled with a fourth buffer including magnetic particles having binding moieties linked thereto, wherein the binding moieties are specific for the nucleic acid from the pathogen. In some embodiments, the magnetic particles include a first population and a second population, wherein the binding moieties of the first population include a first oligonucleotide operative to bind to a first segment of the amplicon and the binding moieties of the second population include a second oligonucleotide operative to bind to a second segment of the amplicon, and wherein the first population and second population of the magnetic particles form aggregates in the presence of the amplicon.

In some embodiments, the conduit inlet is configured for introduction of a whole blood sample.

In some embodiments, the pathogen includes a *Candida* cell.

The invention further features a first method for detecting a plurality of analytes in a sample using any of the devices described herein, the method including the steps of: (a) providing a plurality of samples including magnetic particles having binding moieties linked thereto, wherein the binding moieties linked to the magnetic particles in each sample bind distinct analytes or include distinct analytes, and selecting one magnet of the device to correspond to each sample including magnetic particles; (b) adjusting one magnet among the selected magnets of step (a) that is downstream from the conduit inlet to create a magnetic field gradient inside the conduit corresponding to the magnet of sufficient strength to hold the magnetic particles of one sample in a particular volume in the corresponding conduit proximal to the magnet; (c) causing the sample including the magnetic particles corresponding to the magnet of step (b) to flow along the corresponding conduit until the sample reaches the magnetic field gradient of sufficient strength to hold the magnetic particles of the sample, thereby allowing the magnetic particles to be held in the particular volume in the corresponding conduit proximal to the magnet of step (b); (d) repeating steps (b) and (c) for each pair of remaining magnets and samples including magnetic particles; (e) causing the sample including the plurality of analytes to flow along the corresponding conduit or plurality of conduits and interact with each of the magnetic particles held within the conduit or plurality of conduits; (f) causing a sample including a buffer to flow along the corresponding conduit to a position proximal to the selected magnet of step (a) that is downstream from the conduit inlet, and adjusting the magnet to create a magnetic field gradient inside the corresponding conduit of insufficient strength to hold the magnetic particles of one sample in the particular volume in the corresponding conduit proximal to the magnet, thereby releasing the magnetic particles into the sample including the buffer; (g) causing the sample including the buffer and the magnetic particles to flow to the detection site and performing an assay on the sample including the buffer and the magnetic particles in order to detect one of the plurality of analytes; and (h) repeating steps (f) and (g) for each pair of remaining magnets and samples including magnetic particles.

The invention further features a second method for detecting an analyte in a sample using a device of the invention, said method including the steps of: (a) providing a sample including magnetic particles having binding moieties linked thereto, wherein the binding moieties bind the analyte or include the analyte; (b) adjusting the magnet to create a magnetic field gradient inside the conduit corresponding to the magnet of sufficient strength to hold the magnetic particles in or on the magnetizable foam insert; (c) causing the sample including the magnetic particles to flow along the corresponding conduit until the sample reaches the magnetizable foam insert, thereby allowing the magnetic particles to be held in or on the magnetizable foam insert; (d) causing the sample including the analyte to flow along the corresponding conduit and interact with the magnetic particles, thereby producing a mixed sample; (e) causing the mixed sample to move repeatedly through the magnetizable foam in alternating directions; (f) adjusting the magnet to create a magnetic field gradient inside the corresponding conduit of insufficient strength to hold the magnetic particles in or on the magnetizable foam insert, thereby releasing the magnetic particles into the mixed sample; and (g) causing the mixed sample to flow to the detection site and performing an assay on the mixed sample in order to detect the analyte.

In some embodiments of the first method, step (b) includes adjusting one magnet among the selected magnets of step (a) that is furthest downstream from the conduit inlet.

In some embodiments, each sample of step (a) includes magnetic particles of average size ranging from 20 to 50 nm, from 50 to 200 nm, from 100 to 300 nm, from 250 to 500 nm, from 400 to 600 nm, from 500 to 750 nm, from 700 to 1,200 nm, from 1,000 to 1,500 nm, or from 1,500 to 2,000 nm.

In some embodiments, each sample of step (a) includes from $1\times10^5$ to $1\times10^{17}$ of the magnetic particles per milliliter of the sample. In particular embodiments, each sample of step (a) includes from $1\times10^6$ to $1\times10^{14}$ of the magnetic particles per milliliter of the sample.

In some embodiments, the binding moieties include oligonucleotides, nucleic acids, polypeptides, antibodies, polysaccharides, or aptamers.

In some embodiments, the binding moieties include cobalt, nickel, manganese, gadolinium, copper, copper sulfate, praseodymium, neodymium, europium, an alloy, an MRI contrast agent material, or an ionic form of iron. In particular embodiments, the binding moieties include ferritin or another metal carrying a protein loaded with cobalt, nickel, manganese, gadolinium, copper, copper sulfate, praseodymium, neodymium, europium, an alloy, an MRI contrast agent material, or an ionic form of iron.

In some embodiments of the first method, one or more of the samples of steps (c) through (h) forms a slug in the conduit. In some embodiments of the second method, one or more of the samples of steps (c) through (g) forms a slug in the conduit or plurality of conduits.

In particular embodiments, the slug is between 100 fL and 10 mL in volume, or the length of the slug along a conduit is between 0.1 μm and 10 cm. In particular embodiments, the ratio of the width of the slug across a conduit to the length of the slug is between 1:100 and 100:1.

In some embodiments, the device further includes a fluidic actuation device, wherein the fluidic actuation device generates a plurality of flow rates, including reversed flow.

In some embodiments, the method includes an agglomerative assay, a competitive disaggregation assay, or an inhibition agglomerative assay.

In some embodiments of the second method, the magnetizable foam insert, e.g., including nickel, is disposed to assist in agglomeration of the magnetic particles. In some embodiments of the second method, step (d) and/or (e) includes performing cycling gradient magnetic assisted agglomeration in proximity to the magnetizable foam insert.

In some embodiments of the first method, the method further includes a wash step between steps (c) and (d), steps (d) and (e), or steps (e) and (f), the wash step including causing a sample including a wash buffer to flow along the conduit or plurality of conduits and over the magnetic particles. In some embodiments of the second method, the method further includes a wash step between steps (c) and (d) or steps (e) and (f), the wash step including causing a sample including a wash buffer to flow along the conduit or plurality of conduits and over the magnetic particles. In particular embodiments, the wash buffer includes Tris, Tris/Borate/EDTA, HEPES, PBS, distilled water, DMSO, acetonitrile, methanol, SDS, Tween, Triton, protein additive, polymer additive, or mixtures thereof.

In some embodiments of the first method, the method further includes a cleaning step prior to step (c) or following step (h), the cleaning step including causing a sample including a cleaning buffer to flow along the conduit and through the conduit outlet, wherein the cleaning buffer operates to remove at least a subset of nonspecifically bound magnetic particles, analytes, or other sample components or debris from the conduit or plurality of conduits. In some embodiments of the second method, the method further includes a cleaning step prior to step (c) or following step (g), the cleaning step including causing a sample including a cleaning buffer to flow along the conduit or plurality of conduits and through the conduit outlet, wherein the cleaning buffer operates to remove at least a subset of nonspecifically bound magnetic particles, analytes, or other sample components or debris from the conduit or plurality of conduits. In particular embodiments, the cleaning buffer includes Tris, Tris/Borate/EDTA, HEPES, PBS, distilled water, DMSO, acetonitrile, methanol, SDS, Tween, Triton, protein additive, polymer additive, or mixtures thereof; for example, the cleaning buffer may include about 50 mM HEPES, about 30% acetonitrile, and about 0.1% SDS.

In some embodiments, a sized loop of preselected volume is fluidically connected to the conduit inlet, the sized loop facilitating the introduction of a preselected volume of sample into the conduit or plurality of conduits.

In some embodiments of the first method, the device operates to concentrate one or more of the analytes by a factor of at least 2 in comparison to the concentration of the analyte in the sample including the plurality of analytes in step (e). In particular embodiments, the device operates to concentrate one or more of the analytes by a factor of about 2-10 in comparison to the concentration of the analyte in the sample including the plurality of analytes in step (e). In some embodiments of the second method, the device operates to concentrate one or more of the analytes by a factor of at least 2 in comparison to the concentration of the analyte in the sample including the analyte in step (d). In particular embodiments, the device operates to concentrate one or more of the analytes by a factor of about 2-10 in comparison to the concentration of the analyte in said sample including the analyte in step (d).

In some embodiments, the sample including the analyte or plurality of analytes is a liquid sample.

In some embodiments, the sample including the analyte or plurality of analytes includes a biological sample, plant material, a plant by-product, an oil, other natural materials, or one or more samples derived therefrom. In particular embodiments, the biological sample is selected from the group consisting of blood, sweat, tears, urine, saliva, semen, seminal fluid, serum, plasma, cerebrospinal fluid (CSF), ascites, lymph, feces, vaginal fluid, vaginal tissue, sputum, nasopharyngeal aspirate or swab, lacrimal fluid, mucous, epithelial swab, buccal swab, tissue, tissue extract, skin, hair, organ, bone, tooth, tumor, and one or more samples derived therefrom. In particular embodiments, the biological sample includes blood or urine.

In some embodiments, the analyte or plurality of analytes are selected from the group consisting of a protein, a peptide, a polypeptide, an amino acid, a nucleic acid, an oligonucleotide, RNA, DNA, an antibody, a carbohydrate, a polysaccharide, glucose, a lipid, a gas, an electrolyte, a lipoprotein, cholesterol, a fatty acid, a glycoprotein, a proteoglycan, a lipopolysaccharide, a cell surface marker, a cytoplasmic marker, a therapeutic agent, a metabolite of a therapeutic agent, a marker for the detection of a chemical weapon, a marker for the detection of a biological weapon, an organism, a pathogen, a parasite, a protist, a fungus, a bacterium, an actinomycete, a cell, a tumor cell, a stem cell, a white blood cell, a virus, a prion, a plant component, a plant by-product, algae, an algae by-product, plant growth hormone, an insecticide, a man-made toxin, an environmental toxin, an oil component, and components derived therefrom. In particular embodiments, the analyte or plurality of analytes include pathogens or components derived therefrom. In particular embodiments, the pathogens include fungi, e.g., Candida or a plurality of Candida strains, e.g., C. albicans, C. glabrata, C. krusei, C. tropicalis, or C. parapsilosis.

In some embodiments, the analyte or plurality of analytes include a general chemistry analyte, e.g., creatinine or an immunosuppressive drug, e.g., tacrolimus. In particular embodiments, the plurality of analytes include creatinine and tacrolimus. In other embodiments, the analyte or plurality of analytes include an antifungal drug, e.g., fluconazole.

In some embodiments, the plurality of analytes further include fungi including a plurality of Candida strains.

In some embodiments, the method includes measuring the presence or concentrations of, e.g., three, four, or more analytes, e.g., creatinine, tacrolimus, and a plurality of Candida strains. The method may further include measuring the presence or concentration of fluconazole.

In some embodiments, the one or more samples including the analyte or plurality of analytes include from $1\times10^6$ to $1\times10^{16}$ of one or more of the analyte or plurality of analytes per milliliter of the one or more samples, or include from $1\times10^7$ to $1\times10^{11}$ of one or more of the analyte or plurality of analytes per milliliter of the one or more samples.

In some embodiments, the binding moieties of the magnetic particles have distinct specificities for the plurality of pathogens or the plurality of analytes, e.g., creatinine and tacrolimus; a plurality of Candida strains; creatinine, tacrolimus, and a plurality of Candida strains; or creatinine, tacrolimus, a plurality of Candida strains, and fluconazole.

In some embodiments, measuring the presence or concentrations of the plurality of analytes is used to diagnose a medical condition or a plant condition. In particular embodiments, the medical condition is an adverse drug response, e.g., an infection or a renal disorder, or is selected from the group consisting of pain, fever, infection, a cardiac condition, stroke, thrombosis, heart attack, a gastrointestinal disorder, a urinary tract disorder, a skin disorder, a blood disorder, and a cancer.

In some embodiments, the diagnosis of the plant condition includes measuring the presence or concentration of plant growth hormone, insecticide, a man-made toxin, an environmental toxin, a nucleic acid sequence associated with insect resistance or susceptibility, algae, or algae by-products.

In some embodiments, measuring the presence or concentrations of the plurality of analytes is used to determine an appropriate dose of a therapeutic agent in a patient from whom the one or more samples are derived.

The invention further features a device that includes: (a) a plurality of zones including thermally conductive material, wherein the temperature of each zone is maintained or modulated independently of the other zones; (b) a conduit for conducting flow of a sample through the zones, the conduit including a conduit inlet configured for introduction of the sample at a first site of the conduit and a conduit outlet at a second site of the conduit, wherein the conduit passes through each of the plurality of zones, and wherein the conduit is further configured to receive a fluidic actuation device; and (c) a thermal controller coupled to the plurality of zones, wherein the thermal controller is programmed to maintain or modulate the temperature of each zone in a pre-defined manner. The device may be used in connection with any of the other devices or methods described herein. The invention further features a method for exposing a sample to a plurality of temperatures using the device, the method including the steps of: (a) programming the thermal controller to maintain or modulate the temperature of each zone in a pre-defined manner; (b) causing the sample to flow into the conduit inlet and through each zone in accordance with the programming of step (a); and (c) causing the sample to flow out of the conduit outlet, thereby exposing the sample to the plurality of temperatures, wherein the flow is optionally reversible.

The invention further features a device including: (a) a first unit including: (a1) a slot for insertion of a cartridge including a first sample including an analyte and a second sample including magnetic particles having binding moieties linked thereto, and (a2) a pin manifold configured to be detachably attached to the cartridge, the pin manifold including a plurality of pins each capable of being fluidically connected to a sample of the cartridge; (b) a mixing manifold fluidically connected to the pin manifold through a plurality of conduits, wherein at least portions of the first sample and the second sample are mixed in the mixing manifold; and (c) a second unit fluidically connected to the mixing manifold downstream of the mixing manifold by a further conduit, the second unit including: (c1) a support defining a well for holding a third sample including the magnetic particles and the analyte; (c2) a magnet creating a bias magnetic field inside the well; and (c3) an RF coil disposed about the well, the RF coil configured to detect a signal produced by exposing the third sample to the bias magnetic field and an RF excitation, thereby detecting the analyte, wherein the device is configured to receive a fluidic actuation device.

In some embodiments, the device further includes a fluidic actuation device. In particular embodiments, the fluidic actuation device includes a vacuum source or syringe pump.

In some embodiments, the fluidic actuation device is capable of generating a plurality of flow rates, including reversed flow, in one or more of the conduits.

In some embodiments, the fluidic actuation device is capable of generating laminar, turbulent, or mixed flow of a sample inside one or more of the conduits.

In some embodiments, the devices further includes a third unit disposed between the first unit and the mixing manifold, the third unit fluidically connected to the first unit and the mixing manifold, wherein the third unit is a sample processing unit. In particular embodiments, the third unit is capable of concentration, extraction, or lysis; is capable of exposing a sample to a plurality of temperatures; or includes a device that includes: (a) a plurality of zones including thermally conductive material, wherein the temperature of each zone is maintained or modulated independently of the other zones; (b) a conduit for conducting flow of a sample through the zones, the conduit including a conduit inlet configured for introduction of the sample at a first site of the conduit and a conduit outlet at a second site of the conduit, wherein the conduit passes through each of the plurality of zones, and wherein the conduit is further configured to receive a fluidic actuation device; and (c) a thermal controller coupled to the plurality of zones, wherein the thermal controller is programmed to maintain or modulate the temperature of each zone in a pre-defined manner.

In some embodiments, the device further includes a fourth unit disposed between the third unit and the mixing manifold, the fourth unit fluidically connected to the third unit and the mixing manifold, wherein the fourth unit is a sample processing unit. In particular embodiments, the third unit is configured to concentrate a sample or perform extraction or lysis of a sample, and the fourth unit is configured to expose a sample to a plurality of temperatures.

In some embodiments, the device further includes a fifth unit disposed between the mixing manifold and the second unit, the fifth unit fluidically connected to the mixing manifold and the second unit, wherein the fifth unit is a sample processing unit. In particular embodiments, the fifth unit is configured to bind the analyte to the magnetic particles. In particular embodiments, the fifth unit is configured to conduct a multiplexed assay including binding a plurality of analytes to a plurality of types of magnetic particles. In particular embodiments, the fifth unit includes any of the devices described herein. In particular embodiments, the fifth unit is further configured to employ gradient or homogenous field magnetic assisted agglomeration.

In some embodiments, the fifth unit is configured to agitate a sample. In particular embodiments, the agitating includes vortexing or sonicating.

In some embodiments, the fifth unit is configured to heat or incubate a sample.

In some embodiments, the device further includes a sixth unit and a seventh unit each disposed between the mixing manifold and the second unit, the sixth and seventh units fluidically connected to each other and to the mixing manifold and the second unit, wherein: i. the fifth unit is configured to conduct a multiplexed assay including binding a plurality of analytes to a plurality of types of magnetic particles and is further configured to employ gradient or homogenous field magnetic assisted agglomeration; ii. the sixth unit is configured to agitate a sample; and iii. the seventh unit is configured to heat or incubate a sample.

In some embodiments, the device further includes a waste unit configured to receive waste generated from operation of the device.

In some embodiments, the device further includes a plurality of mixing manifolds and/or valve manifolds between two units.

In some embodiments, the device further includes the cartridge, wherein the cartridge is disposed in the slot in the first unit. The invention further features a method for detecting an analyte using the device, the method including the steps of: (a) fluidically connecting the pins to the first sample including the analyte and the second sample including the magnetic particles having binding moieties linked thereto; (b) causing the first sample and the second sample, or samples derived therefrom, to flow along the plurality of conduits to the mixing manifold and allowing at least portions of the first sample and the second sample, or samples derived therefrom, to form a mixture in the mixing manifold; (c) causing the mixture of step (b), or a sample derived therefrom including the magnetic particles and the analyte, to flow into the well; (d) exposing the sample in the well to be exposed to an RF excitation; (e) following step (d), detecting a signal produced by the sample; and (f) on the basis of the result of step (e), detecting the analyte.

Any of the methods described herein may be used in connection with any of the devices described herein.

DEFINITIONS

By "about" is meant ±10% of the recited value.

By "adjusting" in the context of a magnet is meant changing a characteristic of the magnet so that the magnetic field and/or magnetic field gradient at a reference point is changed. A magnet may be adjusted, e.g., by varying the distance or orientation of the magnet relative to the reference point; by varying the current flowing through the magnet, e.g., in the case of a variable electromagnet; or by any other method known in the art.

"Aggregation" and "agglomeration" are used interchangeably in the context of the magnetic particles described herein and mean the binding of two or more magnetic particles to one another, e.g., via a multivalent analyte, multimeric form of analyte, antibody, nucleic acid molecule, or other binding molecule or entity. In some instances, magnetic particle agglomeration is reversible.

By "aliquotor" is meant a device that performs or facilitates aliquoting of one or more samples.

By "analyte" is meant a substance or a constituent of a sample to be analyzed. Exemplary analytes include one or more species of one or more of the following: a protein, a peptide, a polypeptide, an amino acid, a nucleic acid, an oligonucleotide, RNA, DNA, an antibody, a carbohydrate, a polysaccharide, glucose, a lipid, a gas (e.g., oxygen or carbon dioxide), an electrolyte (e.g., sodium, potassium, chloride, bicarbonate, BUN, creatinine, glucose, magnesium, phosphate, calcium, ammonia, lactate), a lipoprotein, cholesterol, a fatty acid, a glycoprotein, a proteoglycan, a lipopolysaccharide, a cell surface marker (e.g., CD3, CD4, CD8, IL2R, or CD35), a cytoplasmic marker (e.g., CD4/CD8 or CD4/viral load), a therapeutic agent, a metabolite of a therapeutic agent, a marker for the detection of a weapon (e.g., a chemical or biological weapon), an organism, a pathogen, a parasite (e.g., a protozoan or a helminth), a protist, a fungus (e.g., yeast or mold), a bacterium, an actinomycete, a cell (e.g., a whole cell, a tumor cell, a stem cell, a white blood cell, a T cell (e.g., displaying CD3, CD4, CD8, IL2R, CD35, or other surface markers), or another cell identified with one or more specific markers), a virus, a prion, a plant component, a plant by-product, algae, an algae by-product, plant growth hormone, an insecticide, a man-made toxin, an environmental toxin, an oil component, and components derived therefrom. Additional exemplary analytes are described herein.

By "bead-beater" is meant a sample processing unit that includes a chamber in which beads are trapped, e.g., 0.1 mm to 2 mm beads of a zirconium-silica mix, wherein the beads are configured to lyse cells or otherwise disrupt a sample. For example, a bead-beater may include a motor-driven impeller, e.g., which rotates at high speeds, e.g., ~40,000 RPM, when attached to a battery pack. A bead-beater may have a luer-lok fixture that allows the bead-beater to be connected to a syringe. In some instances, an aspiration or expulsion tube may be attached to the other side of the bead-beater, e.g., via a second luer-lok fixture. An exemplary bead-beater is the PureLyse™ device manufactured by Claremont BioSolutions.

By "bias magnetic field" is meant a fixed or variable magnetic field applied to something, e.g., another magnetic device or particles.

By "magnetic field gradient of sufficient strength to hold magnetic particles," in the context of sample flow through a conduit, is meant a magnetic field gradient that exerts a sufficient force on magnetic particles in a sample flowing through the magnetic field gradient to hold the magnetic particles in place, e.g., in a particular volume in the conduit, e.g., in or on a magnetizable foam insert or against an inner surface of the conduit proximal to the magnet generating the magnetic field gradient. The magnetic field gradient may be, e.g., substantially parallel or perpendicular to the direction of flow in the conduit, or may have both parallel and perpendicular components.

By "magnetic field gradient of insufficient strength to hold magnetic particles," in the context of sample flow through a conduit, is meant a magnetic field gradient that exerts an insufficient force on magnetic particles to hold them in place, e.g., in a particular volume in the conduit, e.g., in or on a magnetizable foam insert or against an inner surface of the conduit proximal to the magnet generating the magnetic field gradient. For example, when the magnetic field gradient changes from sufficient to insufficient strength, the held magnetic particles are released from the particular volume of the conduit, e.g., the inner surface of the conduit, e.g., into a sample in fluidic contact with the magnetic particles. Encompassed within this definition is a bias magnetic field and/or field gradient of zero.

By "biological sample" is meant a sample derived from an organism, e.g., a human. Exemplary biological samples are blood, sweat, tears, urine, saliva, semen, seminal fluid, serum, plasma, cerebrospinal fluid (CSF), ascites, lymph, feces, vaginal fluid, vaginal tissue, sputum, nasopharyngeal aspirate or swab, lacrimal fluid, mucous, epithelial swab, buccal swab, tissue, skin, hair, organ, bone, tooth, tumor, or one or more samples derived therefrom, e.g., an extract of one or more of the biological samples described herein, e.g., a tissue extract. Additional exemplary biological sample are described herein.

By "cartridge" is meant a unit containing a plurality of samples, e.g., samples containing an analyte, magnetic beads, other reagent(s), buffers, or solvents.

By "conduit" is meant a tube or channel, or a system of tubes or channels, for conveyance of samples, e.g., samples containing analytes, magnetic particles, or other reagents. A conduit may pass through, e.g., one or more valves, mixing manifolds, or sample processing units. A conduit may include, e.g., an injection molded piece.

"Derivatizable foam" and "derivatizable mesh" are used interchangeably herein and mean a foam, e.g., magnetizable or non-magnetizable, which may be derivatized, e.g., with binding moieties, e.g., nucleic acid molecules, antibodies, or otherwise as described herein. In some instances, the foam comprises metal, e.g., magnetizable or non-magnetizable.

"Derivatized foam" and "derivatized mesh" are used interchangeably herein and mean a piece of derivatizable foam that has been derivatized, e.g., with binding moieties, e.g., nucleic acid molecules, antibodies, or otherwise as described herein.

By "do not overlap significantly inside said conduit," in the context of bias magnetic fields of two magnets, is meant that the magnetic fields created by the magnets are never both greater than a predefined threshold at any position in space inside the conduit, e.g., 1%, 2%, 5%, 10%, 20%, or even 30% of the maximum field created by each magnet inside the conduit.

By "downstream," in the context of fluid flow in a conduit, is meant distal to the inlet of the conduit with respect to the object or position being referenced. Likewise, by "upstream" is meant proximal to the inlet of the conduit with respect to the object or position being referenced.

By "driving hydraulic dimension" is meant the dimension (typically smallest) which dominates the behavior of the fluids in the system. For example, in a round tube the Reynolds number is calculated based on the inner diameter of the tube, which is the driving hydraulic dimension in that situation. Whereas, in a channel which is rectangular in shape and which is much wider than it is tall, the dimension dominating the behavior of the fluids within it is its height and thus its height is the driving hydraulic dimension.

By "fluidic actuation device" is meant a device that enables one or more samples to traverse a conduit. A fluidic actuation device may pump samples through a conduit using, e.g., pressure-driven fluid flow, electric field, electro-osmotic flow, or centrifugal field. For example, a fluidic actuation device may include a vacuum source or a syringe pump.

By "fluidically connected" is meant linked or joined by a connector, e.g., a conduit, in such a manner as to allow a sample to flow from one object or site to a second object or site. In this configuration, the two object or sites are said to be fluidically connected. Intervening objects or sites may be present between the two fluidically connected objects or sites.

"Foam" and "mesh" are used interchangeably herein and mean a highly porous composition comprising one or more materials, e.g., magnetizable or non-magnetizable. In some instances, the foam may be derivatized, e.g., with binding moieties, e.g., nucleic acid molecules, antibodies, or otherwise as described herein. In some instances, the foam comprises metal, e.g., magnetizable or non-magnetizable. In some instances, the foam comprises resin particles, e.g., packed in a resin bed, including cross-linked agarose beads. The individual resin particles need not be porous.

"Foam insert" and "mesh insert" are used interchangeably herein and mean a piece of foam, e.g., magnetizable or non-magnetizable, that may be inserted inside a conduit. In some embodiments, the foam insert is derivatizable. In some embodiments, a foam insert is disk-shaped. A foam insert may occupy all or a portion of a cross-section of the conduit.

By "hold" or "held" in the context of a magnetic field gradient that holds magnetic particles is meant reversibly held in place by the field gradient, e.g., in a particular volume in a conduit, e.g., against an inner surface of a conduit proximal to the magnet creating the field gradient. For example, held magnetic particles may be released when the strength of the magnetic field gradient is reduced sufficiently or eliminated.

By "linked" in the context of magnetic particles and binding moieties is meant attached or bound by covalent bonds, non-covalent bonds, and/or linked via Van der Waals forces, hydrogen bonds, and/or other intermolecular forces.

"Magnetizable foam" and "magnetizable mesh" are used interchangeably herein and mean a highly porous composition comprising one or more magnetizable materials, e.g., metal. In some embodiments, pores cover at least 50%, 60%, 70%, 80%, 90%, 95%, or even 99% of the total volume. A metal foam or mesh may comprise, e.g., nickel or nickel-chromium, or other magnetizable materials. In some instances, the magnetizable mesh or foam may be derivatized, e.g., with binding moieties, e.g., nucleic acid molecules, antibodies, or otherwise as described herein.

"Magnetizable foam insert" and "magnetizable mesh insert" are used interchangeably herein and mean a piece of magnetizable foam that may be inserted inside a conduit. In some embodiments, a magnetizable foam insert is disk-shaped. A magnetizable foam insert may occupy all or a portion of a cross-section of the conduit.

By "sample" is meant a volume, e.g., of fluid, liquid, solid, or mixtures thereof, containing an analyte, magnetic beads, other reagent(s), buffers, or solvents. Samples may include, e.g., suspensions or other mixtures including both soluble and insoluble components. In some instances, samples may include soft materials, e.g., gels. Any sample described herein may be a liquid sample.

By "sample derived therefrom" or "component derived therefrom" is meant a sample or component that contains one or more components of a reference sample or component, or that results from transforming a reference sample or component in some way. For example, a lysate is a sample derived from a cell suspension that has been lysed.

By "magnetic particle" is meant a particle containing a material of high positive magnetic susceptibility such as a paramagnetic compound, a superparamagnetic compound, magnetite, gamma ferric oxide, or metallic iron.

By "maintained" or "maintaining" in the context of temperature is meant keeping the temperature within a predetermined tolerance, e.g., 3° C., 2° C., 1° C., 0.5° C., 0.2° C., 0.1° C., 0.05° C., 0.02° C., or 0.01° C.

By "manifold" is meant a connector having a plurality of inlets and/or a plurality of outlets. The plurality of inlets and/or outlets may be, e.g., 2, 3, 4, 5, 6, 7, 8, 9, 10, 15, 20, 30, 40, 50, 100, or more. A manifold may have a plurality of inlets and a single outlet, a plurality of outlets and a single inlet, or a plurality of both inlets and outlets. For example, a "pin manifold" is a manifold having a plurality of inlets shaped like pins which may be fluidically connected with a set of samples, e.g., in a cartridge. Depending on the configuration of the device containing the pin manifold, each inlet may be fluidically connected to a single outlet or to separate outlets. A "mixing manifold" includes at least two inlets, through which the two samples to be mixed enter the manifold, and at least one outlet, through which the mixed sample exits the manifold.

By "modulated" or "modulating" in the context of temperature is meant increasing or decreasing the temperature such that it is not maintained.

As used herein, the term "NMR relaxation rate" refers to a measuring any of the following in a sample $T_1$, $T_2$, hybrid T1-T2, $T_{1rho}$, $T_{2rho}$, and $T_2^*$. The systems and methods of the invention are designed to produce an NMR relaxation rate characteristic of whether an analyte is present in the liquid sample. In some instances the NMR relaxation rate is characteristic of the quantity of analyte present in the liquid sample.

A hybrid resonance signal may be a T1/T2 signal, or hybrid T1-T2. In this case a rapid T1zre pulse sequence (send and receive) over a short period (5 sec) via the RF coil and a T1 signal can be received. In some assay formats, the T1 measurement does not change with nanoparticle clustering/declustering and T2 signal is affected by a baseline signal. Thus for these assays, the T1 signal can reflect the baseline signal and can be subtracted and thus normalize the T2 signal. The baseline might be affected by sample to sample variability stemming from differences in nanoparticle concentration variation, hematocrit, viscosity or other features of the whole blood starting heterogeneous material. In other assays, a ratio of T1/T2 or alternatively T2/T1 might advantageously normalize the sample to sample variability.

Alternatively, sample to sample variability may also be controlled by determining a magnetic resonance signal prior to and after hybridization. The addition of derivatized nanoparticles to the sample prior to methods to enhance clustering may provide a baseline, internal T2 signal that can either be subtracted or used to modify the T2 signal after analyte-derivatized particle binding and clustering. This method may also be used to determine or manage cartridge to cartridge variability.

While the exemplary methods described hereinafter relate to amplification using polymerase chain reaction ("PCR"), numerous other methods are known in the art for "amplification" of nucleic acids (e.g., isothermal methods, rolling circle methods, etc.). Those skilled in the art will understand that these other methods may be used either in place of, or together with, PCR methods. See, e.g., Saiki, "Amplification of Genomic DNA" in PCR Protocols, Innis et al., Eds., Academic Press, San Diego, Calif., pp 13-20 (1990); Wharam et al., Nucleic Acids Res. 29:E54 (2001); Hafner et al., Biotechniques, 30:852 (2001). Further amplification methods suitable for use with the present methods include, for example, polymerase chain reaction (PCR) method, reverse transcription PCR (RT-PCR), ligase chain reaction (LCR), transcription based amplification system (TAS), transcription mediated amplification (TMA), nucleic acid sequence based amplification (NASBA) method, the strand displacement amplification (SDA) method, the loop mediated isothermal amplification (LAMP) method, the isothermal and chimeric primer-initiated amplification of nucleic acid (ICAN) method, and the smart amplification system (SMAP) method. These methods, as well as others are well known in the art and can be adapted for use in conjunction with provided methods of detection of amplified nucleic acid.

A "pathogen" means an agent causing disease or illness to its host, such as an organism or infectious particle, capable of producing a disease in another organism, and includes but is not limited to bacteria, viruses, protozoa, prions, yeast and fungi or pathogen by-products. "Pathogen by-products" are those biological substances arising from the pathogen that can be deleterious to the host or stimulate an excessive host immune response, for example pathogen antigen/s, metabolic substances, enzymes, biological substances, or toxins.

By "proximate to" is meant within 50 mm, e.g., within 20 mm, 10 mm, 5 mm, 2 mm, 1 mm, 0.5 mm, 0.2 mm, 0.1 mm, or less.

By "pulse sequence" or "RF pulse sequence" is meant one or more radio frequency pulses to be applied to a sample and designed to measure, e.g., certain NMR relaxation rates, such as spin echo sequences. A pulse sequence may also include the acquisition of a signal following one or more pulses to minimize noise and improve accuracy in the resulting signal value.

By "sample processing unit" is meant a unit configured to transform a sample in some way.

By "slug" is meant a continuous region of sample inside a conduit.

A "small molecule" means a drug, medication, medicament, or other chemically synthesized compound that is contemplated for human therapeutic use. A "biologic" is defined as a substance derived from a biological source, not synthesized and that is contemplated for human therapeutic use. A "biomarker" is a biological substance that can be used as an indicator of a particular disease state or particular physiological state of an organism, generally a biomarker is a protein measured in bodily fluid whose concentration reflects the presence or severity or staging of a disease state or dysfunction, can be used to monitor therapeutic progress of treatment of a disease or disorder or dysfunction, or can be used as a surrogate measure of clinical outcome or progression. A "metabolic biomarker" is a substance, molecule, or compound that is synthesized or biologically derived that is used to determine the status of a patient or subject's liver function. "Genotyping" is the ability to determine genetic differences in specific genes that may or may not affect the phenotype of the specific gene. "Phenotype" is the resultant biological expression, (metabolic or physiological) of the protein set by the genotype. "Gene expression profiling" is the ability to determine the rate or amount of the production of a gene product or the activity of gene transcription in a specific tissue, in a temporal or spatial manner. "Proteomic analysis" is a protein pattern or array to identify key differences between normal and diseased tissues.

By "thermal controller" is meant a device that maintains or modulates the temperature of each of a plurality of zones according to a pre-defined program. For example, temperatures suitable for thermal cycling of a sample, e.g., polymerase chain reaction, may be used.

By "well" is meant any localizer of a sample, for example, an indentation, a container, a support, a channel, a reservoir, a sunken volume, a compartment, a recessed area, an enclosure with or without an opening, a tube, a trough, a semipermeable membrane, an interface between two phases (e.g., an organic-inorganic interface, a hydrophilic-hydrophobic interface, an oligophilic-oligophobic interface, and the like), and/or an interface between two fluids (gases and/or liquids).

By "zone" in the context of a device for exposing a sample to a plurality of temperatures is meant a material the temperature of which may be maintained or modulated independently of adjacent zones. Exemplary zone materials are thermally conductive, e.g., aluminum, copper, steel, stainless steel, or alloys or combinations thereof.

It is contemplated that devices, systems, methods, and processes of the claimed invention encompass variations and adaptations developed using information from the embodiments described herein. Adaptation and/or modification of the devices, systems, methods, and processes described herein may be performed by those of ordinary skill in the relevant art. Throughout the description, where devices and systems are described as having, including, or comprising specific components, or where processes and methods are described as having, including, or comprising specific steps, it is contemplated that, additionally, there are devices and systems of the present invention that consist essentially of, or consist of, the recited components, and that there are processes and methods according to the present invention that consist essentially of, or consist of, the recited processing steps. It should be understood that the order of steps or order for performing certain actions is immaterial, unless otherwise specified, so long as the invention remains operable. Moreover, in many instances two or more steps or actions may be conducted simultaneously.

Other features and advantages of the invention will be apparent from the following detailed description, the drawings, and the claims.

BRIEF DESCRIPTION OF THE DRAWINGS

FIG. 1 is a schematic diagram of an NMR unit for detection of a response of a sample to an RF excitation, according to an illustrative embodiment of the invention.

FIGS. 2A-2E illustrate micro NMR coil (RF coil) designs including a wound solenoid coil (FIG. 2A), a planar coil (FIG. 2B), a MEMS solenoid coil (FIG. 2C), a MEMS Helmholz coil (FIG. 2D), and a saddle coil (FIG. 2E), according to an illustrative embodiment of the invention.

DETAILED DESCRIPTION

Figure 3:
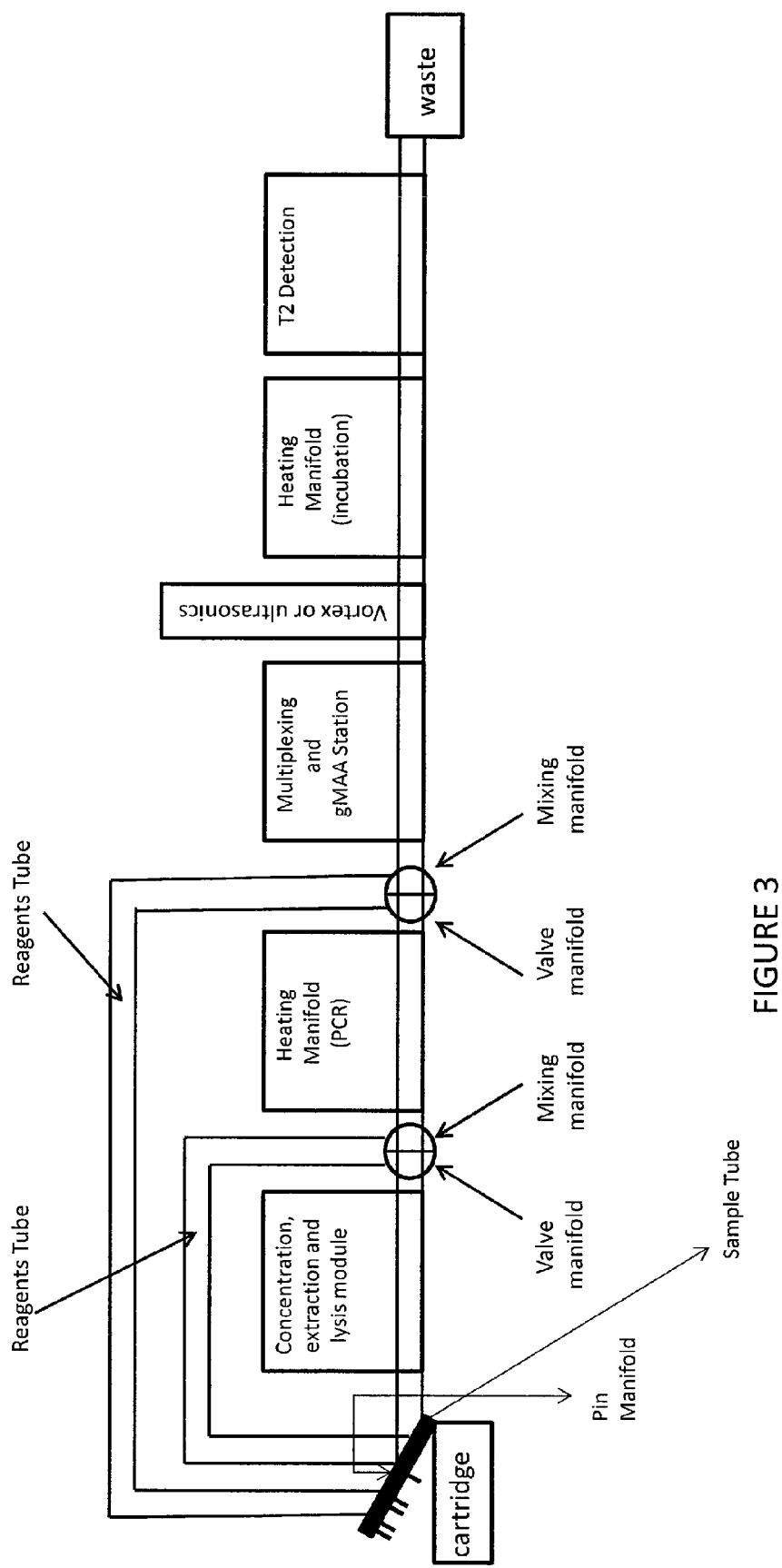
FIG. 3 is a schematic diagram of a conduit-containing device of the invention.

The invention features devices and methods for the rapid determination of the presence or concentrations of analytes in a sample.

Multiplexer Devices

The multiplexer devices described herein are useful, e.g., for analyzing a plurality of analytes in one or more samples. Multiplexer devices as described herein include a conduit, which in turn includes a conduit inlet, a conduit outlet, and a detection site; and a plurality of magnets disposed downstream of the conduit inlet.

Conduits

A conduit as used in a multiplexer device described herein is a tube or channel for conveyance of samples, e.g., samples containing analytes, magnetic particles, or other reagents. Generally, a conduit has an inlet and an outlet. In some embodiments, the inlet and/or outlet need not be discrete structures but may designate reference conduit sites, e.g., through or past which sample may flow. In other embodiments, the inlet and/or outlet are discrete structures to which another structure, e.g., a pump, sample processing unit, or detector, may be attached.

A conduit may be fully enclosed between the inlet and the outlet, e.g., a tube. For example, a conduit may include tubing similar or identical to that used for high-pressure liquid chromatography ("HPLC"). Tubing may be of driving hydraulic dimension ("DHD"), e.g., of between 10 µm and 20 mm, e.g., 10 µm, 20 µm, 50 µm, 0.1 mm, 0.2 mm, 0.5 mm, 1.0 mm, 2.0 mm, 5.0 mm, 10 mm, 20 mm, ±10% of any of the recited DHDs, or any range of these DHDs, e.g., 50 µm to 1.0 mm, or 0.1 mm to 5.0 mm.

Tubing thickness may be, e.g., 0.1%, 0.2%, 0.5%, 1%, 2%, 5%, 10%, 20%, 50%, 100%, 200%, 500%, 1,000%, 2,000%, or even 10,000% of the DHD. In some embodiments, relatively thin tubing is used, e.g., 1% to 20% of the DHD, e.g., about 10% of the DHD. For example, such tubing may be used, e.g., when the DHD is about 50 µm to about 1.0 mm. An advantage of thin tubing is that, when an RF coil is placed about the tubing, the filling factor is increased in comparison to using thicker tubing. In other embodiments, relatively thicker tubing may be used, e.g., 10% to 1,000% of the DHD.

Tubing may be made of any suitable material, e.g., polyethylene, e.g., high-density polyethylene.

Alternatively, or in addition, a conduit may include a channel, e.g., in a chip, that is open to the atmosphere along part or all of its length, or may be part of a molded part forming a channel. Samples, e.g., liquid samples, may be driven through a conduit either actively, e.g., by a fluidic actuation device, or passively, e.g., by gravity or capillary action. In some embodiments, the walls of the channel include silicones, acrylic, nylon, acetal, thermoplastic polymers/rubbers, polyethylene (e.g., HDPE or LDPE), polyurethane, polybutylene, glass, polypropylene, polycarbonate, polyoxymethylene, polypropylene, ethylene/propylene copolymers, polyvinyl chloride, polyester, polyamide, polyimide, polyurethane, polyacrylonitrile, ABS, PEEK, terpolymers of acrylates, styrene and acrylonitrile, styrene/acrylonitrile, styrene/butadiene, polybutylene, polystyrene, chlorinated polyethylene, fluoropolymers (e.g., Teflon), polycarbonate, polymethylmethacrylate, polyphenylene oxide, polypropylene oxide, cyclic olefin copolymers, cyclo olefin polymers, polyetheretherketone, polyketone, polysulfone, polyethylene terephthalate, acrylonitrile butadiene styrene, phenol/formaldehyde resins, or epoxy resins. In some instances, the walls of the channel include polymeric material that is proton-rich. Any of the materials suitable for use in the walls of a channel may alternatively be used in tubing. Additional materials suitable for use in a conduit are described, e.g., in PCT Publication No. WO 2009/045354.

In some embodiments, the width and/or depth of the channel are, independently, e.g., 10 µm, 20 µm, 50 µm, 0.1 mm, 0.2 mm, 0.5 mm, 1.0 mm, 2.0 mm, 5.0 mm, 10 mm, 20 mm, ±10% of any of the recited values, or any range of these values, e.g., 50 µm to 1.0 mm. Exemplary channel conduits are described, e.g., in U.S. Application Publication Nos. 2009-0155877, 2010-0144558, and 2010-0216126, each of which is hereby incorporated by reference.

Conduits may optionally include depressions or indentations for reversibly holding magnetic particles and/or analytes. For example, the plurality of magnets may be disposed along the conduit in such a manner as to line up with one or more such indentations, thereby facilitating the holding of magnetic particles in each indentation. In some embodiments, an indentation may extend part or all of the way around a cross-section of the conduit, e.g., may be a region of increased diameter or driving hydraulic dimension.

Conduits as described herein also include at least one detection site configured for attachment or proximity of a detector capable of detecting an analyte. Suitable detectors are described herein. For example, a detection site may be configured for detection, e.g., of magnetic relaxation by an RF coil disposed in proximity to the detection site, e.g., disposed about a region of the conduit that includes the detection site. In such embodiments, detection may occur when a sample comprising magnetic particles passes into or through the detection site. In such embodiments, the filling factor may be, e.g., 0.01, 0.02, 0.05, 0.1, 0.15, 0.2, 0.25, 0.3, 0.35, 0.4, 0.45, 0.5, 0.6, 0.7, 0.8, 0.9, 1.0, ±10% of any of the recited values, or any range of these values, e.g., 0.05 to 0.2.

In other embodiments, the RF coil may be disposed adjacent to the detection site but not disposed about said detection site.

In some embodiments, a single device could have multiple conduits (e.g., 2, 3, 4, 5, 6, 7, 8, 9, 10, 15, 20, 30, 50, 100, 200, 500, 1,000, or more), each directed through some or all of the units of the device. For example, each conduit may have its own dedicated detector, e.g., an RF coil, and/or its own permanent detection magnet, or it may share that detector, e.g., RF coil, and/or detection magnet with other conduits. In some embodiments, a device of the invention includes multiple, e.g., 10, conduits, each with a dedicated RF coil, and a single magnet and spectrometer to process the detection.

In some embodiments, the detector can be a permanent system component that interferes with the cartridge or could be a disposable cartridge component, e.g. embedded RF coil in a molded cartridge interfacing with a "fixed" detector via inductive coupling to a circuit and detection magnet for the MR experiment.

Magnets Disposed Downstream of Conduit Inlet

The multiplexer devices described herein include a plurality of magnets disposed downstream of the conduit inlet. Multiplexer devices may include, e.g., 2, 3, 5, 10, 20, 24, 48, 50, 96, 100, 192, 200, 384, 500, 768, 1,000, 2,000, 5,000, 10,000, or more such magnets. In some embodiments, the magnets may be positioned proximal to each of the wells of a multi-well plate, e.g., a 384-well plate. Any type of magnet known in the art may be used, e.g., permanent magnets, electromagnets, or variable magnets. Each such magnet generates a bias magnetic field, e.g., of average field strength between about 0.01 T and 10.0 T, e.g., between about 0.3 T and 1.0 T, e.g., about 0.5 T. The magnets may be configured in such a manner as to generate magnetic field gradients, e.g., magnetic field gradients that vary from, e.g., 0.1 millitesla/mm to 10 T/mm (or 100 T/mm) across the conduit (e.g., 0.1 mT/mm, 0.5 mT/mm, 1.0 mT/mm, 5 mT/mm, 10 mT/mm, 50 mT/mm, 100 mT/mm, 500 mT/mm, 1 T/mm, 5 T/mm, 10 T/mm, or a range between any of these values).

The plurality of magnets are disposed downstream of the conduit inlet along at least a portion of the length of the conduit, each such magnet creating a bias magnetic field, wherein:

(1) each magnet is capable of being adjusted to create a magnetic field gradient inside the conduit of sufficient strength to hold magnetic particles having binding moieties linked thereto in a particular volume in the conduit proximal to the magnet or within a carefully designed volume (also referred to as being in the "on" state);

(2) each magnet is capable of being adjusted to create a magnetic field gradient inside said conduit of insufficient strength to hold magnetic particles in a particular volume in the conduit proximal to the magnet (also referred to as being in the "off" state); and (3) the magnets are disposed along the conduit such that the bias magnetic fields of the plurality of magnets do not overlap significantly inside the conduit.

With the above-described configuration of magnets, multiplexer devices as described herein are configured, e.g., to allow a plurality of analytes to bind to binding moieties of magnetic particles when such magnetic particles are held by the magnets in a particular volume in the conduit.

In some embodiments, a magnet is adjusted by moving it closer to or further from the conduit. In such an embodiment, a permanent magnet or permanent electromagnet may be used, and the field and/or field gradient strength inside the conduit is changed by varying the distance of the magnet to the conduit. The movement of the magnet may be performed manually or may be part of an automated system.

In other embodiments, a variable magnetic field and/or field gradient may be used. In such embodiments, it is not necessary to move the magnets closer to or further from the conduit. Instead, the magnetic field and/or field gradient strength of the variable magnet is adjusted, e.g., by changing the current flowing through the variable magnet, or by any other method known in the art.

In some embodiments, two or more magnets may be disposed at approximately fixed angles relative to one another at approximately the same position along the conduit distal to the conduit inlet. For example, if three positions along the length conduit are designated for holding magnetic particles, two or more magnets may be disposed near each position, e.g., opposite one another. In some embodiments, one such magnet is adjusted to create a magnetic field gradient inside the conduit of sufficient strength to hold the magnetic particles, while the opposite magnet is adjusted to create a magnetic field gradient inside the conduit of insufficient strength to hold the magnetic particles; then this configuration is reversed, resulting in movement of the magnetic particles across the conduit and toward the opposing magnet. In some embodiments, this configuration may be alternated multiple times, facilitating magnetic aggregation or disaggregation of the magnetic particles.

In other embodiments, the magnets are rotated, e.g., back and forth, around the longitudinal axis of the conduit.

In some embodiments, the magnets are shaped and positioned to minimize the overlap of the bias magnetic fields of said plurality of magnets. For example, the magnetic fields created by the magnets are never both greater than a predefined threshold at any position in space inside the conduit, e.g., 1%, 2%, 5%, 10%, 20%, or even 30% of the maximum field created by each magnet inside the conduit. Magnets may be shaped and positioned in order to focus the bias magnetic field of each magnet in the desired region of the interior of the conduit, with minimal overlap, at any position inside the conduit, from the bias magnetic fields created by other magnets.

In some embodiments, the magnets are horseshoe-shaped, rod-shaped, rectangle-shaped, or disc-shaped.

When in the "on" state, the magnets may generate bias magnetic fields, e.g., of average field strength of between 0.01 T and 10.0 T, e.g., between 0.3 T and 1.0 T, e.g., about 0.5 T, and/or gradients between 0.1 mT/mm to 10 T/mm, e.g. between 100 mT/mm to 1 T/mm, e.g. about 250 mT/mm within the conduit. When in the "off" state, the magnets may generate magnetic fields, e.g., of 0.5 T or less, e.g., 0.3 T, 0.2 T, 0.1 T, 0.05 T, 0.02 T, 0.01 T, or smaller, and/or field gradients, e.g., of 250 mT/mm or less, e.g., 200 mT/mm, 150 mT/mm, 100 mT/mm, 50 mT/mm, or 10 mT/mm, including no magnetic field and no magnetic field gradient.

In an alternative embodiment, magnetizable mesh pieces are placed within the conduit. When not magnetized, the mesh pieces allow liquid and particulate flow to pass through the conduit. When magnetized, whether through, e.g., proximity of an external magnet or through magnetization of the mesh piece via, e.g., current flow, the mesh is able to capture and hold magnetic particles reversibly. Such mesh pieces may be used instead of, or in conjunction with, the plurality of magnets disposed along the conduit as described herein. In addition, a mesh that creates string susceptibility distortions of a bias magnetic field, increasing local gradients, may be used.

Fluidic Actuation Device

The conduits of the multiplexer devices described herein may optionally be configured to receive a fluidic actuation device. Such devices include, e.g., a vacuum source, a vacuum pump, a peristaltic pump, or a syringe pump. Fluidic actuation devices may be capable of generating a plurality of flow rates, including reversed flow, and of generating laminar, turbulent, or mixed flow of a sample inside the conduit. For example, the flow rate may be increased when transporting magnetic particles along the conduit to the appropriate magnet or to a detector, and it may be decreased when sample containing analyte is flowing near, or interacting with, magnetic particles held in a particular volume of the conduit by a magnet.

The fluidic actuation device may be attached at any suitable position along the conduit, e.g., at the conduit inlet or outlet, or at a mixing or valve manifold along the conduit.

In other embodiments, a fluidic actuation device is not attached; instead, fluidic flow is generated passively, e.g., by gravity or capillary action, or is generated by subjecting the conduit to another external force, e.g., centrifugal force or electromagnetic force.

Detectors

The conduits of the multiplexer devices described herein may be configured to receive one or more detectors for detecting the presence or concentration of an analyte. Exemplary detectors are nuclear magnetic resonance detectors, magnetometers (e.g., atomic magnetometers), SQUID detectors, magnetoresistance detectors, gradiometric detectors, impedance detectors, magneto-optical relaxation detectors, acoustic membrane detectors, frustrated total internal reflection detectors, fluorescence detectors, spectrophotometers, mass spectrometers, pH detectors, electrical conductivity detectors, and ultrasonic particle detectors, and may be configured to detect, e.g., magnetic relaxation (e.g., T1, T2, T1rho, T2rho, T2* relaxation time, echo response, diffusion measurement, correlation experiments, susceptibility measurement, spectral width measurement, or spectral shift measurement), magnetic resonance, diffusion, susceptibility, magnetometry, magnetism, magnetic particles, magnetoresistance (e.g., giant magnetoresistance or tunnel magnetoresistance), fluorescence, concentration, density, turbidity, UV or visible absorbance, pH change, luminosity, or reflectivity. In some embodiments, either classical or "exotic" magnetic resonance techniques may be used.

Detectors may be configured either to detect the presence or absence of an analyte, or to detect the amount and/or concentration of an analyte, or both.

Multiple detectors may be employed in order to utilize distinct analytical methods, e.g., NMR and fluorescence, or similar analytical methods may be employed using distinct methodology, e.g., measurement of multiple relaxation rates using NMR.

NMR Detector Units

The systems for carrying out the methods of the invention can include one or more NMR detector units. NMR units suitable for use with the devices and methods described herein may be adapted from the art. For example, FIG. 1 is a schematic diagram 100 of an NMR system for detection of a signal response of a sample to an RF excitation, thereby detecting the presence and/or concentration of an analyte in the sample. A bias magnet 102 establishes a bias magnetic field Bb 104 through a sample 106. An RF coil 110 and RF oscillator 112 provides an RF excitation at or close to the Larmor frequency which is a linear function of the bias magnetic field Bb. The RF coil 110 is wrapped around the sample holder 108. The excitation RF creates instability in the spin of the water protons (or free protons in a non-aqueous solvent). When the RF excitation is turned off, the protons "relax" to their original state and emit an RF signal that can be manipulated to depict the concentration of the analyte. The coil 110 acts as an RF antenna and detects measurable relaxation. The signal of interest is the transverse relaxation time (generally 1-2000 milliseconds) and is called the T2 or spin-spin or transverse relaxation. The signal picked up by the coil 110 is amplified 114 and processed to determine the T2 (decay time) response to the excitation in the bias field Bb. As adapted herein, the coil may be wrapped around, embedded within, or placed in proximity to a conduit through which sample flows, e.g., a tube. Alternatively, the coil may be configured as shown in any of FIGS. 2A-E about or in proximity to the well.

FIGS. 2A-E illustrate micro NMR coil (RF coil) designs. FIG. 2A shows a wound solenoid micro coil 200 about 100 μm in length. FIG. 2B shows a "planar" coil 202 (the coil is not truly planar, since the coil has finite thickness) about 1000 μm in diameter. FIG. 2C shows a MEMS solenoid coil 204 about 100 μm×500 μm length×width and defining a volume of about 0.02 μL. FIG. 2D shows a schematic of a MEMS Helmholz coil 206 configuration, and FIG. 2E shows a schematic of a saddle coil 220 configuration.

A wound solenoid micro coil 200 used for traditional NMR (non-MRS) detection is described in Seeber et al., "Design and testing of high sensitivity micro-receiver coil apparatus for nuclear magnetic resonance and imaging," Ohio State University, Columbus, Ohio. A planar micro coil 202 used for traditional NMR detection is described in Massin et al., "High Q factor RF planar microcoil for micro-scale NMR spectroscopy," Sensors and Actuators A 97-98, 280-288 (2002). A Helmholtz coil configuration 206 features a well 208 for holding a sample, a top Si layer 210, a bottom Si layer 212, and deposited metal coils 214. An example of a Helmholtz coil configuration 206 used for traditional NMR detection is described in Syms et al, "MEMS Helmholz Coils for Magnetic Resonance Spectroscopy," Journal of Micromechanics and Micromachining 15 (2005) S1-S9.

The coil configuration may be chosen or adapted for specific implementation of the micro-NMR-MRS technology, since different coil configurations offer different performance characteristics. For example, each of these coil geometries has a different performance and field alignment. The planar coil 202 has an RF field perpendicular to the plane of the coil. The solenoid coil 200 has an RF field down the axis of the coil, and the Helmholtz coil 206 has an RF field transverse to the two rectangular coils 214. The Helmholtz 206 and saddle coils 220 have transverse fields which would allow the placement of the permanent magnet bias field above and below the well, or conduit. Helmholtz 206 and saddle coils 220 may be most effective for the chip design, while the solenoid coil 200 may be most effective when the sample and MRS magnetic particles are held in a micro tube.

The micro-NMR devices may be fabricated by winding or printing the coils or by microelectromechanical system (MEMS) semiconductor fabrication techniques, such as lithography. Three dimensional lithography coil fabrication of well characterized coils used in MR detection is also established; see, e.g., Demas et al., "Electronic characterization of lithographically patterned microcoils for high sensitive NMR detection," *J. Magn. Reson.* 200(1):56-63 (2009). For example, a wound or printed coil/sample well module may be about 100 μm in diameter, or as large as a centimeter or more. A MEMS unit or chip (thusly named since it is fabricated in a semiconductor process as a die on a wafer) may have a coil that is from about 10 μm to about 1000 μm in characteristic dimension, for example. The wound or printed coil/sample well configuration is referenced herein as a module and the MEMS version is referenced herein as a chip. For example, the sample 108 may be held in a tube (for example, a capillary, pipette, or micro tube) with the coil wound around it, or it may be held in wells on the chip with the RF coil surrounding the well.

The basic components of an NMR unit include electrical components, such as a sensor (relaxometer T2 sensor), which provides the relaxation signal from the sample well or conduit to a signal processing unit, while the excitation RF is provided by the RF generator.

Systems containing NMR units with RF coils and micro wells or conduit detection sites containing magnetic particle sensors described herein may be designed for detection and/or concentration measurement of specific analyte(s) of interest by development of a model for particle aggregation phenomena and by development of an RF-NMR signal chain model. For example, experiments can be conducted for analyte/magnetic particle systems of interest by characterizing the physics of particle aggregation, including, for example, the effects of affinities, relevant dimensions, and concentrations. Also, experiments can be conducted to characterize the NMR signal(s) (T2, T1, and/or other signal characteristics) as functions of particle aggregation and magnetic particle characteristics. Signal characteristics specific to the MRS (magnetic resonance switch) phenomenon in a given system can be used to enhance detection sensitivity and/or otherwise improve performance. The trade-off between certain design parameters affecting MRS-relaxation T2 (and/or T1) measurement performance may be determined via experimentation and engineering considerations; for example, tradeoffs between filling factor, coil geometries, sample accessibility, ease to manufacture, Q factor, bandwidth, and/or magnetic bias field strength.

The MR system may include a chip with RF coil(s) and electronics micromachined thereon. For example, the chip may be surface micromachined, such that structures are built on top of a substrate. Where the structures are built on top of the substrate and not inside it, the properties of the substrate are not as important as in bulk micromachining, and expensive silicon wafers used in bulk micromachining can be replaced by less expensive materials such as glass or plastic. Alternative embodiments, however, may include chips that are bulk micromachined. Surface micromachining generally starts with a wafer or other substrate and grows layers on top. These layers are selectively etched by photolithography and either a wet etch involving an acid or a dry etch involving an ionized gas, or plasma. Dry etching can combine chemical etching with physical etching, or ion bombardment of the material. Surface micromachining may involve as many layers as is needed.

Where the relaxation measurement is T2, accuracy and repeatability (precision) will be a function of the signal-to-noise ratio (S/N), the pulse sequence for refocusing (e.g. CPMG, BIRD, Tango, and the like), as well as signal processing factors, such as signal conditioning (e.g. amplification, rectification, and/or digitization of the signals), time/frequency domain transformation, and signal processing algorithms used. Signal-to-noise ratio may be a function of the magnetic bias field (B), the field quality, sample volume, filling factor, coil geometry, coil Q-factor, electronics bandwidth, amplifier noise, and/or temperature, for example.

An illustrative experimental protocol for design or customization of an analyte detection unit for detection of a particular analyte is described below. The illustrative protocol includes performing experiments with a single micro coil, for example, a solenoid wound around a conduit. Experiments would be conducted to determine how T2 changes as a function of analyte type and concentration, and NMR particle ligand and affinity.

The NMR units and microcoils for using in the systems and methods of the invention can be, e.g., those described in U.S. Pat. No. 7,564,245 and U.S. Application Publication No. 2008-0204022, each of which is incorporated herein by reference.

The NMR units of the invention can include a small probehead for use in a portable magnetic resonance relaxometer, as described in PCT Publication No. WO 09/061, 481, incorporated herein by reference.

The systems of the invention can include a polymeric sample container for reducing, partly or completely, the contribution of the NMR signal associated with the sample container to the nuclear magnetic resonance parameter of the sample, as described in PCT Publication No. WO 09/045, 354, incorporated herein by reference.

Sample Processing Units

Sample processing units may be used in connection with the devices and methods described herein, or part of the devices and methods described herein. Suitable sample processing units include, e.g., a unit configured to load a sample, an aliquotor, a unit configured to concentrate or perform extraction or lysis of a sample, a unit configured to expose a sample to a plurality of temperatures (e.g., an amplification unit), a unit configured to assist in agglomeration of magnetic particles (e.g., a unit configured to employ magnetic assisted agglomeration, e.g., gradient or homogenous field magnetic assisted agglomeration), a unit configured to agitate a sample, a unit configured to heat or incubate a sample, a unit configured to collect waste, or a unit configured to concentrate a sample or other fluid within the conduit at the sample processing unit. An example of a device configured to include each of the above-described sample processing units, except for the aliquotor, is shown in FIG. 3.

Unit Configured to Load a Sample

Figure 4A:
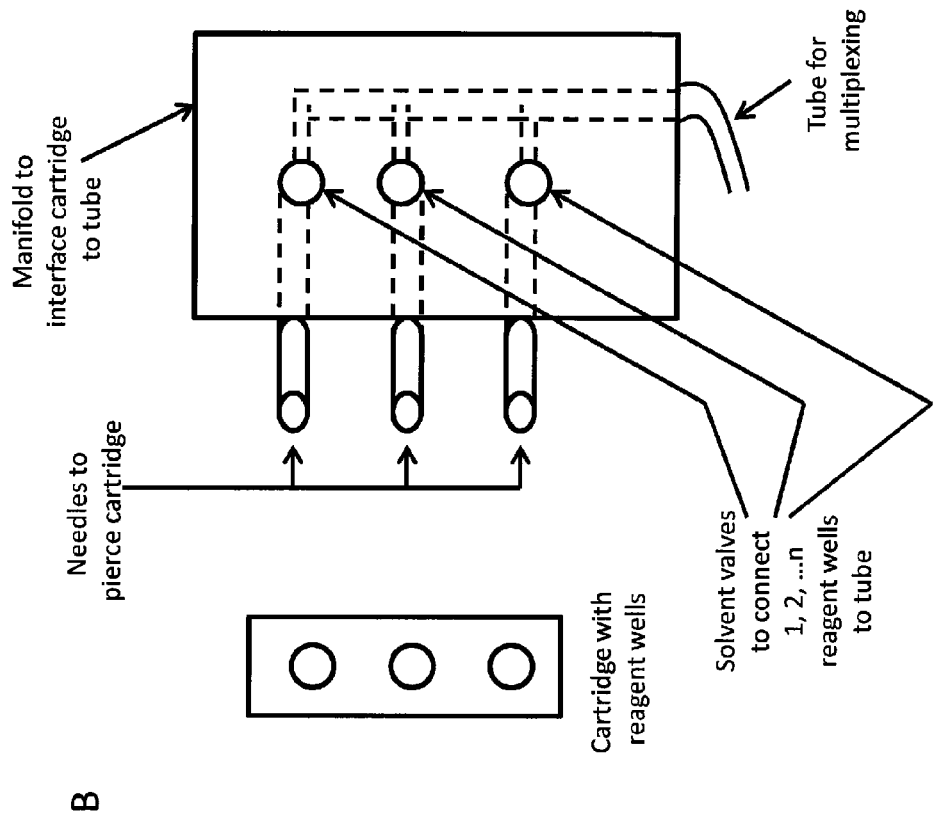
FIG. 4A is an isometric view of a pin manifold with solenoid valve to provide reagent multiplexing. The pin manifold includes pins to pierce the cartridge as well as solenoid valves to allow individual connection of the reagents to the system tube.
Figure 4B:
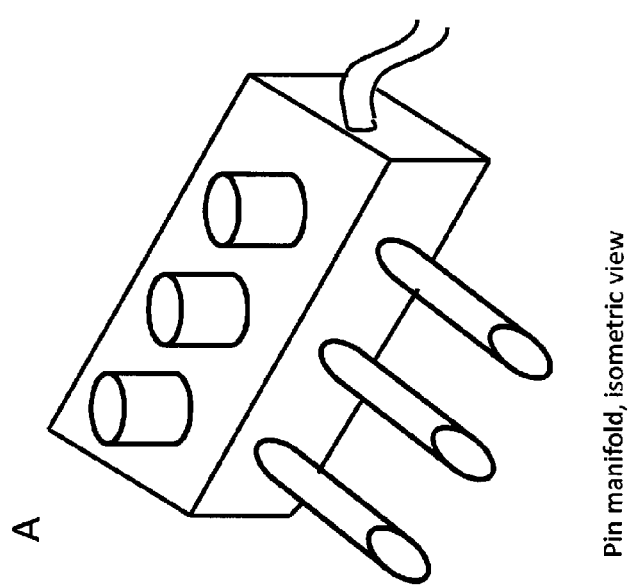
FIG. 4B is a plan view, showing the cartridge and the manifold immediately before the cartridge is pushed into it.

The systems for carrying out the methods of the invention can include one or more units configured to load a sample. For example, such units may include: 1) a slot for insertion of a cartridge including a first sample including an analyte and a second sample including magnetic particles having binding moieties linked thereto; and 2) a pin manifold configured to be detachably attached to the cartridge, the pin manifold comprising a plurality of pins each capable of being fluidically connected to a sample of the cartridge. An exemplary pin manifold is shown in FIGS. 4A and 4B. FIG. 4B additionally shows a cartridge with reagent wells lined up to receive the pins of the pin manifold.

Cartridge units can provide a convenient method for placing some or all of the assay reagents and consumables onto the system. For example, the system may be customized to perform a specific function, or adapted to perform more than one function, e.g., via changeable cartridge units containing arrays of micro wells with customized magnetic particles contained therein. The system can include a replaceable and/or interchangeable cartridge containing an array of wells pre-loaded with magnetic particles, and designed for detection and/or concentration measurement of a particular analyte. Alternatively, the system may be usable with different cartridges, each designed for detection and/or concentration measurements of different analytes. The cartridge may be sized for convenient insertion into and ejection from a housing or slot for the preparation of a sample which is transferred to other units in the system (i.e., a magnetic assisted agglomeration unit, or an NMR unit).

The cartridge unit can be a modular cartridge having an inlet module that can be sterilized independent of the reagent module.

For handling biological samples, such as blood samples, there are numerous competing requirements for the cartridge design, including the need for sterility for the inlet module to prevent cross contamination and false positive test results, and the need to include reagents in the package which cannot be easily sterilized using standard terminal sterilization techniques like irradiation. A modular cartridge can provide a simple means for cross contamination control during certain assays, including but not limited to distribution of amplification products into multiple detection aliquots. In addition, a modular cartridge can be compatible with automated fluid dispensing, and provides a way to hold reagents at very small volumes for long periods of time (in excess of a year). Finally, pre-dispensing these reagents allows concentration and volumetric accuracy to be set by the manufacturing process and provides for a point of care use instrument that is more convenient as it can require much less precise pipetting.

The modular cartridge of the invention is a cartridge that is separated into modules that can be packaged and if necessary sterilized separately. They can also be handled separately, if for example the reagent module requires refrigeration but the detection module does not. In some embodiments, the inlet module could be packaged separately in a sterile package and the reagent and detection modules would be pre-assembled and packaged together.

During storage, the reagent module could be stored in a refrigerator while the inlet module could be stored in dry storage. At time of use, the operator would retrieve a detection module and open the package using sterile technique. The Vacutainer tube is then decapped and the inverted inlet module is placed onto the tube. This module has been designed to be easily moldable using single draw tooling, and the top and bottom of the cartridge are sealed with foil to prevent contamination and also to close the channels. Once the tube has been re-sealed using the inlet module, the assembly is turned right side up and snapped onto the remainder of the cartridge. The inlet section includes a well with an overflow that allows sample tubes with between 2 and 6 ml of blood to be used and still provide a constant depth interface to the system automation. It may accomplish this, e.g., by means of an overflow, where blood that overflows the sampling well simply falls into the cartridge body, preventing contamination.

The operation of the module begins when the user inserts the cartridge into the instrument. The instrument performs the assay actuation, aliquoting the assays into the separate detection chambers. These individual detection chambers are then disconnected from the reagent strip and from each other, and progress through the system separately. Because the reagent module is separated and discarded, the smallest possible sample unit travels through or resides in the instrument, conserving instrument size. By splitting up each assay into its own unit, different incubation times and temperatures are possible as each multiplexed assay is physically removed from the others and each sample is individually manipulated.

Figure 5:
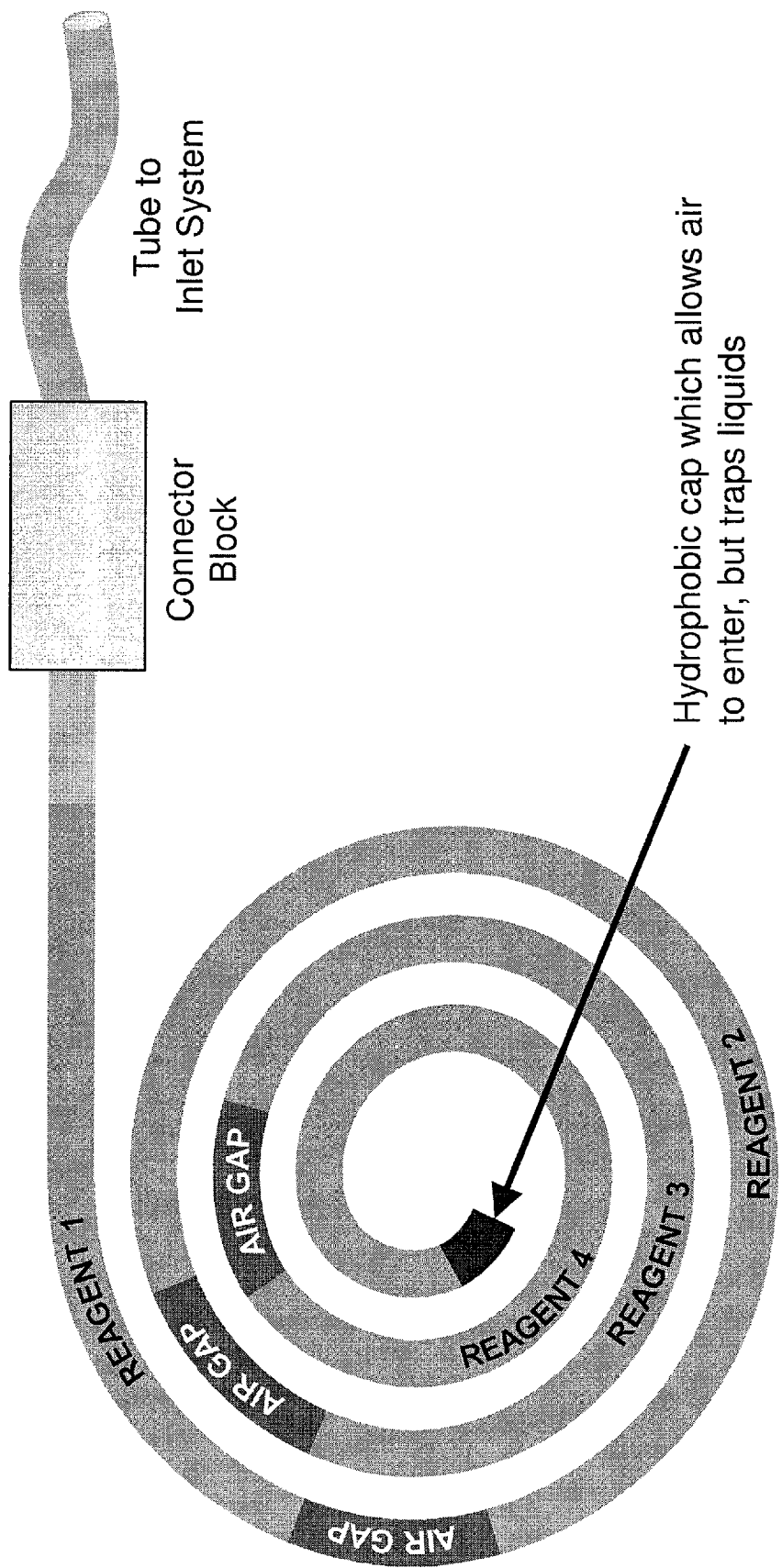
FIG. 5 is a schematic diagram of an alternative storage device for reagents that can be interfaced to the system in lieu of a cartridge.

An alternative embodiment is shown in FIG. 5, which depicts a storage device in which reagents are stacked sequentially in a tube separated by gaps of air or non-miscible fluid to prevent the reagents from mixing. The DHD of the tube is sufficiently small, e.g., under 0.5 mm, to ensure that the reagents remain stably separated, e.g., during shipping and/or handling. In some embodiments, the distal end of the tube is capped with a hydrophobic filter to allow air to enter when the reagents are removed but to prevent evaporation or spillage. The tube serves in place of a cartridge to hold reagents.

Aliquotor

The systems for carrying out the methods of the invention can include one or more units configured to perform or facilitate aliquoting of one or more samples. For example, an aliquotor may include a valve manifold allowing for connection to various inputs, e.g., sample containing analyte, buffer, reagent, amplification unit, or other sample processing units. In some instances, the aliquotor may be rotated to vary the fluidic connections and/or direction of flow. An aliquotor can deliver a metered amount of sample, e.g., sample containing analyte, buffer, or reagent. An aliquotor may also be used to time events, e.g., incubation of sample in aliquotor or conduit.

Unit Configured to Concentrate or Perform Extraction or Lysis of a Sample

The systems for carrying out the methods of the invention can include one or more units configured to concentrate or perform extraction or lysis of a sample. For example, extraction and purification of nucleic acid, e.g., DNA, from a target pathogen may be performed using a micro-scale syringe-based bead-beating/DNA capture device, e.g., the PureLyse™ device manufactured by Claremont BioSolutions. The PureLyse™ device includes a chamber trapping ~100 μm beads of a zirconium-silica mix, with a motor-driven impeller which rotates at ~40,000 RPM when attached to a battery pack. In some embodiments, beads of any suitable size may be used, with or without a motor-driven impeller, which, if present, may rotate at any suitable speed. In some embodiments, one or more luer-lok fixtures allow connection to a syringe and/or aspiration/expulsion tube.

An example of a concentrator device is a simple filter through which the lysate is passed to capture the DNA, and then eluted off with different buffers for amplification processing.

Unit Configured to Expose a Sample to a Plurality of Temperatures

The systems for carrying out the methods of the invention can include one or more units configured to expose a sample to a plurality of temperatures, e.g., a device for performing polymerase chain reaction or other amplification ( ).

In some embodiments, the unit includes: (a) a plurality of zones including thermally conductive material, wherein the temperature of each said zone is maintained or modulated independently of the other zones; (b) a conduit for conducting flow of a sample through the zones, the conduit comprising a conduit inlet configured for introduction of the sample at a first site of the conduit and a conduit outlet at a second site of the conduit, wherein the conduit passes through each of the plurality of zones, and wherein the conduit is further configured to receive a fluidic actuation device; and (c) a thermal controller coupled to the plurality of zones, wherein the thermal controller is programmed to maintain or modulate the temperature of each zone in a pre-defined manner.

In some embodiments, the unit may be used by: (a) programming the thermal controller to maintain or modulate the temperature of each zone in a pre-defined manner; (b) causing the sample to flow into the conduit inlet and through each zone in accordance with the programming of step (a); and (c) causing the sample to flow out of the conduit outlet, thereby exposing said sample to said plurality of temperatures. Optionally, the flow is reversible.

Figure 6:
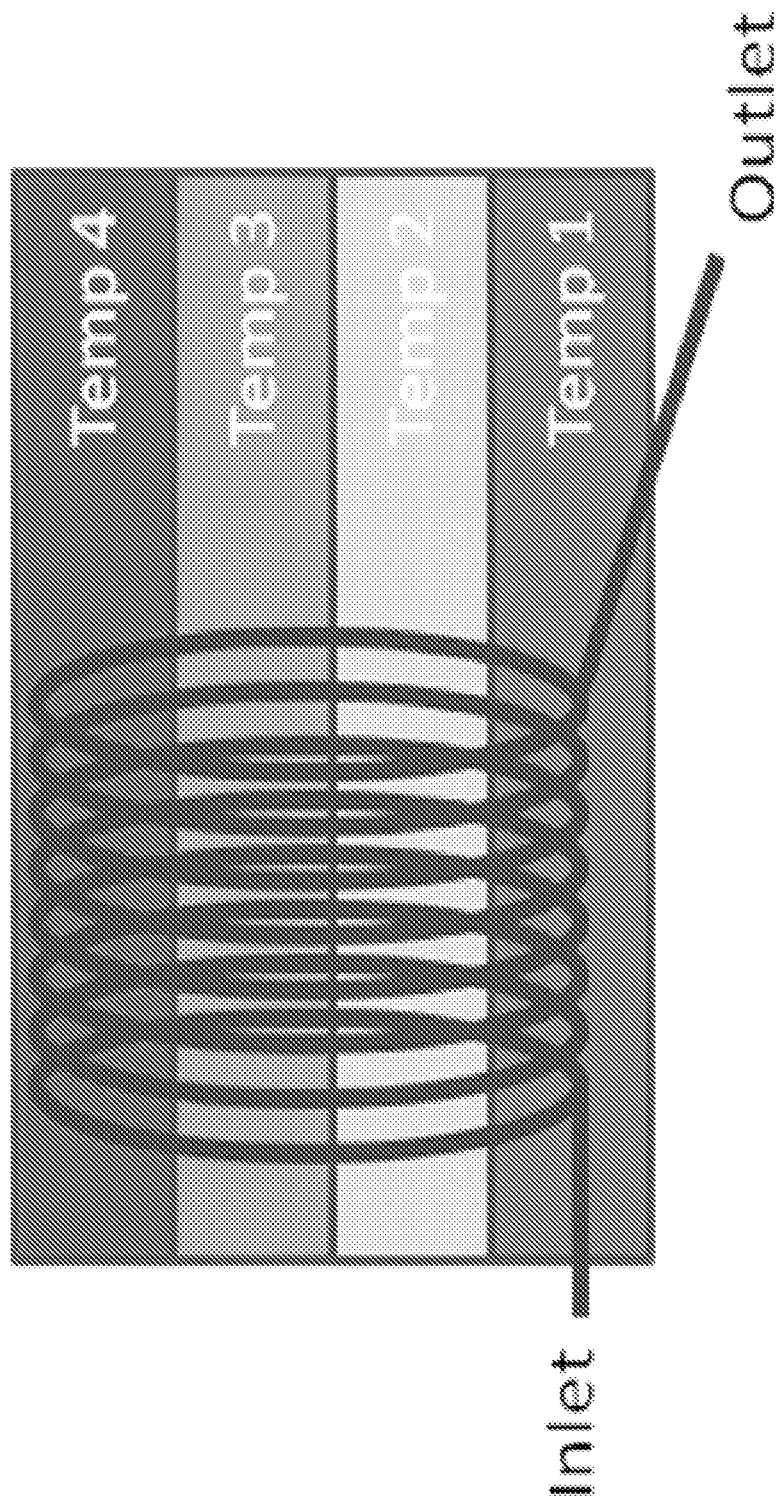
FIG. 6 is a schematic diagram of an amplification unit of the invention.

An exemplary embodiment of this unit is depicted in FIG. 6. The depicted unit includes a heat exchanger coil that travels through multiple temperature zones set at fixed temperatures. In this design, it is possible to utilize the flow of the sample through the tube and the travel through multiple temperature zones as the means to cycle the temperature of the sample. Conduit dimensions and materials may be chosen to allow for optimal thermal contact between the fluid and heat source. Additionally, the tube diameter may be chosen to use the optimal sample "slug" inside of the tubing.

For example, one design may have a very small DHD for the tubing and cause the sample to be spread out in the amplification module. Another design may use a large DHD for the tube and cause the sample slug to be quite narrow and be completely in one temperature zone at any given time.

In some embodiments, in which the unit is connected to the multiplexing device but it is not desired to perform amplification or otherwise expose samples to a plurality of temperatures, the device is simply maintained at room temperature, allowing samples to pass through it.

Another mechanism for thermal manipulation of, e.g., samples, particles, and magnetizable foam, e.g., NMF, features the use of an alternating magnetic field. In some embodiments, particles and NMF may be controllably (e.g., by field strength) heated up when located in such a field, and any sample or buffer the particles or NMF are in may likewise heat up. This approach could be used for thermocycling, for melting particle clusters apart, for releasing particles bound to derivatized NMF, for sample processing such as heat lysis, to speed up reaction kinetics, or for other applications.

The unit could be configured to perform an assay similar to real time amplification reactions, or quantitative amplification, by simply removing a small portion of the amplicon and moving the aliquoted sample down stream at the end of each amplification cycle, to the detector unit.

Unit Configured to Assist in Agglomeration of Magnetic Particles

The systems for carrying out the methods of the invention can include one or more units configured to assist in agglomeration of the magnetic particles, e.g., magnetic assisted agglomeration (MAA), to expedite agglomeration of the magnetic particles, allowing the assay reactions to reach completion (i.e., a stable reading) more quickly.

The methods of the invention utilize functionalized magnetic particles to interact with analytes or clustering agents (with multiple binding sites). Agglomeration or clustering of the particles (achieved via the analyte/clustering agent) alters the spin-spin relaxation rate of the sample when exposed to a magnetic field with a subsequent change in T2 relaxation time. To promote agglomeration or clustering of the particles, magnetic assisted agglomeration (either homogenous or gradient field) can be used.

For example, a gradient field can be used to sweep magnetic particles (MPs) through the sample, allowing the magnetic particles to bind to either specific antibody (analyte-coated magnetic particles) or analyte (antibody-coated magnetic particles), and then concentrating the magnetic particles at a specific region within the reaction chamber, as determined by the geometrical characteristics of the reaction well and the applied field and field gradient, so as to facilitate particle-particle interactions that lead to specific, ligand/analyte induced agglomeration. The magnetic particles can optionally be sonicated, vortexed, shaken, or subjected to ultrasonic mixing to break apart non-specific magnetic particle interactions and re-distribute the magnetic particles back into the sample. The sample with particles can also be allowed to relax in the absence of a magnetic field and field gradient, allowing particles that are non-specifically bound to slowly diffuse. The process can be repeated to promote further specific agglomeration. This cycling of magnetic particles between being dispersed in the sample and then concentrated at the side or bottom of the reaction vessel can be repeated as many times as necessary to maximize specific agglomeration, and consequently maximize the assay signal. The agglomeration state of the magnetic particles can be determined using an NMR relaxation measurement.

The MAA method of the invention can employ a gradient magnetic field in order to promote rapid magnetic particle-particle interactions. In one example, analyte coated magnetic particles are added to a solution with a multimeric-analyte specific ligand and placed in a gradient magnetic field. The magnetic field causes particles to concentrate within a smaller region of the reaction vessel (highest magnetic field strength) resulting in enhanced particle-particle interaction and subsequent clustering. Clustering is measured by observing a change in, for example, T2 signal during clustering. Improvements of 10 to 100 percent signal change in a dose response can be observed.

Traditional homogenous MAA produces dipole-dipole formation for assisting particle-particle interactions while particles are aligned throughout the sample. In contrast, gradient MAA rapidly concentrates magnetic particles to a locus, thereby greatly facilitating particle-particle interactions.

The cycling MAA approach described herein can accelerate the kinetics of magnetic particle-analyte clustering by (i) reducing the spatial entropy of the binding interaction step by maintaining local concentration of the magnetic particles, (ii) introducing localized mixing by magnet mediated transportation of the particles and particle agglomerates from position to position, (iii) reducing shearing of the specific-bound clusters by reducing the need for more energetic dispersion methods, such as vortexing, and/or (iv) changing the magnetic field direction and/or location, and thereby causing a local dispersion and/or re-aggregation of magnetically clustered particles.

In one example, gradient magnets are placed in two positions relative to the assay tube or conduit, one parallel to the tube or conduit and one at the bottom of the tube or conduit (side-bottom configuration). Alternatively, the second magnet position can be located on the opposite side of the tube or conduit (side-side configuration). The tube or conduit then is moved to ensure exposure to one magnet followed by exposure to the other magnet. An alternate methodology is to rotate or otherwise move the sample tube or conduit within the same magnet to effect a re-orientation of particles within the pellet. This has also been observed to produce a similar enhancement in clustering.

In another example, a homogenous field is used to expedite the agglomeration of magnetic particles in an assay of the invention, or to assess whether a magnetic particle exhibits hMAA reversibility. We have observed that hMAA is not as effective as exposure to gradient fields in terms of concentrating particles and swiping them through the sample. However hMAA has unique advantages over the gradient field assisted agglomeration method. Using hMAA the magnetic particles are not enticed to move towards a specific direction in the tube or conduit. Thus, the hMAA method enhances the specific, ligand/analyte induced clustering or agglomeration while minimizing nonspecific binding. The magnetic particles can subsequently be sonicated, vortexed, shaken (i.e. energy additions) to break apart any non-specific particle interactions and re-distribute the particles back into the sample. Additional mixing or gentle agitation during this process would potentially further increase the analyte-specific binding events for enhancement of the overall assay signal. The agglomeration/clustering state of the magnetic particles can be determined by monitoring changes in an NMR relaxation rate.

We have observed that longer MAA times leads to increased changes in T2, presumably from an increased fraction of clustered particles. We have found that cycled magnetic separation and resuspension leads to increased changes in T2, presumably from increased clustering.

Unit Configured to Agitate a Sample

A sample processing unit may be configured in connection with the devices described herein to agitate a sample. Exemplary forms of agitation are sonication, vortexing, physical shaking, ultrasonic mixing, dilution or resuspension, or flow in the conduit (forward or reverse). Any of these forms of agitation may be used at one or more positions along the conduit or at sites upstream or downstream of the conduit. For example, it may be desired to agitate a sample directly following multiplexing and/or magnetic assisted agglomeration.

In some embodiments, the unit configured to agitate a sample is part of the multiplexer unit, allowing for agitation before, during, or after multiplexing.

In some embodiments, sample is removed from the conduit and is agitated in a separate container. In other embodiments, the sample is agitated directly in the conduit. For example, if the conduit is a closed tube, the tube may be brought into contact with a vortexer; if the conduit is an open channel, a sonication tip or other agitation device may be inserted into the sample, or the flow can be run forward or reverse to achieve mixing.

Unit Configured to Heat or Incubate a Sample

The systems for carrying out the methods of the invention can include one or more units configured to heat or incubate a sample. Exemplary incubation temperatures are 0° C., 1° C., 2° C., 3° C., 4° C., 5° C., 6° C., 7° C., 8° C., 9° C., 10° C., 15° C., 20° C., room temperature, 25° C., 30° C., 35° C., 37° C., 40° C., 45° C., 50° C., 55° C., 60° C., 65° C., 70° C., 75° C., 80° C., 85° C., 90° C., 95° C., and 100° C. The temperature may be maintained or varied over time. If a sample is passing through the unit but does not require heating or incubation, the unit may be set to room temperature. The units configured to heat or incubate a sample may be the same as the unit configured to expose a sample to a plurality of temperatures, e.g., for performing polymerase chain reaction (amplification).

Unit Configured to Collect Waste

The systems for carrying out the methods of the invention can include one or more units configured to collect waste. In some embodiments, the unit configured to collect waste may include the disposable cartridge containing the original sample and reagents loaded into the device.

Other Devices

Other fluidically operated devices are also possible. For example, a device as described herein may include:
- (a) a conduit including:
  - (a1) a conduit inlet configured for introduction of a sample at a first site of the conduit;
  - (a2) a conduit outlet at a second site of the conduit;
  - (a3) a magnetizable foam insert inside the conduit between the conduit inlet and the conduit outlet; and
  - (a4) a detection site configured for attachment or proximity of a detector capable of detecting an analyte; and
- (b) a magnet disposed outside the conduit proximal to the magnetizable foam insert, the magnet creating a bias magnetic field, wherein:
  - (b1) the magnet is capable of being adjusted to create a magnetic field gradient inside the conduit of sufficient strength to hold magnetic particles having binding moieties linked thereto in or on the magnetizable foam insert; and
  - (b2) the magnet is capable of being adjusted to create a magnetic field gradient inside the conduit of insufficient strength to hold the magnetic particles in or on the magnetizable foam insert;

wherein the device is configured to allow the analyte to bind to the binding moieties of the magnetic particles when the magnetic particles are held in or on the magnetizable foam insert or are released from the magnetizable foam insert.

An example of such a device is shown in FIGS. 14A-14D. Such devices may function similarly to the multiplexer devices described herein, with the exception that, in some instances, a single analyte or type of analyte may be analyzed instead of a plurality of analytes.

In some instances, a device described herein further includes:
- (c) a plurality of supports defining a plurality of wells for holding samples or buffers, the plurality of supports disposed upstream of the magnet or the plurality of magnets and fluidically connected to the conduit or plurality of conduits;
- (d) a plurality of valves fluidically connected to one or more of the plurality of supports defining the plurality of wells, wherein the plurality of valves modulate flow from the one or more of the plurality of supports defining the plurality of wells;
- (e) a sample processing unit configured to concentrate or perform extraction or lysis of a sample and fluidically connected to the conduit or plurality of conduits; and
- (f) a first fluidic actuation device fluidically connected to the conduit or plurality of conduits.

Figure 17:
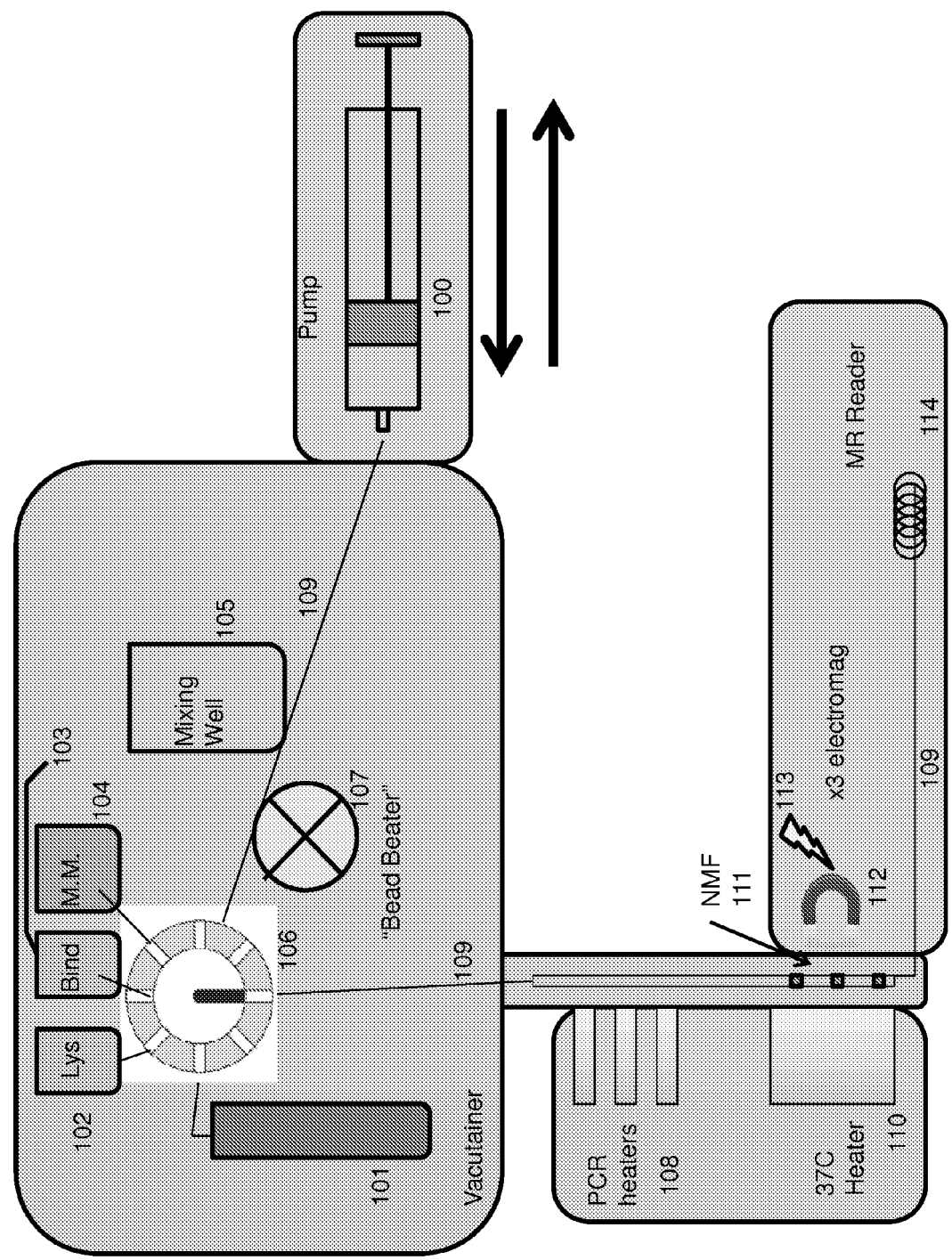
FIG. 17 is a schematic diagram of a fluidics device designed to amplify and detect nucleic acid of a pathogen such as *Candida* in a sample, e.g., whole blood.

An example of such a device is shown in FIG. 17.

In some instances, a device described herein includes:
- (a) a first unit including:
  - (a1) a slot for insertion of a cartridge including a first sample including an analyte and a second sample including magnetic particles having binding moieties linked thereto, and
  - (a2) a pin manifold configured to be detachably attached to the cartridge, the pin manifold including a plurality of pins each capable of being fluidically connected to a sample of the cartridge;
- (b) a mixing manifold fluidically connected to the pin manifold through a plurality of conduits, wherein at least portions of the first sample and the second sample are mixed in the mixing manifold; and
- (c) a second unit fluidically connected to the mixing manifold downstream of the mixing manifold by a further conduit, the second unit including:
  - (c1) a support defining a well for holding a third sample including the magnetic particles and the analyte;
  - (c2) a magnet creating a bias magnetic field inside the well; and
  - (c3) an RF coil disposed about the well, the RF coil configured to detect a response produced by exposing the third sample to the bias magnetic field and an RF excitation, thereby detecting the analyte, wherein the device is configured to receive a fluidic actuation device.

An example of such a device is shown in FIG. 3. Such devices need not include a multiplexer unit.

Methods of Using Devices of the Invention

Devices of the invention are useful, e.g., for analyzing one or more analytes in one or more samples. For example, any of the multiplexer devices described herein may be used to analyze a plurality of analytes.

Figures 7A, 7B, 7C, 7D, 7E, 7F:
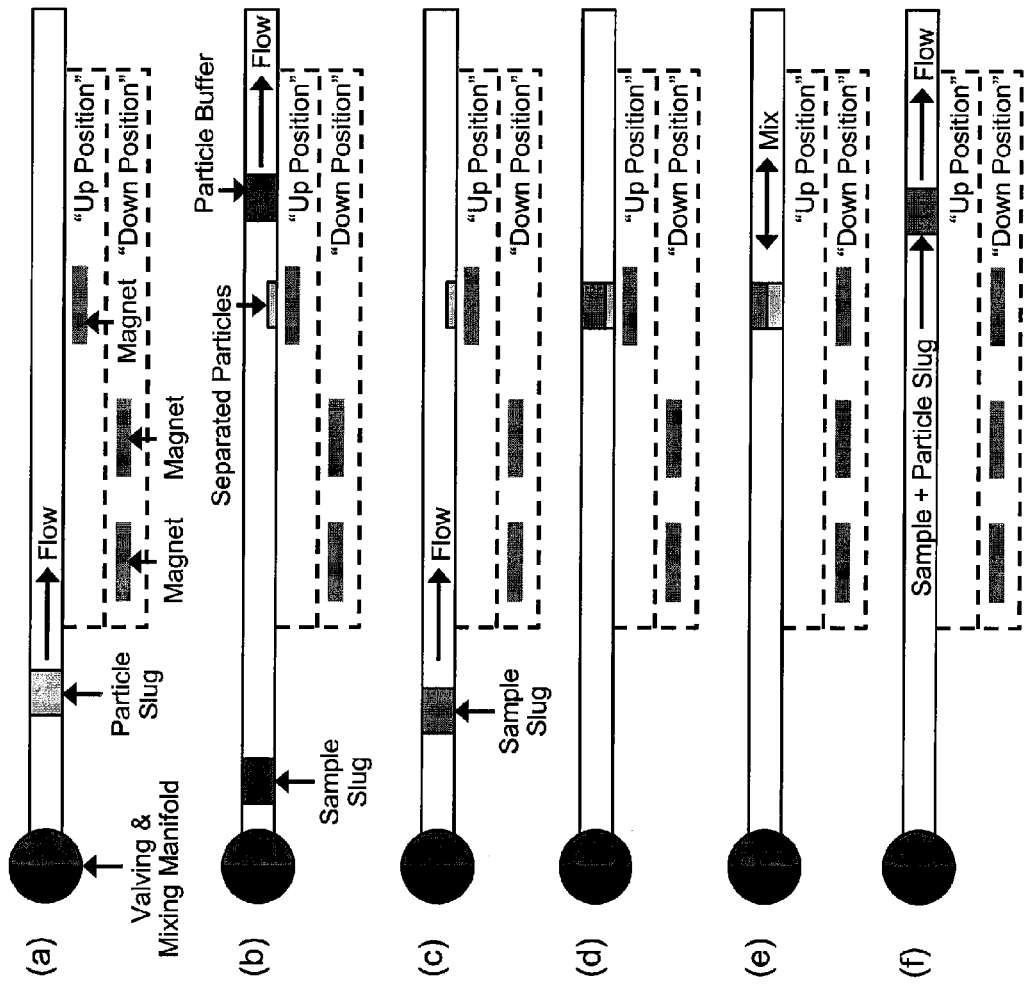
FIGS. 7A-7F are schematic diagrams depicting a method of using a multiplexer of the invention.

An exemplary method of using a multiplexing device is shown in FIGS. 7A-7F. In FIG. 7A, a bank of adjustable magnets, e.g., adjustable in position and/or in magnetic strength, is arrayed along a conduit of the multiplexing device. When in the "up" position, each magnet creates a magnetic field gradient inside the conduit of sufficient strength to hold magnetic particles in a particular volume in the conduit proximal to the magnet. Accordingly, a sample slug including magnetic particles is loaded and fluidically transported along the conduit to the site of the magnet in the "up" position. Depending on the ratio of slug length to magnet length, the flow may be halted to allow for capture of the magnetic particles by the magnet, or the flow may be continuous (e.g., if the slug length is small in comparison to the magnet length).

As shown in FIG. 7B, the magnetic particles are held in the volume of the conduit proximal to the magnet in the "up" position, while the remainder of the sample buffer flows downstream, e.g., to waste.

Additional magnetic particles may be loaded at other positions along the conduit by moving one or more additional magnets into the "up" position.

As shown in FIGS. 7C and 7D, a sample slug including a plurality of analytes is fluidically transported along the conduit, allowing the plurality of analytes to interact with each set of held magnetic particles. In some embodiments, the sample slug including the plurality of analytes is stopped over (or in the vicinity of) each set of magnetic particles, and the corresponding magnet is moved to the "off" position (FIG. 7E), releasing the magnetic particles and allowing interaction with the analytes to occur. In some embodiments, MAA, e.g., gMAA or hMAA, is conducted with the particle-analyte mixture, or with the particles alone. Alternatively, a more vigorous agitation step may be employed. The magnet corresponding to a given set of magnetic particles may then be reengaged to allow the sample slug to continue along the conduit while leaving behind the magnetic particles, or the magnet may be left in the "off" position (FIG. 7F), allowing the mixture of magnetic particles and analytes to flow downstream, e.g., to a detector.

In some embodiments, air or non-miscible fluid is included between slugs of sample in the conduit in order to prevent mixing. In addition, volume, length, and spacing between sample slugs may all be chosen in order to avoid mixing and to optimize the multiplexed assays.

The multiplexer devices of the invention may be used, e.g., to detect the presence or concentration of a plurality of analytes; to diagnose a medical condition; or to determine an appropriate dose of a therapeutic agent in a patient.

Other uses, e.g., non-biological uses, are also possible.

Samples and Analytes

Embodiments of the invention include devices, systems, and/or methods for detecting and/or measuring the concentration of one or more analytes in a sample. The analyte(s) may include one or more biologically active substances and/or metabolite(s), marker(s), and/or other indicator(s) of biologically active substances. A biologically active substance may be described as a single entity or a combination of entities. The term "biologically active substance" includes without limitation, medications; vitamins; mineral supplements; substances used for the treatment, prevention, diagnosis, cure or mitigation of disease or illness; or substances which affect the structure or function of the body; or pro-drugs, which become biologically active or more active after they have been placed in a predetermined physiological environment.

Non-limiting examples of broad categories of biologically active substances which can be detected using the devices, systems, and methods of the invention include, without limitation, the following therapeutic categories: anabolic agents, antacids, anti-asthmatic agents, anti-cholesterolemic and anti-lipid agents, anti-coagulants, anti-convulsants, anti-diarrheals, anti-emetics, anti-infective agents, anti-inflammatory agents, anti-manic agents, anti-nauseants, anti-neoplastic agents, anti-obesity agents, anti-pyretic and analgesic agents, anti-spasmodic agents, anti-thrombotic agents, anti-uricemic agents, anti-anginal agents, antihistamines, antitussives, appetite suppressants, biologicals, cerebral dilators, coronary dilators, decongestants, diuretics, diagnostic agents, erythropoietic agents, expectorants, gastrointestinal sedatives, hyperglycemic agents, hypnotics, hypoglycemic agents, ion exchange resins, laxatives, mineral supplements, mucolytic agents, neuromuscular drugs, peripheral vasodilators, psychotropics, sedatives, stimulants, thyroid and antithyroid agents, uterine relaxants, vitamins, and prodrugs.

More specifically, non-limiting examples of analytes which can be detected using the devices, systems, and methods of the invention include, without limitation, the following therapeutic categories: analgesics, such as nonsteroidal anti-inflammatory drugs, opiate agonists and salicylates; antihistamines, such as $H_1$-blockers and $H_2$-blockers; anti-infective agents, such as anthelminthics, antianaerobics, antibiotics, aminoglycoside antibiotics, antifungal antibiotics, cephalosporin antibiotics, macrolide antibiotics, miscellaneous β-lactam antibiotics, penicillin antibiotics, quinolone antibiotics, sulfonamide antibiotics, tetracycline antibiotics, antimycobacterials, antituberculosis antimycobacterials, antiprotozoals, antimalarial antiprotozoals, antiviral agents, antiretroviral agents, scabicides, and urinary anti-infectives; antineoplastic agents, such as alkylating agents, nitrogen mustard alkylating agents, nitrosourea alkylating agents, antimetabolites, purine analog antimetabolites, pyrimidine analog antimetabolites, hormonal antineoplastics, natural antineoplastics, antibiotic natural antineoplastics, and vinca alkaloid natural antineoplastics; autonomic agents, such as anticholinergics, antimuscarinic anticholinergics, ergot alkaloids, parasympathomimetics, cholinergic agonist parasympathomimetics, cholinesterase inhibitor parasympathomimetics, sympatholytics, alpha-blocker sympatholytics, beta-blocker sympatholytics, sympathomimetics, and adrenergic agonist sympathomimetics; cardiovascular agents, such as antianginals, beta-blocker antianginals, calcium-channel blocker antianginals, nitrate antianginals, antiarrhythmics, cardiac glycoside antiarrhythmics, class I antiarrhythmics, class II antiarrhythmics, class III antiarrhythmics, class IV antiarrhythmics, antihypertensive agents, alpha-blocker antihypertensives, angiotensin-converting enzyme inhibitor (ACE inhibitor) antihypertensives, beta-blocker antihypertensives, calcium-channel blocker antihypertensives, central-acting adrenergic antihypertensives, diuretic antihypertensive agents, peripheral vasodilator antihypertensives, antilipemics, bile acid sequestrant antilipemics, HMG-COA reductase inhibitor antilipemics, inotropes, cardiac glycoside inotropes, and thrombolytic agents; dermatological agents, such as antihistamines, anti-inflammatory agents, corticosteroid anti-inflammatory agents, antipruritics/local anesthetics, topical anti-infectives, antifungal topical anti-infectives, antiviral topical anti-infectives, and topical antineoplastics; electrolytic and renal agents, such as acidifying agents, alkalinizing agents, diuretics, carbonic anhydrase inhibitor diuretics, loop diuretics, osmotic diuretics, potassium-sparing diuretics, thiazide diuretics, electrolyte replacements, and uricosuric agents; enzymes, such as pancreatic enzymes and thrombolytic enzymes; gastrointestinal agents, such as antidiarrheals, antiemetics, gastrointestinal anti-inflammatory agents, salicylate gastrointestinal anti-inflammatory agents, antacid anti-ulcer agents, gastric acid-pump inhibitor anti-ulcer agents, gastric mucosal anti-ulcer agents, $H_2$-blocker anti-ulcer agents, cholelitholytic agents, digestants, emetics, laxatives and stool softeners, and prokinetic agents; general anesthetics, such as inhalation anesthetics, halogenated inhalation anesthetics, intravenous anesthetics, barbiturate intravenous anesthetics, benzodiazepine intravenous anesthetics, and opiate agonist intravenous anesthetics; hematological agents, such as antianemia agents, hematopoietic antianemia agents, coagulation agents, anticoagulants, hemostatic coagulation agents, platelet inhibitor coagulation agents, thrombolytic enzyme coagulation agents, and plasma volume expanders; hormones and hormone modifiers, such as abortifacients, adrenal agents, corticosteroid adrenal agents, androgens, anti-androgens, antidiabetic agents, sulfonylurea antidiabetic agents, antihypoglycemic agents, oral contraceptives, progestin contraceptives, estrogens, fertility agents, oxytocics, parathyroid agents, pituitary hormones, progestins, antithyroid agents, thyroid hormones, and tocolytics; immunobiologic agents, such as immunoglobulins, immunosuppressives, toxoids, and vaccines; local anesthetics, such as amide local anesthetics and ester local anesthetics; musculoskeletal agents, such as anti-gout anti-inflammatory agents, corticosteroid anti-inflammatory agents, gold compound anti-inflammatory agents, immuno-suppressive anti-inflammatory agents, nonsteroidal anti-inflammatory drugs (NSAIDs), salicylate anti-inflammatory agents, skeletal muscle relaxants, neuromuscular blocker skeletal muscle relaxants, and reverse neuromuscular blocker skeletal muscle relaxants; neurological agents, such as anticonvulsants, barbiturate anticonvulsants, benzodiazepine anticonvulsants, anti-migraine agents, anti-parkinsonian agents, anti-vertigo agents, opiate agonists, and opiate antagonists; ophthalmic agents, such as anti-glaucoma agents, beta-blocker anti-glaucoma agents, miotic anti-glaucoma agents, mydriatics, adrenergic agonist mydriatics, antimuscarinic mydriatics, ophthalmic anesthetics, ophthalmic anti-infectives, ophthalmic aminoglycoside anti-infectives, ophthalmic macrolide anti-infectives, ophthalmic quinolone anti-infectives, ophthalmic sulfonamide anti-infectives, ophthalmic tetracycline anti-infectives, ophthalmic anti-inflammatory agents, ophthalmic corticosteroid anti-inflammatory agents, and ophthalmic nonsteroidal anti-inflammatory drugs (NSAIDs); psychotropic agents, such as antidepressants, heterocyclic antidepressants, monoamine oxidase inhibitors (MAOIs), selective serotonin re-uptake inhibitors (SSRIs), tricyclic antidepressants, antimanics, antipsychotics, phenothiazine antipsychotics, anxiolytics, sedatives, and hypnotics, barbiturate sedatives and hypnotics, benzodiazepine anxiolytics, sedatives, and hypnotics, and psychostimulants; respiratory agents, such as antitussives, bronchodilators, adrenergic agonist bronchodilators, antimuscarinic bronchodilators, expectorants, mucolytic agents, respiratory anti-inflammatory agents, and respiratory corticosteroid anti-inflammatory agents; toxicology agents, such as antidotes, heavy metal antagonists/chelating agents, substance abuse agents, deterrent substance abuse agents, and withdrawal substance abuse agents; minerals; and vitamins, such as vitamin A, vitamin B, vitamin C, vitamin D, vitamin E, and vitamin K.

Examples of classes of biologically active substances from the above categories which can be detected using the devices, systems, and methods of the invention include, without limitation, nonsteroidal anti-inflammatory drugs (NSAIDs) analgesics, such as diclofenac, ibuprofen, ketoprofen, and naproxen; opiate agonist analgesics, such as codeine, fentanyl, hydromorphone, and morphine; salicylate analgesics, such as aspirin (ASA) (enteric coated ASA); $H_1$-blocker antihistamines, such as clemastine and terfenadine; $H_2$-blocker antihistamines, such as cimetidine, famotidine, nizadine, and ranitidine; anti-infective agents, such as mupirocin; antianaerobic anti-infectives, such as chloramphenicol and clindamycin; antifungal antibiotic anti-infectives, such as amphotericin b, clotrimazole, fluconazole, and ketoconazole; macrolide antibiotic anti-infectives, such as azithromycin and erythromycin; miscellaneous beta-lactam antibiotic anti-infectives, such as aztreonam and imipenem; penicillin antibiotic anti-infectives, such as nafcillin, oxacillin, penicillin G, and penicillin V; quinolone antibiotic anti-infectives, such as ciprofloxacin and norfloxacin; tetracycline antibiotic anti-infectives, such as doxycycline, minocycline, and tetracycline; antituberculosis antimycobacterial anti-infectives such as isoniazid (INH), and rifampin; antiprotozoal anti-infectives, such as atovaquone and dapsone; antimalarial antiprotozoal anti-infectives, such as chloroquine and pyrimethamine; anti-retroviral anti-infectives, such as ritonavir and zidovudine; antiviral anti-infective agents, such as acyclovir, ganciclovir, interferon alfa, and rimantadine; alkylating antineoplastic agents, such as carboplatin and cisplatin; nitrosourea alkylating antineoplastic agents, such as carmustine (BCNU); antimetabolite antineoplastic agents, such as methotrexate; pyrimidine analog antimetabolite antineoplastic agents, such as fluorouracil (5-FU) and gemcitabine; hormonal antineoplastics, such as goserelin, leuprolide, and tamoxifen; natural antineoplastics, such as aldesleukin, interleukin-2, docetaxel, etoposide (VP-16), interferon alfa, paclitaxel, and tretinoin (ATRA); antibiotic natural antineoplastics, such as bleomycin, dactinomycin, daunorubicin, doxorubicin, and mitomycin; vinca alkaloid natural antineoplastics, such as vinblastine and vincristine; autonornic agents, such as nicotine; anticholinergic autonomic agents, such as benztropine and trihexyphenidyl; antimuscarinic anticholinergic autonomic agents, such as atropine and oxybutynin; ergot alkaloid autonomic agents, such as bromocriptine; cholinergic agonist parasympathomimetics, such as pilocarpine; cholinesterase inhibitor parasympathomimetics, such as pyridostigmine; alpha-blocker sympatholytics, such as prazosin; 9-blocker sympatholytics, such as atenolol; adrenergic agonist sympathomimetics, such as albuterol and dobutamine; cardiovascular agents, such as aspirin (ASA) (enteric coated ASA); i-blocker antianginals, such as atenolol and propranolol; calcium-channel blocker antianginals, such as nifedipine and verapamil; nitrate antianginals, such as isosorbide dinitrate (ISDN); cardiac glycoside antiarrhythmics, such as digoxin; class I antiarrhythmics, such as lidocaine, mexiletine, phenyloin, procainamide, and quinidine; class II antiarrhythmics, such as atenolol, metoprolol, propranolol, and timolol; class III antiarrhythmics, such as amiodarone; class IV antiarrhythmics, such as diltiazem and verapamil; alpha-blocker antihypertensives, such as prazosin; angiotensin-converting enzyme inhibitor (ACE inhibitor) antihypertensives, such as captopril and enalapril; beta-blocker antihypertensives, such as atenolol, metoprolol, nadolol, and propanolol; calcium-channel blocker antihypertensive agents, such as diltiazem and nifedipine; central-acting adrenergic antihypertensives, such as clonidine and methyldopa; diurectic antihypertensive agents, such as amiloride, furosemide, hydrochlorothiazide (HCTZ), and spironolactone; peripheral vasodilator antihypertensives, such as hydralazine and minoxidil; antilipemics, such as gemfibrozil and probucol; bile acid sequestrant antilipemics, such as cholestyramine; HMG-CoA reductase inhibitor antilipemics, such as lovastatin and pravastatin; inotropes, such as aminone, dobutamine, and dopamine; cardiac glycoside inotropes, such as digoxin; thrombolytic agents, such as alteplase (TPA), anistreplase, streptokinase, and urokinase; dermatological agents, such as colchicine, isotretinoin, methotrexate, minoxidil, tretinoin (ATRA); dermatological corticosteroid anti-inflammatory agents, such as betamethasone and dexamethasone; antifungal topical anti-infectives, such as amphotericin B, clotrimazole, miconazole, and nystatin; antiviral topical anti-infectives, such as acyclovir; topical antineoplastics, such as fluorouracil (5-FU); electrolytic and renal agents, such as lactulose; loop diuretics, such as furosemide; potassium-sparing diuretics, such as triamterene; thiazide diuretics, such as hydrochlorothiazide (HCTZ); uricosuric agents, such as probenecid; enzymes such as RNase and DNase; thrombolytic enzymes, such as alteplase, anistreplase, streptokinase and urokinase; antiemetics, such as prochlorperazine; salicylate gastrointestinal anti-inflammatory agents, such as sulfasalazine; gastric acid-pump inhibitor anti-ulcer agents, such as omeprazole; $H_2$-blocker anti-ulcer agents, such as cimetidine, famotidine, nizatidine, and ranitidine; digestants, such as pancrelipase; prokinetic agents, such as erythromycin; opiate agonist intravenous anesthetics such as fentanyl; hematopoietic anti-anemia agents, such as erythropoietin, filgrastim (G-CSF), and sargramostim (GM-CSF); coagulation agents, such as antihemophilic factors 1-10 (AHF 1-10); anticoagulants, such as warfarin; thrombolytic enzyme coagulation agents, such as alteplase, anistreplase, streptokinase and urokinase; hormones and hormone modifiers, such as bromocriptine; abortifacients, such as methotrexate; antidiabetic agents, such as insulin; oral contraceptives, such as estrogen and progestin; progestin contraceptives, such as levonorgestrel and norgestrel; estrogens such as conjugated estrogens, diethylstilbestrol (DES), estrogen (estradiol, estrone, and estropipate); fertility agents, such as clomiphene, human chorionic gonadatropin (HCG), and menotropins; parathyroid agents such as calcitonin; pituitary hormones, such as desmopressin, goserelin, oxytocin, and vasopressin (ADH); progestins, such as medroxyprogesterone, norethindrone, and progesterone; thyroid hormones, such as levothyroxine; immunobiologic agents, such as interferon beta-1b and interferon gamma-1b; immunoglobulins, such as immune globulin IM, IMIG, IGIM and immune globulin IV, IVIG, IGIV; amide local anesthetics, such as lidocaine; ester local anesthetics, such as benzocaine and procaine; musculoskeletal corticosteroid anti-inflammatory agents, such as beclomethasone, betamethasone, cortisone, dexamethasone, hydrocortisone, and prednisone; musculoskeletal anti-inflammatory immunosuppressives, such as azathioprine, cyclophosphamide, and methotrexate; musculoskeletal nonsteroidal anti-inflammatory drugs (NSAIDs), such as diclofenac, ibuprofen, ketoprofen, ketorlac, and naproxen; skeletal muscle relaxants, such as baclofen, cyclobenzaprine, and diazepam; reverse neuromuscular blocker skeletal muscle relaxants, such as pyridostigmine; neurological agents, such as nimodipine, riluzole, tacrine and ticlopidine; anticonvulsants, such as carbamazepine, gabapentin, lamotrigine, phenyloin, and valproic acid; barbiturate anticonvulsants, such as phenobarbital and primidone; benzodiazepine anticonvulsants, such as clonazepam, diazepam, and lorazepam; anti-parkisonian agents, such as bromocriptine, levodopa, carbidopa, and pergolide; anti-vertigo agents, such as meclizine; opiate agonists, such as codeine, fentanyl, hydromorphone, methadone, and morphine; opiate antagonists, such as naloxone; beta-blocker anti-glaucoma agents, such as timolol; miotic anti-glaucoma agents, such as pilocarpine; ophthalmic aminoglycoside antiinfectives, such as gentamicin, neomycin, and tobramycin; ophthalmic quinolone anti-infectives, such as ciprofloxacin, norfloxacin, and ofloxacin; ophthalmic corticosteroid anti-inflammatory agents, such as dexamethasone and prednisolone; ophthalmic nonsteroidal anti-inflammatory drugs (NSAIDs), such as diclofenac; antipsychotics, such as clozapine, haloperidol, and risperidone; benzodiazepine anxiolytics, sedatives and hypnotics, such as clonazepam, diazepam, lorazepam, oxazepam, and prazepam; psychostimulants, such as methylphenidate and pemoline; antitussives, such as codeine; bronchodilators, such as theophylline; adrenergic agonist bronchodilators, such as albuterol; respiratory corticosteroid anti-inflammatory agents, such as dexamethasone; antidotes, such as flumazenil and naloxone; heavy metal antagonists/chelating agents, such as penicillamine; deterrent substance abuse agents, such as disulfuram, naltrexone, and nicotine; withdrawal substance abuse agents, such as bromocriptine; minerals, such as iron, calcium, and magnesium; vitamin B compounds, such as cyanocobalamin (vitamin $B_{12}$) and niacin (vitamin $B_3$); vitamin C compounds, such as ascorbic acid; and vitamin D compounds, such as calcitriol; recombinant beta-glucan; bovine immunoglobulin concentrate; bovine superoxide dismutase; the formulation comprising fluorouracil, epinephrine, and bovine collagen; recombinant hirudin (r-Hir), HIV-1 immunogen; human anti-TAC antibody; recombinant human growth hormone (r-hGH); recombinant human hemoglobin (r-Hb); recombinant human mecasermin (r-IGF-1); recombinant interferon beta-1a; lenograstim (G-CSF); olanzapine; recombinant thyroid stimulating hormone (r-TSH); topotecan; acyclovir sodium; aldesleukin; atenolol; bleomycin sulfate, human calcitonin; salmon calcitonin; carboplatin; carmustine; dactinomycin, daunorubicin HCl; docetaxel; doxorubicin HCl; epoetin alfa; etoposide (VP-16); fluorouracil (5-FU); ganciclovir sodium; gentamicin sulfate; interferon alfa; leuprolide acetate; meperidine HCl; methadone HCl; methotrexate sodium; paclitaxel; ranitidine HCl; vinblastin sulfate; and zidovudine (AZT).

Further specific examples of biologically active substances from the above categories which can be detected using the devices, systems, and methods of the invention include, without limitation, antineoplastics such as androgen inhibitors, antimetabolites, cytotoxic agents, and immunomodulators; anti-tussives such as dextromethorphan, dextromethorphan hydrobromide, noscapine, carbetapentane citrate, and chlorphediano1 hydrochloride; antihistamines such as chlorpheniramine maleate, phenindamine tartrate, pyrilamine maleate, doxylamine succinate, and phenyltoloxamine citrate; decongestants such as phenylephrine hydrochloride, phenylpropanolamine hydrochloride, pseudoephedrine hydrochloride, and ephedrine; various alkaloids such as codeine phosphate, codeine sulfate and morphine; mineral supplements such as potassium chloride, zinc chloride, calcium carbonates, magnesium oxide, and other alkali metal and alkaline earth metal salts; ion exchange resins such as cholestryramine; anti-arrhythmics such as N-acetylprocainamide; antipyretics and analgesics such as acetaminophen, aspirin and ibuprofen; appetite suppressants such as phenyl-propanolamine hydrochloride or caffeine; expectorants such as guaifenesin; antacids such as aluminum hydroxide and magnesium hydroxide; biologicals such as peptides, polypeptides, proteins and amino acids, hormones, interferons or cytokines, and other bioactive peptidic compounds, such as interleukins 1-18 including mutants and analogues, RNase, DNase, luteinizing hormone releasing hormone (LHRH) and analogues, gonadotropin releasing hormone (GnRH), transforming growth factor-beta (TGF-beta), fibroblast growth factor (FGF), tumor necrosis factor-alpha & beta (TNF-alpha & beta), nerve growth factor (NGF), growth hormone releasing factor (GHRF), epidermal growth factor (EGF), fibroblast growth factor homologous factor (FGFHF), hepatocyte growth factor (HGF), insulin growth factor (IGF), invasion inhibiting factor-2 (IIF-2), bone morphogenetic proteins 1-7 (BMP 1-7), somatostatin, thymosin-$\alpha$-1, T-globulin, superoxide dismutase (SOD), complement factors, hGH, tPA, calcitonin, ANF, EPO and insulin; and anti-infective agents such as antifungals, anti-virals, antiseptics and antibiotics.

Biologically active substances which can be detected using the devices, systems, and methods of the invention also include radiosensitizers, such as metoclopramide, sensamide or neusensamide (manufactured by Oxigene); profiromycin (made by Vion); RSR13 (made by Allos); Thymitaq (made by Agouron), etanidazole or lobenguane (manufactured by Nycomed); gadolinium texaphrin (made by Pharmacyclics); BuDR/Broxine (made by NeoPharm); IPdR (made by Sparta); CR2412 (made by Cell Therapeutic); LIX (made by Terrapin); or the like.

Biologically active substances which can be detected using the devices, systems, and methods of the invention include, without limitation, medications for the gastrointestinal tract or digestive system, for example, antacids, reflux suppressants, antiflatulents, antidoopaminergics, proton pump inhibitors, $H_2$-receptor antagonists, cytoprotectants, prostaglandin analogues, laxatives, antispasmodics, antidiarrheals, bile acid sequestrants, and opioids; medications for the cardiovascular system, for example, beta-receptor blockers, calcium channel blockers, diuretics, cardiac glycosides, antiarrhythmics, nitrate, antianginals, vascoconstrictors, vasodilators, peripheral activators, ACE inhibitors, angiotensin receptor blockers, alpha blockers, anticoagulants, heparin, HSGAGs, antiplatelet drugs, fibrinolytics, antihemophilic factors, haemostatic drugs, hypolipaemic agents, and statins; medications for the central nervous system, for example, hypnotics, anaesthetics, antipsychotics, antidepressants, anti-emetics, anticonvulsants, antiepileptics, anxiolytics, barbiturates, movement disorder drugs, stimulants, benzodiazepine, cyclopyrrolone, dopamine antagonists, antihistamine, cholinergics, anticholinergics, emetics, cannabinoids, 5-HT antagonists; medications for pain and/or consciousness, for example, NSAIDs, opioids and orphans such as paracetamol, tricyclic antidepressants, and anticonvulsants; for musculo-skeletal disorders, for example, NSAIDs, muscle relaxants, and neuromuscular drug anticholinersterase; medications for the eye, for example, adrenergic neurone blockers, astringents, ocular lubricants, topical anesthetics, sympathomimetics, parasympatholytics, mydriatics, cycloplegics, antibiotics, topical antibiotics, sulfa drugs, aminoglycosides, fluoroquinolones, anti-virals, anti-fungals, imidazoles, polyenes, NSAIDs, corticosteroids, mast cell inhibitors, adrenergic agonists, beta-blockers, carbonic anhydrase inhibitors/hyperosmotiics, cholinergics, miotics, parasympathomimetics, prostaglandin, agonists/prostaglandin inhibitors, nitroglycerin; medications for the ear, nose and oropharynx, for example, sympathomimetics, antihistamines, anticholinergics, NSAIDs, steroids, antiseptics, local anesthetics, antifungals, cerumenolytics; medications for the respiratory system, for example, bronchodilators, NSAIDs, anti-allergics, antitussives, mucolytics, decongestants, corticosteroids, beta-receptor antagonists, anticholinergics, steroids; medications for endocrine problems, for example, androgen, antiandrogen, gonadotropin, corticosteroids, growth hormone, insulin, antidiabetics, thyroid hormones, antithyroid drugs, calcitonin, diphosphonate, and vasopressin analogues; medications for the reproductive system or urinary system, for example, antifungals, alkalising agents, quinolones, antibiotics, cholinergics, anticholinergics, anticholinesterase, antispasmodics, 5-alpha reductase inhibitor, selective alpha-1 blockers, and sildenafil; medications for contraception, for example, oral contraceptives, spermicides, and depot contraceptives; medications for obstetrics and gynecology, for example, NSAIDs, anticholinergics, haemostatic drugs, antifibrinolytics, hormone replacement therapy, bone regulator, beta-receptor agonists, follicle stimulating hormone, luteinising hormone, LHRH gamolenic acid, gonadotropin release inhibitor, progestogen, dopamine agonist, oestrogen, prostaglandin, gonadorelin, clomiphene, tamoxifen, and diethylstilbestrol; medications for the skin, for example, emollients, anti-pruritics, antifungals, disinfectants, scabicide, pediculicide, tar products, vitamin A derivatives, vitamin D analogue, keratolytics, abrasives, systemic antibiotics, topical antibiotics, hormones, desloughing agents, exudate absorbents, fibrinolytics, proteolytics, sunscreens, antiperspirants, and corticosteroids; medications for infections and infestations, for example, antibiotics, antifungals, antileprotics, antituberculous drugs, antimalarials, anthelminthics, amoebicide, antivirals, antiprotozoals, and antiserum; medications for the immune system, for example, vaccines, immunoglobulin, immunosuppressants, interferon, monoclonal antibodies; medications for allergic disorders, for example, anti-allergics, antihistamines, and NSAIDs; medications for nutrition, for example, tonics, iron preparations, electrolytes, vitamins, anti-obesity drugs, anabolic drugs, haematopoietic drugs, and food product drugs; medications for neoplastic disorders, for example, cytotoxic drugs, sex hormones, aromatase inhibitors, somatostatin inhibitors, recombinant interleukins, G-CSF, and erythropoietin; medications for diagnostics, for example, contrast agents; and medications for cancer (anticancer agents).

Examples of pain medications (e.g. analgesics) which can be detected using the devices, systems, and methods of the invention include opioids such as buprenorphine, butorphanol, dextropropoxyphene, dihydrocodeine, fentanyl, diamorphine (heroin), hydromorphone, morphine, nalbuphine, oxycodone, oxymorphone, pentazocine, pethidine (meperidine), and tramadol; salicylic acid and derivatives such as acetylsalicylic acid (aspirin), diflunisal, and ethenzamide; pyrazolones such as aminophenazone, metamizole, and phenazone; anilides such as paracetamol (acetaminophen), phenacetin; and others such as ziconotide and tetradyrocannabinol.

Examples of blood pressure medications (e.g. antihypertensives and diuretics) which can be detected using the devices, systems, and methods of the invention include antiadrenergic agents such as clonidine, doxazosin, guanethidine, guanfacine, mecamylamine, methyldopa, moxonidinie, prazosin, rescinnamine, and reserpine; vasodilators such as diazoxide, hydralazine, minoxidil, and nitroprusside; low ceiling diuretics such as bendroflumethiazide, chlorothiazide, chlortalidone, hydrochlorothiazide, indapamide, quinethazone, mersalyl, metolazone, and theobromine; high ceiling diuretics such as bumetanide, furosemide, and torasemide; potassium-sparing diuretics such as amiloride, eplerenone, spironolactone, and triamterene; and other antihypertensives such as bosentan and ketanserin.

Examples of anti-thrombotics (e.g., thrombolytics, anticoagulants, and antiplatelet drugs) which can be detected using the devices, systems, and methods of the invention include vitamin K antagonists such as acenocoumarol, clorindione, dicumarol, diphenadione, ethyl biscoumacetate, phenprocoumon, phenindione, tioclomarol, and warfarin; heparin group (platelet aggregation inhibitors) such as antithrombin III, bemiparin, dalteparin, danaparoid, enoxaparin, heparin, nadroparin, parnaparin, reviparin, sulodexide, and tinzaparin; other platelet aggregation inhibitors such as abciximab, acetylsalicylic acid (aspirin), aloxiprin, beraprost, ditazole, carbasalate calcium, cloricromen, clopidogrel, dipyridamole, epoprostenol, eptifibatide, indobufen, iloprost, picotamide, prasugrel, ticlopidine, tirofiban, treprostinil, and triflusal; enzymes such as alteplase, ancrod, anistreplase, brinase, drotrecogin alfa, fibrinolysin, procein C, reteplase, saruplase, streptokinase, tenecteplase, and urokinase; direct thrombin inhibitors such as argatroban, bivalirudin, desirudin, lepirudin, melagatran, and ximelagatran; other antithrombotics such as dabigatran, defibrotide, dermatan sulfate, fondaparinux, and rivaroxaban; and others such as citrate, EDTA, and oxalate.

Examples of anticonvulsants which can be detected using the devices, systems, and methods of the invention include barbiturates such as barbexaclone, metharbital, methylphenobarbital, phenobarbital, and primidone; hydantoins such as ethotoin, fosphenyloin, mephenyloin, and phenyloin; oxazolidinediones such as ethadione, paramethadione, and trimethadione; succinimides such as ethosuximide, mesuximide, and phensuximide; benzodiazepines such as clobazam, clonazepam, clorazepate, diazepam, lorazepam, midazolam, and nitrazepam; carboxamides such as carbamazepine, oxcarbazepine, rufinamide; fatty acid derivatives such as valpromide and valnoctamide; carboxylic acids such as valproic acid, tiagabine; GABA analogs such as gabapentin, pregabalin, progabide, and givabatrin; monosaccharides such as topiramate; aromatic allyllic alcohols such as stiripentol; ureas such as phenacemide and pheneturide; carbamates such as emylcamate, felbamate, and meprobamate; pyrrolidines such as brivaracetam, levetiracetam, nefiracetam, and seletracetam; sulfa drugs such as acetazolamide, ethoxzolamide, sultiame, and zonisamide; propionates such as beclamide; aldehydes such as paraldehyde; and bromides such as potassium bromide.

Examples of anti-cancer agents which can be detected using the devices, systems, and methods of the invention include acivicin; aclarubicin; acodazole hydrochloride; acronine; adriamycin; adozelesin; aldesleukin; altretamine; ambomycin; ametantrone acetate; aminoglutethimide; amsacrine; anastrozole; anthramycin; asparaginase; asperlin; azacitidine; azetepa; azotomycin; batimastat; benzodepa; bicalutamide; bisantrene hydrochloride; bisnafide dimesylate; bizelesin; bleomycin sulfate; brequinar sodium; bropirimine; busulfan; cactinomycin; calusterone; caracemide; carbetimer; carboplatin; carmustine; carubicin hydrochloride; carzelesin; cedefingol; chlorambucil; cirolemycin; cisplatin; cladribine; crisnatol mesylate; cyclophosphamide; cytarabine; dacarbazine; dactinomycin; daunorubicin hydrochloride; decitabine; dexormaplatin; dezaguanine; dezaguanine mesylate; diaziquone; docetaxel; doxorubicin; doxorubicin hydrochloride; droloxifene; droloxifene citrate; dromostanolone propionate; duazomycin; edatrexate; eflornithine hydrochloride; elsamitrucin; enloplatin; enpromate; epipropidine; epirubicin hydrochloride; erbulozole; esorubicin hydrochloride; estramustine; estramustine phosphate sodium; etanidazole; etoposide; etoposide phosphate; etoprine; fadrozole hydrochloride; fazarabine; fenretinide; floxuridine; fludarabine phosphate; fluorouracil; fluorocitabine; fosquidone; fostriecin sodium; gemcitabine; gemcitabine hydrochloride; hydroxyurea; idarubicin hydrochloride; ifosfamide; ilmofosine; interferon alfa-2a; interferon alfa-2b; interferon alfa-n1; interferon alfa-n3; interferon beta-I a; interferon gamma-I b; iproplatin; irinotecan hydrochloride; lanreotide acetate; letrozole; leuprolide acetate; liarozole hydrochloride; lometrexol sodium; lomustine; losoxantrone hydrochloride; masoprocol; maytansine; mechlorethamine hydrochloride; megestrol acetate; melengestrol acetate; melphalan; menogaril; mercaptopurine; methotrexate; methotrexate sodium; metoprine; meturedepa; mitindomide; mitocarcin; mitocromin; mitogillin; mitomalcin; mitomycin; mitosper; mitotane; mitoxantrone hydrochloride; mycophenolic acid; nocodazole; nogalamycin; ormaplatin; oxisuran; paclitaxel; pegaspargase; peliomycin; pentamustine; peplomycin sulfate; perfosfamide; pipobroman; piposulfan; piroxantrone hydrochloride; plicamycin; plomestane; porfimer sodium; porfiromycin; prednimustine; procarbazine hydrochloride; puromycin; puromycin hydrochloride; pyrazofurin; riboprine; rogletimide; safingol; safingol hydrochloride; semustine; simtrazene; sparfosate sodium; sparsomycin; spirogermanium hydrochloride; spiromustine; spiroplatin; streptonigrin; streptozocin; sulofenur; talisomycin; tecogalan sodium; tegafur; teloxantrone hydrochloride; temoporfin; teniposide; teroxirone; testolactone; thiamiprine; thioguanine; thiotepa; tiazofurin; tirapazamine; topotecan hydrochloride; toremifene citrate; trestolone acetate; triciribine phosphate; trimetrexate; trimetrexate glucuronate; triptorelin; tubulozole hydrochloride; Uracil mustard; rredepa; vapreotide; verteporfin; vinblastine sulfate; vincristine sulfate; vindesine; vindesine sulfate; vinepidine sulfate; vinglycinate sulfate; vinleurosine sulfate; vinorelbine tartrate; vinrosidine sulfate; vinzolidine sulfate; vorozole; zeniplatin; zinostatin; and zorubicin hydrochloride.

Examples of pathogens that may be detected using the devices, systems, and methods of the invention include, e.g., *Candida* (resistant and non-resistant strains), e.g., *C. albicans, C. glabrata, C. krusei, C. tropicalis*, and *C. parapsilosis; aspergillus fumigatus; E. coli, Stenotrophomonas maltophilia, Klebsiella pneumonia/oxytoca, Pseudomonas aeruginosa; Staphylococcus* species, e.g., *S. aureus* or *S. pneumonia, enterococcus faecalis, enterococcus faecium*, Coaglulase negative *staphylococcus, cornybacterium* species, *Fusobacterium* species, *Morganella morganii, Pneumocystis jirovecii*, previously known as *pneumocystis carinii, F. hominis, streptococcus pyogenes, Pseudomonas aeruginosa*, Polyomavirus JC polyomavirus (the virus that causes Progressive multifocal leukoencephalopathy), *Acinetobacter baumanni, Toxoplasma gondii, Cytomegalovirus, Aspergillus* sp., Kaposi's Sarcoma, cryptosporidium, *cryptococcus neoformans*, or *Histoplasma capsulatum*.

Other biologically active substances which can be detected using the devices, systems, and methods of the invention include those mentioned in Basic and Clinical Pharmacology (LANGE Basic Science), Katzung and Katzung, ISBN 0071410929, McGraw-Hill Medical, 9$^{th}$ edition (2003).

In some embodiments, the assay is configured to analyze and detect free circulating DNA with a blood sample, i.e. DNA that is not bound or found in intact cells. In these cases, the concentrator/lysis unit is not employed and later amplification will only occur on the freely circulating DNA molecules. The source of the free circulating DNA within blood includes: a tumor, a fetus, or free unassociated DNA from an apoptotic event.

The invention features a method of diagnosing sepsis in a subject, the method including (a) obtaining a liquid sample derived from the blood of a patient; (b) preparing a first assay sample by combining with a portion of the liquid sample from $1\times10^6$ to $1\times10^{13}$ magnetic particles per milliliter of the liquid sample (e.g., from $1\times10^6$ to $1\times10^8$, $1\times10^7$ to $1\times10^8$, $1\times10^7$ to $1\times10^9$, $1\times10^8$ to $1\times10^{10}$, $1\times10^9$ to $1\times10^{11}$, or $1\times10^{10}$ to $1\times10^{13}$ magnetic particles per milliliter), wherein the magnetic particles have a mean diameter of from 150 nm to 1200 nm (e.g., from 150 to 250, 200 to 350, 250 to 450, 300 to 500, 450 to 650, 500 to 700 nm, 700 to 850, 800 to 950, 900 to 1050, or from 1000 to 1200 nm), and a $T_2$ relaxivity per particle of from $1\times10^8$ to $1\times10^{12}$ mM$^{-1}$s$^{-1}$ (e.g., from $1\times10^8$ to $1\times10^9$, $1\times10^8$ to $1\times10^{10}$, $1\times10^9$ to $1\times10^{10}$, $1\times10^9$ to $1\times10^{11}$, or from $1\times10^{10}$ to $1\times10^{12}$ mM$^{-1}$s$^{-1}$), and wherein the magnetic particles have binding moieties on their surfaces, the binding moieties operative to alter the specific aggregation of the magnetic particles in the presence of one or more pathogen-associated analytes or a multivalent binding agent; (c) preparing a second assay sample by combining with a portion of the liquid sample from $1\times10^6$ to $1\times10^{13}$ magnetic particles per milliliter of the liquid sample (e.g., from $1\times10^6$ to $1\times10^8$, $1\times10^7$ to $1\times10^8$, $1\times10^7$ to $1\times10^9$, $1\times10^8$ to $1\times10^{10}$, $1\times10^9$ to $1\times10^{11}$, or $1\times10^{10}$ to $1\times10^{13}$ magnetic particles per milliliter), wherein the magnetic particles have a mean diameter of from 150 nm to 1200 nm (e.g., from 150 to 250, 200 to 350, 250 to 450, 300 to 500, 450 to 650, 500 to 700 nm, 700 to 850, 800 to 950, 900 to 1050, or from 1000 to 1200 nm), and a $T_2$ relaxivity per particle of from $1\times10^8$ to $1\times10^{12}$ mM$^{-1}$s$^{-1}$ (e.g., from $1\times10^8$ to $1\times10^9$, $1\times10^8$ to $1\times10^{10}$, $1\times10^9$ to $1\times10^{10}$, $1\times10^9$ to $1\times10^{11}$, or from $1\times10^{10}$ to $1\times10^{12}$ mM$^{-1}$s$^{-1}$), and wherein the magnetic particles have binding moieties on their surfaces, the binding moieties operative to alter the specific aggregation of the magnetic particles in the presence of one or more analytes characteristic of sepsis selected from GRO-alpha, High mobility group-box 1 protein (HMBG-1), IL-1 receptor, IL-1 receptor antagonist, IL-1b, IL-2, IL-4, IL-6, IL-8, IL-10, IL-12, IL-13, IL-18, macrophage inflammatory protein (MIP-1), macrophage migration inhibitory factor (MIF), osteopontin, RANTES (regulated on activation, normal T-cell expressed and secreted; or CCL5), TNF-α, C-reactive protein (CRP), CD64, monocyte chemotactic protein 1 (MCP-1), adenosine deaminase binding protein (ABP-26), inducible nitric oxide synthetase (iNOS), lipopolysaccharide binding protein, and procalcitonin; (d) placing each assay sample in a device, the device including a support defining a well for holding the liquid sample including the magnetic particles and the one or more analytes, and having an RF coil disposed about the well, the RF coil configured to detect a signal produced by exposing the liquid sample to a bias magnetic field created using one or more magnets and an RF pulse sequence; (e) exposing each assay sample to the bias magnetic field and the RF pulse sequence; (f) following step (e), measuring the signal produced by the first assay sample and the signal produced by the second assay sample; (g) on the basis of the result of step (f), monitoring the one or more analytes of the first assay sample and monitoring the one or more analytes of the second assay sample; and (h) using the results of step (g) to diagnose the subject. In one embodiment, the one or more pathogen-associated analytes of the first assay sample are derived from a pathogen associated with sepsis selected from *Acinetobacter baumannii, Aspergillus fumigatis, Bacteroides fragilis, B. fragilis,* blaSHV, *Burkholderia cepacia, Campylobacter jejuni/coli, Candida guilliermondii, C. albicans, C. glabrata, C. krusei, C. lusitaniae, C. parapsilosis, C. tropicalis, Clostridium pefringens,* Coagulase negative Staph, *Enterobacter aeraogenes, E. cloacae, Enterobacteriaceae, Enterococcus faecalis, E. faecium, Escherichia coli, Haemophilus influenzae, Kingella Kingae, Klebsiella oxytoca, K. pneumoniae, Listeria monocytogenes,* Mec A gene (MRSA), *Morganella morgana, Neisseria meningitidis, Neisseria* spp. non-meningitidis, *Prevotella buccae, P. intermedia, P. melaminogenica, Propionibacterium acnes, Proteus mirabilis, P. vulgaris, Pseudomonas aeruginosa, Salmonella enterica, Serratia marcescens, Staphylococcus aureus, S. haemolyticus, S. maltophilia, S. saprophyticus, Stenotrophomonas maltophilia, S. maltophilia, Streptococcus agalactie, S. bovis, S. dysgalactie, S. mitis, S. mutans, S. pneumoniae, S. pyogenes,* and *S. sanguinis*. The one or more pathogen-associated analytes can be derived from treatment resistant strains of bacteria, such as penicillin-resistant, methicillin-resistant, quinolone-resistant, macrolide-resistant, and/or vancomycin-resistant bacterial strains (e.g., methicillin resistant *Staphylococcus aureus* or vancomycin-resistant enterococci). In certain embodiments, the one or more analytes of the second assay sample are selected from GRO-alpha, High mobility group-box 1 protein (HMBG-1), IL-1 receptor, IL-1 receptor antagonist, IL-1b, IL-2, IL-4, IL-6, IL-8, IL-10, IL-12, IL-13, IL-18, macrophage inflammatory protein (MIP-1), macrophage migration inhibitory factor (MIF), osteopontin, RANTES (regulated on activation, normal T-cell expressed and secreted; or CCL5), TNF-α, C-reactive protein (CRP), CD64, and monocyte chemotactic protein 1 (MCP-1). In a particular embodiment, the method further includes preparing a third assay sample to monitor the concentration of an antiviral agent, antibiotic agent, or antifungal agent circulating in the blood stream of the subject. In certain embodiments, the subject can be an immunocompromised subject, or a subject at risk of becoming immunocompromised. In any of the above methods of monitoring, the monitoring can be intermittent (e.g., periodic), or continuous. In certain embodiments, the magnetic particles are substantially monodisperse; exhibit nonspecific reversibility in the absence of the analyte and multivalent binding agent; and/or the magnetic particles further include a surface decorated with a blocking agent selected from albumin, fish skin gelatin, gamma globulin, lysozyme, casein, peptidase, and an amine-bearing moiety (e.g., amino polyethyleneglycol, glycine, ethylenediamine, or amino dextran). In particular embodiments, the liquid sample further includes a buffer, from 0.1% to 3% (w/w) albumin (e.g., from 0.1% to 0.5%, 0.3% to 0.7%, 0.5% to 1%, 0.8% to 2%, or from 1.5% to 3% (w/w) albumin), from 0.01% to 0.5% nonionic surfactant (e.g., from 0.01% to 0.05%, 0.05% to 0.1%, 0.05% to 0.2%, 0.1% to 0.3%, 0.2% to 0.4%, or from 0.3% to 0.5% nonionic surfactant), or a combination thereof. In still other embodiments, the magnetic particles include a surface decorated with 40 µg to 100 µg (e.g., 40 µg to 60 µg, 50 µg to 70 µg, 60 µg to 80 µg, or 80 µg to 100 µg) of one or more proteins per milligram of the magnetic particles. The liquid sample can include a multivalent binding agent bearing a plurality of analytes conjugated to a polymeric scaffold. The method for monitoring can include any of the magnetic assisted agglomeration methods described herein.

The invention further features a method of monitoring one or more analytes in a liquid sample derived from a patient for the diagnosis, management, or treatment of sepsis or SIRS in a patient, the method including: (a) combining with the liquid sample from $1 \times 10^6$ to $1 \times 10^{13}$ magnetic particles per milliliter of the liquid sample (e.g., from $1 \times 10^6$ to $1 \times 10^8$, $1 \times 10^7$ to $1 \times 10^8$, $1 \times 10^7$ to $1 \times 10^9$, $1 \times 10^8$ to $1 \times 10^{10}$, $1 \times 10^9$ to $1 \times 10^{11}$, or $1 \times 10^{10}$ to $1 \times 10^{13}$ magnetic particles per milliliter), wherein the magnetic particles have a mean diameter of from 150 nm to 1200 nm (e.g., from 150 to 250, 200 to 350, 250 to 450, 300 to 500, 450 to 650, 500 to 700 nm, 700 to 850, 800 to 950, 900 to 1050, or from 1000 to 1200 nm), and a $T_2$ relaxivity per particle of from $1 \times 10^8$ to $1 \times 10^{12}$ mM$^{-1}$s$^{-1}$ (e.g., from $1 \times 10^8$ to $1 \times 10^9$, $1 \times 10^8$ to $1 \times 10^{10}$, $1 \times 10^9$ to $1 \times 10^{10}$, $1 \times 10^9$ to $1 \times 10^{11}$, or from $1 \times 10^{10}$ to $1 \times 10^{12}$ mM$^{-1}$s$^{-1}$), and wherein the magnetic particles have binding moieties on their surfaces, the binding moieties operative to alter the specific aggregation of the magnetic particles in the presence of the one or more analytes or a multivalent binding agent; (b) placing the liquid sample in a device, the device including a support defining a well for holding the liquid sample including the magnetic particles and the one or more analytes, and having an RF coil disposed about the well, the RF coil configured to detect a signal produced by exposing the liquid sample to a bias magnetic field created using one or more magnets and an RF pulse sequence; (c) exposing the sample to the bias magnetic field and the RF pulse sequence; (d) following step (c), measuring the signal; (e) on the basis of the result of step (d), monitoring the one or more analytes; and (f) using the result of step (e) to diagnose, manage, or treat the sepsis or SIRS. The method can include (i) monitoring a pathogen-associated analyte, and (ii) monitoring a second analyte characteristic of sepsis selected from GRO-alpha, High mobility group-box 1 protein (HMBG-1), IL-1 receptor, IL-1 receptor antagonist, IL-1b, IL-2, IL-4, IL-6, IL-8, IL-10, IL-12, IL-13, IL-18, macrophage inflammatory protein (MIP-1), macrophage migration inhibitory factor (MIF), osteopontin, RANTES (regulated on activation, normal T-cell expressed and secreted; or CCL5), TNF-α, C-reactive protein (CRP), CD64, monocyte chemotactic protein 1 (MCP-1), adenosine deaminase binding protein (ABP-26), inducible nitric oxide synthetase (iNOS), lipopolysaccharide binding protein, and procalcitonin. In certain embodiments, the pathogen-associated analyte is derived from a pathogen associated with sepsis selected from *Acinetobacter baumannii, Aspergillus fumigatis, Bacteroides fragilis, B. fragilis,* blaSHV, *Burkholderia cepacia, Campylobacter jejuni/coli, Candida guilliermondii, C. albicans, C. glabrata, C. krusei, C. Lusitaniae, C. parapsilosis, C. tropicalis, Clostridium pefringens,* Coagulase negative Staph, *Enterobacter aeraogenes, E. cloacae, Enterobacteriaceae, Enterococcus faecalis, E. faecium, Escherichia coli, Haemophilus influenzae, Kingella Kingae, Klebsiella oxytoca, K. pneumoniae, Listeria monocytogenes,* Mec A gene (MRSA), *Morganella morgana, Neisseria meningitidis, Neisseria* spp. non-meningitidis, *Prevotella buccae, P. intermedia, P. melaminogenica, Propionibacterium acnes, Proteus mirabilis, P. vulgaris, Pseudomonas aeruginosa, Salmonella enterica,*

*Serratia marcescens, Staphylococcus aureus, S. haemolyticus, S. maltophilia, S. saprophyticus, Stenotrophomonas maltophilia, S. maltophilia, Streptococcus agalactie, S. bovis, S. dysgalactie, S. mitis, S. mutans, S. pneumoniae, S. pyogenes,* and *S. sanguinis.* The pathogen-associated analyte can be derived from a treatment resistant strain of bacteria, such as penicillin-resistant, methicillin-resistant, quinolone-resistant, macrolide-resistant, and/or vancomycin-resistant bacterial strains (e.g., methicillin resistant *Staphylococcus aureus* or vancomycin-resistant enterococci). In particular embodiments, the second analytes is selected from GRO-alpha, High mobility group-box 1 protein (HMBG-1), IL-1 receptor, IL-1 receptor antagonist, IL-1b, IL-2, IL-4, IL-6, IL-8, IL-10, IL-12, IL-13, IL-18, macrophage inflammatory protein (MIP-1), macrophage migration inhibitory factor (MIF), osteopontin, RANTES (regulated on activation, normal T-cell expressed and secreted; or CCL5), TNF-α, C-reactive protein (CRP), CD64, and monocyte chemotactic protein 1 (MCP-1). In a particular embodiment, the method further includes preparing a third assay sample to monitor the concentration of an antiviral agent, antibiotic agent, or antifungal agent circulating in the blood stream of the subject. In certain embodiments, the subject can be an immunocompromised subject, or a subject at risk of becoming immunocompromised. In any of the above methods of monitoring, the monitoring can be intermittent (e.g., periodic), or continuous. In certain embodiments, the magnetic particles are substantially monodisperse; exhibit nonspecific reversibility in the absence of the analyte and multivalent binding agent; and/or the magnetic particles further include a surface decorated with a blocking agent selected from albumin, fish skin gelatin, gamma globulin, lysozyme, casein, peptidase, and an amine-bearing moiety (e.g., amino polyethyleneglycol, glycine, ethylenediamine, or amino dextran). In particular embodiments, the liquid sample further includes a buffer, from 0.1% to 3% (w/w) albumin (e.g., from 0.1% to 0.5%, 0.3% to 0.7%, 0.5% to 1%, 0.8% to 2%, or from 1.5% to 3% (w/w) albumin), from 0.01% to 0.5% nonionic surfactant (e.g., from 0.01% to 0.05%, 0.05% to 0.1%, 0.05% to 0.2%, 0.1% to 0.3%, 0.2% to 0.4%, or from 0.3% to 0.5% nonionic surfactant), or a combination thereof. In still other embodiments, the magnetic particles include a surface decorated with 40 μg to 100 μg (e.g., 40 μg to 60 μg, 50 μg to 70 μg, 60 μg to 80 μg, or 80 μg to 100 μg) of one or more proteins per milligram of the magnetic particles. The liquid sample can include a multivalent binding agent bearing a plurality of analytes conjugated to a polymeric scaffold. The method for monitoring can include any of the magnetic assisted agglomeration methods described herein.

Magnetic Particles

The magnetic particles described herein include those described, e.g., in U.S. Pat. No. 7,564,245 and U.S. Patent Application Publication No. 2003-0092029, each of which is incorporated herein by reference. The magnetic particles are generally in the form of conjugates, that is, a magnetic particle with one or more binding moieties (e.g., an oligonucleotide, nucleic acid, polypeptide, or polysaccharide) linked thereto. The binding moiety causes a specific interaction with a target analyte. The binding moiety specifically binds to a selected target analyte, for example, a nucleic acid, polypeptide, or polysaccharide. In some instances, binding causes aggregation of the conjugates, resulting in a change, e.g., a decrease (e.g., in the case of smaller magnetic particles) or an increase (e.g., in the case of larger magnetic particles) in the spin-spin relaxation time (T2) of adjacent water protons in an aqueous solution (or protons in a non-aqueous solvent). Alternatively, the analyte binds to a preformed aggregate in a competitive disaggregation assay (e.g., an aggregate formed from a multivalent binding agent and magnetic particles), or competes with a multivalent binding agent for binding moieties on the magnetic particles in an inhibition assay (i.e., the formation of aggregates is inhibited in the presence of the analyte).

The conjugates have high relaxivity owing to the superparamagnetism of their iron, metal oxide, or other ferro or ferrimagnetic nanomaterials. Iron, cobalt, and nickel compounds and their alloys, rare earth elements such as gadolinium, and certain intermetallics such as gold and vanadium are ferromagnets can be used to produce superparamagnetic particles. The magnetic particles can be monodisperse (a single crystal of a magnetic material, e.g., metal oxide, such as superparamagnetic iron oxide, per magnetic particle) or polydisperse (e.g., a plurality of crystals per magnetic particle). The magnetic metal oxide can also comprise cobalt, magnesium, zinc, or mixtures of these metals with iron. Important features and elements of magnetic particles that are useful to produce conjugates include: (i) a high relaxivity, i.e., strong effect on water (or other solvent) relaxation, (ii) a functional group to which the binding moiety can be covalently attached, (iii) a low non-specific binding of interactive moieties to the magnetic particle, and/or (iv) stability in solution, i.e., the magnetic particles remain suspended in solution, not precipitated.

The magnetic particles may be linked to the binding moieties via functional groups. In some embodiments, the magnetic particles can be associated with a polymer that includes functional groups selected, in part, to enhance the magnetic particles nonspecific reversibility. The polymer can be a synthetic polymer, such as, but not limited to, polyethylene glycol or silane, natural polymers, or derivatives of either synthetic or natural polymers or a combination of these. The polymer may be hydrophilic. In some embodiments, the polymer "coating" is not a continuous film around the magnetic metal oxide, but is a "mesh" or "cloud" of extended polymer chains attached to and surrounding the metal oxide. The polymer can comprise polysaccharides and derivatives, including dextran, pullanan, carboxydextran, carboxymethyl dextran, and/or reduced carboxymethyl dextran. The metal oxide can be a collection of one or more crystals that contact each other, or that are individually entrapped or surrounded by the polymer.

Alternatively, the magnetic particles can be associated with non-polymeric functional group compositions. Methods of synthesizing stabilized, functionalized magnetic particles without associated polymers are described, for example, in Halbreich et al., Biochimie, 80:379 (1998).

The magnetic particles typically include metal oxide crystals of about 1-25 nm, e.g., about 3-10 nm, or about 5 nm in diameter per crystal. The magnetic particles can also include a polymer component in the form of a core and/or coating, e.g., about 5 to 20 nm thick or more. The overall size of the magnetic particles can be, e.g., from 20 to 50 nm, from 50 to 200 nm, from 100 to 300 nm, from 250 to 500 nm, from 400 to 600 nm, from 500 to 750 nm, from 700 to 1,200 nm, from 1,000 to 1,500 nm, or from 1,500 to 2,000 nm.

The ratio of magnetic particles to analyte molecules may be either less than 1 or greater than or equal to 1. In the latter case, in which there are more magnetic particles than analyte molecules, an assay may be conducted in which a given analyte is largely or entirely depleted from a sample and a differential signal is detected.

The magnetic particles may be prepared in a variety of ways. It is preferred that the magnetic particle have functional groups that link the magnetic particle to the binding moiety. Carboxy functionalized magnetic particles can be made, for example, according to the method of Gorman (see PCT Publication No. WO00/61191). In this method, reduced carboxymethyl (CM) dextran is synthesized from commercial dextran. The CM-dextran and iron salts are mixed together and are then neutralized with ammonium hydroxide. The resulting carboxy functionalized magnetic particles can be used for coupling amino functionalized oligonucleotides. Carboxy-functionalized magnetic particles can also be made from polysaccharide coated magnetic particles by reaction with bromo or chloroacetic acid in strong base to attach carboxyl groups. In addition, carboxy-functionalized particles can be made from amino-functionalized magnetic particles by converting amino to carboxy groups by the use of reagents such as succinic anhydride or maleic anhydride.

Magnetic particle size can be controlled by adjusting reaction conditions, for example, by using low temperature during the neutralization of iron salts with a base as described in U.S. Pat. No. 5,262,176. Uniform particle size materials can also be made by fractionating the particles using centrifugation, ultrafiltration, or gel filtration, as described, for example in U.S. Pat. No. 5,492,814.

Magnetic particles can also be synthesized according to the method of Molday (Molday, R. S, and D. MacKenzie, "Immunospecific ferromagnetic iron-dextran reagents for the labeling and magnetic separation of cells," J. Immunol. Methods, 52:353 (1982)), and treated with periodate to form aldehyde groups. The aldehyde-containing magnetic particles can then be reacted with a diamine (e.g., ethylene diamine or hexanediamine), which will form a Schiff base, followed by reduction with sodium borohydride or sodium cyanoborohydride.

Dextran-coated magnetic particles can be made and cross-linked with epichlorohydrin. The addition of ammonia reacts with epoxy groups to generate amine groups, see Hogemann, D., et al., Improvement of MRI probes to allow efficient detection of gene expression Bioconjug. Chem., 11:941 (2000), and Josephson et al., "High-efficiency intracellular magnetic labeling with novel superparamagnetic-Tat peptide conjugates," Bioconjug. Chem., 10:186 (1999)). This material is known as cross-linked iron oxide or "CLIO" and when functionalized with amine is referred to as amine-CLIO or $NH_2$-CLIO. Carboxy-functionalized magnetic particles can be converted to amino-functionalized magnetic particles by the use of water-soluble carbodiimides and diamines such as ethylene diamine or hexane diamine.

The magnetic particles can be formed from a ferrofluid (i.e., a stable colloidal suspension of magnetic particles). For example, the magnetic particle can be a composite of including multiple metal oxide crystals of the order of a few tens of nanometers in size and dispersed in a fluid containing a surfactant, which adsorbs onto the particles and stabilizes them, or by precipitation, in a basic medium, of a solution of metal ions. Suitable ferrofluids are sold by the company Liquids Research Ltd under the references: WHKS1S9 (A, B or C), which is a water-based ferrofluid comprising magnetite ($Fe_3O_4$), having particles 10 nm in diameter; WHJS1 (A, B or C), which is an isoparaffin-based ferrofluid comprising particles of magnetite ($Fe_3O_4$) 10 nm in diameter; and BKS25 dextran, which is a water-based ferrofluid stabilized with dextran, comprising particles of magnetite ($Fe_3O_4$) 9 nm in diameter. Other suitable ferrofluids for use in the systems and methods of the invention are oleic acid-stabilized ferrofluids available from Ademtech, which include ca. 70% weight $\alpha$-$Fe_2O_3$ particles (ca. 10 nm in diameter), 15% weight octane, and 15% weight oleic acid.

The magnetic particles are typically a composite including multiple metal oxide crystals and an organic matrix, and having a surface decorated with functional groups (i.e., amine groups or carboxy groups) for the linking binding moieties to the surface of the magnetic particle. For example, the magnetic particles useful in the methods of the invention include those commercially available from Dynal, Seradyn, Kisker, Miltenyi Biotec, Chemicell, Anvil, Biopal, Estapor, Genovis, Thermo Fisher Scientific, JSR micro, Invitrogen, and Ademtech, as well as those described in U.S. Pat. Nos. 4,101,435; 4,452,773; 5,204,457; 5,262,176; 5,424,419; 6,165,378; 6,866,838; 7,001,589; and 7,217,457, each of which is incorporated herein by reference.

Avidin or streptavidin can be attached to magnetic particles for use with a biotinylated binding moiety, such as an oligonucleotide or polypeptide (see, e.g., Shen et al., "Magnetically labeled secretin retains receptor affinity to pancreas acinar cells," Bioconjug. Chem., 7:311 (1996)). Similarly, biotin can be attached to a magnetic particle for use with an avidin-labeled binding moiety. Alternatively, the binding moiety is covalently linked to the surface of the magnetic particle; the particles may be decorated with IgG molecules; the particles may be decorated with anti his antibodies; or the particles may be decorated with his-tagged FAbs.

Low molecular weight materials can be separated from the magnetic particles by ultra-filtration, dialysis, magnetic separation, or other means prior to use. For example, unreacted binding moieties and linking agents can be separated from the magnetic particle conjugates by magnetic separation or size exclusion chromatography. In certain instances the magnetic particles can be fractionated by size to produce mixtures of particles of a particular size range and average diameter.

For certain assays requiring high sensitivity, analyte detection using $T_2$ relaxation assays can require selecting a proper particle to enable sufficiently sensitive analyte-induced agglomeration. Higher sensitivities can be achieved using particles that contain multiple superparamagnetic iron oxide cores (5-15 nm diameter) within a single larger polymer matrix or ferrofluid assembly (100 nm-1200 nm total diameter, such as particles having an average diameter of 100 nm, 200 nm, 250 nm, 300 nm, 500 nm, 800 nm, or 1000 nm), or by using a higher magnetic moment materials or particles with higher density, and/or particles with higher iron content. Without being limited by theory, it is postulated these types of particles provided a sensitivity gain of over 100× due to a much higher number of iron atoms per particle, which is believed to lead to an increase in sensitivity due to the decreased number of particles present in the assay solution and possibly a higher amount of superparamagnetic iron affected by each clustering event.

Relaxivity per particle and particle size is one useful term for selecting an optimal particle for high sensitivity assays. Ideally, this term will be as large as possible. Relaxivity per particle is a measure of the affect of each particle on the measured $T_2$ value. The larger this number, the fewer the number of particles needed to elicit a given $T_2$ response. Furthermore, the lower the concentration of particles in the reactive solution, the higher the analytical sensitivity of the assay. Relaxivity per particle can be a more useful parameter in that the iron density and relaxivity can vary from magnetic particle to magnetic particle, depending upon the components used to make the particles (see Table 1). Relaxivity per particle is proportional to the saturation magnetization of a superparamagnetic material.

TABLE 1

| Hydroynamic Diameter (nm) | # Metal Atoms per Particle | Relaxivity per Particle (mM$^{-1}$ s$^{-1}$) |
|---|---|---|
| 10-30 | 1.0E+03-1.0E+06 | 1.0E+6-1.0E+11 |
| 10-50 | 8.0E+02-4.0E+04 | 1.0E+04-4.0E+06 |
| 10-50 | 1.0E+04-5.0E+05 | 1.0E+06-1.0E+08 |
| 50-100 | 1.0E+04-1.0E+07 | 1.0E+06-1.0E+09 |
| 100-200 | 5.0E+06-5.0E+07 | 5.0E+08-8.0E+09 |
| 200-300 | 1.0E+07-1.0E+08 | 3.0E+09-1.0E+10 |
| 300-500 | 5.0E+07-1.0E+09 | 7.0E+09-5.0E+10 |
| 500-800 | 1.0E+08-4.1E+09 | 1.0E+10-5.0E+11 |
| 800-1000 | 5.0E+08-5.0E+09 | 5.0E+10-5.0E+11 |
| 1000-1200 | 1.0E+09-7.0E+09 | 1.0E+11-1.0E+12 |

The base particle for use in the systems and methods of the invention can be any of the commercially available particles identified in Table 2.

TABLE 2

| Catalogue No. | Source/Description | Diameter (μm) |
|---|---|---|
| | Kisker | |
| MAv-1 | Polystyrene, Magnet Particles Avidin coated | 1.0-1.9 |
| PMSt-0.6 | Polystyrene, Magnet Particles Streptavidin coated | 0.5-0.69 |
| PMSt-0.7 | Polystyrene, Magnet Particles Streptavidin coated | 0.7-0.9 |
| PMSt-1.0 | Polystyrene, Magnet Particles Streptavidin coated | 1.0-1.4 |
| PMB-1 | Polystyrene, Magnet Particles Biotin covalently coupled to BSA coating | 1.0-1.9 |
| PMP-200 | Dextran based, No coating, plain | 0.2 |
| PMP-1000 | Dextran based, No coating, plain | 0.10 |
| PMP-1300 | Dextran based, No coating, plain | 0.13 |
| PMP-2500 | Dextran based, No coating, plain | 0.25 |
| PMN-1300 | Dextran based, NH2— coated | 0.13 |
| PMN-2500 | Dextran based, NH2— coated | 0.25 |
| PMC-1000 | Dextran based, COOH— coated | 0.10 |
| PMC-1300 | Dextran based, COOH— coated | 0.13 |
| PMC-2500 | Dextran based, COOH— coated | 0.25 |
| PMAV-1300 | Dextran based, Avidin coated | 0.13 |
| PMAV-2500 | Dextran based, Avidin coated | 0.25 |
| PMSA-1000 | Dextran based, Streptavidin coated | 0.1 |
| PMSA-1300 | Dextran based, Streptavidin coated | 0.13 |
| PMSA-2500 | Dextran based, Streptavidin coated | 0.25 |
| PMB-1000 | Dextran based, Biotin coated | 0.1 |
| PMB-1300 | Dextran based, Biotin coated | 0.13 |
| PMB-2500 | Dextran based, Biotin coated | 0.25 |
| PMPA-1000 | Dextran based, Protein A coated | 0.1 |
| PMPA-1300 | Dextran based, Protein A coated | 0.13 |
| PMPA-2500 | Dextran based, Protein A coated | 0.25 |
| PMC-0.1 | Dextran based, COOH functionalized | 0.1-0.4 |
| PMC-0.4 | Dextran based, COOH functionalized | 0.4-0.7 |
| PMC-0.7 | Dextran based, COOH functionalized | 0.7-0.9 |
| PMC-1.0 | Dextran based, COOH functionalized | 1.0-1.4 |
| PMN-1.0 | Dextran based, NH2 functionalized | 1.0-1.4 |
| PMC-0.1 | Dextran based, COOH functionalized | 0.1-0.4 |
| | Accurate Chemical | |
| ADM01020 | Carboxyl-functionality | 0.2 |
| ADM01030 | Carboxyl-functionality | 0.3 |
| ADM02020 | Carboxyl-functionality | 0.2 |
| ADM02133 | high Carboxyl-functionality | 0.3 |
| ADM02150 | Carboxyl-functionality | 0.5 |
| ADM02220 | very high Amino-functionality | 0.2 |
| ADM02230 | very high Amino-functionality | 0.3 |
| ADM02020 | Carboxyl-functionality | 0.5 |
| ADM02030 | high Carboxyl-functionality | 0.3 |
| ADM02110 | high Carboxyl-functionality | 0.1 |
| ADM02120 | very high Carboxyl-functionality | 0.2 |
| ADM02130 | very high Carboxyl-functionality | 0.3 |
| ADM02252 | Carboxyl-functionality | 0.5 |
| ADM03120 | Streptavidin-functionality | 0.2 |
| ADM03121 | Streptavidin-functionality chemicell | 0.2 |
| 1201-5 1 | Si—(CH$_2$)$_3$—COOH | 0.5 |
| 1201-5 1 | Si—(CH$_2$)$_3$—COOH | 0.75 |
| 1201-5 1 | Si—(CH$_2$)$_3$—COOH | 1.0 |
| 1202-5 1 | Si—(CH$_2$)$_3$—SO$_3$H | 0.5 |
| 1202-5 1 | Si—(CH$_2$)$_3$—SO$_3$H | 0.75 |
| 1202-5 1 | Si—(CH$_2$)$_3$—SO$_3$H | 1.0 |
| 1205-1 | Si—(CH$_2$)$_3$—PO$_3$H$_2$ | 0.5 |
| 1205-1 | Si—(CH$_2$)$_3$—PO$_3$H$_2$ | 0.75 |
| 1205-1 | Si—(CH$_2$)$_3$—PO$_3$H$_2$ | 1.0 |
| | Estapor | |
| M1-130/12 | Carboxylated polystyrene | 0.7-1.3 |
| M1-180/12 | Carboxylated Polystyrene | 0.9-1.3 |
| M1-180/20 | Carboxylated Divinylbenzene | 0.8-1.2 |
| M1-050/20 | Carboxylated Polystyrene | 0.5-0.7 |
| M1-070/40 | Carboxylated Polystyrene | 0.7-1.3 |
| M1-070/60 | Carboxylated Polystyrene | 0.7-1.3 |
| M1-020/50 | Carboxylated Polystyrene | 0.16-0.24 |
| M1-030/40 | Carboxylated Polystyrene | 0.3-0.5 |
| | Genovis | |
| AMI-25 | Dextran | 80-150 |
| | Thermo Fisher | |
| 4515-2105 | Carboxylate-Modified (MG-CM) | 1.0 |
| 7815-2104 | NeutrAvidin (MG-NA) | 1.0 |
| 5915-2104 | Streptavidin (MG-SA) | 1.0 |
| 2415-2105 | Carboxylate-Modified (MG-CM) | 1.0 |
| 4415-2105 | Carboxylate-Modified (MG-CM) | 1.0 |
| | JSR micro | |
| MB100 | Carboxylated | 1.1 |
| | Invitrogen | |
| 354-01 | Carboxylated | 1 |
| 355-00 | Tosylactivated | 1 |
| 650-11 | Carboxylated | 1 |
| 655-11 | Tosylactivated | 1 |
| | Biopal | |
| M02Q05 | Amino activated | 1.5 |
| M02Q05 | Biotin activated | 1.5 |
| M02Q05 | Strepavidin activated | 1.5 |

The magnetic particles for use in the systems and methods of the invention can have a hydrodynamic diameter from 10 nm to 1200 nm, and containing on average from $8\times10^2$-$1\times10^{10}$ metal atoms per particle, and having a relaxivity per particle of from $1\times10^4$-$1\times10^{13}$ mM$^{-1}$s$^{-1}$. The magnetic particles used in the systems and methods of the invention can be any of the designs, composites, or sources described above, and can be further modified has described herein for use as a magnetic resonance switch.

In addition to relaxivity per particle, several other practical issues must be address in the selection and design of magnetic particles for high analytical sensitivity assays.

For example, the use of large particles (i.e., 1000 nm or greater) may be desired to maximize iron content and the relaxivity per particle. However, we have observed that particles of this size tend to settle rapidly out of solution. We have observed that particle settling does not typically interfere with the assay if magnetic particle sizes are kept below 500 nm. When use of a particle above 500 nm in the described assays or smaller particles with high density are employed, settling is monitored and effect on T$_2$ measurement is determined. We have found a magnetic particle size of about 100-300 nm particle to be ideal for stability in terms of settling, even after functionalization (increasing the hydrodynamic diameter to 300 nm by approximately 50 nm), and to afford the high sensitivity enabled by a high relaxivity per particle. Particle density certainly plays a role in buoyancy. As such, the relative density of the solution and particles plays an important role in settling of the particle. Accordingly, a possible solution to this problem is the use of buoyant magnetic particles (i.e., a hollow particle, or particle containing both a low density matrix and high density metal oxide). Settling may affect the $T_2$ detection, thus, solution additives may be employed to change the ratio of the particle to solution density. $T_2$ detection can be impacted by settling if there is a significant portioning of the superparamagentic material from the measured volume of liquid. Settling can be assessed by diluting the particles to a concentration such that UV-V is absorbance at 410 nm is between 0.6-0.8 absorbance units and then monitoring the absorbance for 90 minutes. If settling occurs, the difference between the initial and final absorbances divided by the initial absorbance will be greater than 5%. If % settling is above 5% then the particle is typically not suitable for use in assays requiring high analytical sensitivity. The magnetic particles used in the assays of the invention can be, but are not limited to, nonsettling magnetic particles. High settling represents handling difficulties and may lead to reproducibility issues.

For magnetic particles on the order of 100 nm or larger, the multiple superparamagnetic iron oxide crystals that typically comprise the particle core results in a net dipole moment when in the presence of external magnetic fields. Nonspecific reversibility is a measure of the colloidal stability and robustness against non-specific aggregation. Nonspecific reversibility is assessed by measuring the $T_2$ values of a solution of particles before and after incubation in a uniform magnetic field (defined as <5000 ppm). Starting $T_2$ values are typically 200 ms for a particle with an iron concentration of 0.01 mM Fe. If the difference in $T_2$ values before and after incubation in the uniform magnetic field is less than 20 ms, the samples are deemed reversible. Further, 10% is a threshold allowing starting $T_2$ measurements to reflect assay particle concentration. If the difference is greater than 10%, then the particles exhibit irreversibility in the buffer, diluents, and matrix tested. The MAA reversibility of the magnetic particles can be altered as described herein. For example, colloidal stability and robustness against non-specific aggregation can be influenced by the surface characteristics of the particles, the binding moieties, the assay buffer, the matrix and the assay processing conditions. Maintenance of colloidal stability and resistance to non-specific biding can be altered by conjugation chemistry, blocking methods, buffer modifications, and/or changes in assay processing conditions.

We have observed that a very important attribute for robust and reproducible assays is the monodispersity in the size distribution of the magnetic particles used, a distinction observed in polydisperse particles post-coating versus monodisperse particle pre-coating. Polydisperse batches of magnetic particles can lack reproducibility and compromise sensitivity. Polydisperse samples can also present problems in terms of achieving uniform coatings. For certain highly sensitive assays it is desirable that the magnetic particles be substantially monodisperse in size distribution (i.e., having a polydispersity index of less than about 0.8-0.9).

Given that the assays of the invention require monitoring a shift in the clustering states of the agglomeration assays and that measuring a change in clustering likely requires a significant fraction of clustered particles (e.g., thought to be >1-10%), the total number of particles in an assay should be minimized to enable the highest sensitivity. However, sufficient number of particles must be present to allow utilization of the T2 detection dynamic range. We have found that the highest sensitivity is observed when the number of magnetic particles (or molar equivalent) is approximately on the same order of magnitude of the number (or molar equivalent) of the analyte being detected, and the magnitude of the number (or molar equivalent) multivalent binding agents employed (i.e., in an inhibition assay).

For proteinaceous samples it may also be required to modify the magnetic particle surface to reduce non-specific binding of background proteins to the magnetic particles. Non-specific binding of background proteins to particles can induce or impede particle clustering, resulting in false signals and/or false lack of signals. For example, in some instances the surface of the magnetic particle can include blocking agents covalently linked to the surface of the magnetic particle which reduce non-specific binding of background proteins. There are a variety of agents that one could use to achieve the desired effect, and in some cases, it is a combination of agents that is optimal (see Table 3; exemplary particles, coatings, and binding moieties).

TABLE 3

| Base Particle | Coating | Binding Moiety |
| --- | --- | --- |
| NP-COOH: | amino Dextran<br>Transferrin<br>Lysozyme<br>BSA<br>FSG<br>BGG<br>Ovalbumin<br>amino PEG<br>Human albumin | Small molecule |
|  | none<br>amino PEG<br>BSA<br>amino Dextran | Antibody |
| NP-amino: | none<br>PEG | Small molecule |
| NP-SA: | none<br>biotinylated amino PEG | biotinylated Ab<br>Antibody |
| NP-SA: | biotinylated amino PEG | small molecule |
| NP-anti-species: | none | Antibody |
| NP-Ni: | none | his-tagged antibody |

Thus, we have found a protein block may be required to achieve assay activity and sensitivity, particularly in proteinaceous samples (e.g., plasma samples or whole blood samples), that is comparable to results in nonproteinaceous buffer samples. Some commonly used protein blockers which may be used in provided preparations include, e.g., bovine serum albumin (BSA), fish skin gelatin (FSG), bovine gamma globulin (BGG), lysozyme, casein, pepticase, or non-fat dry milk. In certain embodiments a magnetic particle coating includes BSA or FSG. In other embodiments, a combination of coatings are combinations of those exemplary coatings listed in Table 3.

Furthermore, nonspecific binding can be due to lipids or other non-proteinaceous molecules in the biological sample. For non-proteinaceous mediated non-specific binding, changes in pH and buffer ionic strength maybe selected to enhance the particle repulsive forces, but not enough to limit the results of the intended interactions.

Assay Reagents

The assays of the invention can include reagents for reducing the non-specific binding to the magnetic particles. For example, the assay can include one or more proteins (e.g., albumin, fish skin gelatin, lysozyme, or transferrin); low molecular weight (<500 Daltons) amines (e.g., amino acids, glycine, ethylamine, or mercaptoethanol amine); and/or water soluble non-ionic surface active agents (e.g., polyethyleneglycol, Tween® 20, Tween® 80, Pluronic®, or Igepal®).

The surfactant may be selected from a wide variety of soluble non-ionic surface active agents including surfactants that are generally commercially available under the IGEPAL trade name from GAF Company. The IGEPAL liquid non-ionic surfactants are polyethylene glycol p-isooctylphenyl ether compounds and are available in various molecular weight designations, for example, IGEPAL CA720, IGEPAL CA630, and IGEPAL CA890. Other suitable non-ionic surfactants include those available under the trade name TETRONIC 909 from BASF Wyandotte Corporation. This material is a tetra-functional block copolymer surfactant terminating in primary hydroxyl groups. Suitable non-ionic surfactants are also available under the VISTA ALPHONIC trade name from Vista Chemical Company and such materials are ethoxylates that are non-ionic biodegradables derived from linear primary alcohol blends of various molecular weights. The surfactant may also be selected from poloxamers, such as polyoxyethylene-polyoxypropylene block copolymers, such as those available under the trade names Synperonic PE series (ICI), Pluronic® series (BASF), Supronic, Monolan, Pluracare, and Plurodac, polysorbate surfactants, such as Tween® 20 (PEG-20 sorbitan monolaurate), and glycols such as ethylene glycol and propylene glycol.

Such non-ionic surfactants may be selected to provide an appropriate amount of detergency for an assay without having a deleterious effect on assay reactions. In particular, surfactants may be included in a reaction mixture for the purpose of suppressing non-specific interactions among various ingredients of the aggregation assays of the invention. The non-ionic surfactants are typically added to the liquid sample prior in an amount from 0.01% (w/w) to 5% (w/w).

The non-ionic surfactants may be used in combination with one or more proteins (e.g., albumin, fish skin gelatin, lysozyme, or transferring) also added to the liquid sample prior in an amount from 0.01% (w/w) to 5% (w/w).

Furthermore, the assays, methods, and cartridge units of the invention can include additional suitable buffer components (e.g., Tris base, selected to provide a pH of about 7.8 to 8.2 in the reaction milieu); and chelating agents to scavenge cations (e.g., EDTA disodium, ethylene diamine tetraacetic acid (EDTA), citric acid, tartaric acid, glucuronic acid, saccharic acid or suitable salts thereof).

Binding Moieties

In general, a binding moiety is a molecule, synthetic or natural, that specifically binds or otherwise links to, e.g., covalently or non-covalently binds to or hybridizes with, a target molecule, or with another binding moiety (or, in certain embodiments, with an aggregation inducing molecule). For example, the binding moiety can be an antibody directed toward an antigen or any protein-protein interaction. Alternatively, the binding moiety can be a polysaccharide that binds to a corresponding target or a synthetic oligonucleotide that hybridizes to a specific complementary nucleic acid target. In certain embodiments, the binding moieties can be designed or selected to serve, when bound to another binding moiety, as substrates for a target molecule such as enzyme in solution.

Binding moieties include, for example, oligonucleotide binding moieties, polypeptide binding moieties, antibody binding moieties, and polysaccharide binding moieties.

Oligonucleotide Binding Moieties

In certain embodiments, the binding moieties are oligonucleotides, attached/linked to the magnetic particles using any of a variety of chemistries, by a single, e.g., covalent, bond, e.g., at the 3' or 5' end to a functional group on the magnetic particle.

An oligonucleotide binding moiety can be constructed using chemical synthesis. A double-stranded DNA binding moiety can be constructed by enzymatic ligation reactions using procedures known in the art. For example, a nucleic acid (e.g., an oligonucleotide) can be chemically synthesized using naturally occurring nucleotides or variously modified nucleotides designed to increase the biological stability of the molecules or to increase the physical stability of the duplex formed between the complementary strands, e.g., phosphorothioate derivatives and acridine substituted nucleotides can be used. The nucleic acid also can be produced biologically using an expression vector into which a nucleic acid has been subcloned.

One method uses at least two populations of oligonucleotide magnetic particles, each with strong effects on water (or other solvent) relaxation. As the oligonucleotide-magnetic particle conjugates react with a target oligonucleotide, they form aggregates (e.g. clusters of magnetic particles). Upon prolonged standing, e.g., overnight at room temperature, the aggregates form large clusters (micron-sized clusters). Using the methods of the invention, the formation of large clusters can be accomplished more quickly by employing multiple cycles of magnetic assisted agglomeration. Magnetic resonance is used to determine the relaxation properties of the solvent, which are altered when the mixture of magnetic oligonucleotide magnetic particles reacts with a target nucleic acid to form aggregates.

Certain embodiments employ a mixture of at least two types of magnetic metal oxide magnetic particles, each with a specific sequence of oligonucleotide, and each with more than one copy of the oligonucleotide attached, e.g., covalently, per magnetic particle. For example, the assay protocol may involve preparing a mixture of populations of oligonucleotide-magnetic particle conjugates and reacting the mixture with a target nucleic acid. Alternatively, oligonucleotide-magnetic particle conjugates can be reacted with the target in a sequential fashion. Certain embodiments feature the use of magnetic resonance to detect the reaction of the oligonucleotide-magnetic particle conjugates with the target nucleic acid. When a target is present, the dispersed conjugates self-assemble to form small aggregates.

For example, oligonucleotide binding moieties can be linked to the metal oxide through covalent attachment to a functionalized polymer or to non-polymeric surface-functionalized metal oxides. In the latter method, the magnetic particles can be synthesized according to the method of Albrecht et al., Biochimie, 80:379 (1998). Dimercaptosuccinic acid is coupled to the iron oxide and provides a carboxyl functional group.

In certain embodiments, oligonucleotides are attached to magnetic particles via a functionalized polymer associated with the metal oxide. In some embodiments, the polymer is hydrophilic. In certain embodiments, the conjugates are made using oligonucleotides that have terminal amino, sulfhydryl, or phosphate groups, and superparamagnetic iron oxide magnetic particles bearing amino or carboxy groups on a hydrophilic polymer. There are several methods for synthesizing carboxy and amino derivatized-magnetic particles.

Other forms of oligonucleotides may be used. For example, aptamers are single-stranded RNA or DNA oligonucleotides 15 to 60 base in length that in solution form intramolecular interactions that fold the linear nucleic acid molecule into a three dimensional complex that then can bind with high affinity to specific molecular targets; often with equilibrium constants in the range of 1 pM to 1 nM which is similar to some monoclonal antibodies-antigen interactions. Aptamers can specifically bind to other nucleic acid molecules, proteins, small organic compounds, small molecules, and cells (organisms or pathogens).

Polypeptide Binding Moieties

In certain embodiments, the binding moiety is a polypeptide (i.e., a protein, polypeptide, or peptide), attached, using any of a variety of chemistries, by a single covalent bond in such a manner so as to not affect the biological activity of the polypeptide. In one embodiment, attachment is done through the thiol group of single reactive cysteine residue so placed that its modification does not affect the biological activity of the polypeptide. In this regard the use of linear polypeptides, with cysteine at the C-terminal or N-terminal end, provides a single thiol in a manner similar to which alkanethiol supplies a thiol group at the 3' or 5' end of an oligonucleotide. Similar bifunctional conjugation reagents, such as SPDP and reacting with the amino group of the magnetic particle and thiol group of the polypeptide, can be used with any thiol bearing binding moiety. The types of polypeptides used as binding moieties can be antibodies, antibody fragments, and natural and synthetic polypeptide sequences. The peptide binding moieties have a binding partner, that is, a molecule to which they selectively bind.

Use of peptides as binding moieties offers several advantages. For example, the mass per binding site is low. For example, up to twenty 2 kDa peptides can be attached to a magnetic particle, calculated assuming 2064 iron atoms per magnetic particle. With larger binding moieties like proteins (generally greater than about 30 kDa) the same mass of attached polypeptide results in at least approximately 1-4 binding moieties per magnetic particle. Also, polypeptides can be engineered to have uniquely reactive residues, distal from the residues required for biological activity, for attachment to the magnetic particle. The reactive residue can be a cysteine thiol, an N-terminal amino group, a C-terminal carboxyl group or a carboxyl group of aspartate or glutamate, etc. A single reactive residue on the peptide is used to insure a unique site of attachment. These design principles can be followed with chemically synthesized peptides or biologically produced polypeptides.

The binding moieties can also contain amino acid sequences from naturally occurring (wild-type) polypeptides or proteins. For example, the natural polypeptide may be a hormone, (e.g., a cytokine, a growth factor), a serum protein, a viral protein (e.g., hemagglutinin), an extracellular matrix protein, a lectin, or an ectodomain of a cell surface protein. In general, the resulting binding moiety-magnetic particle is used to measure the presence of analytes in a test media reacting with the binding moiety.

Examples of protein hormones which can be utilized as binding moieties include, without limitation, platelet-derived growth factor (PDGF), which binds the PDGF receptor; insulin-like growth factor-I and -II (Igf), which binds the Igf receptor; nerve growth factor (NGF), which binds the NGF receptor; fibroblast growth factor (FGF), which binds the FGF receptor (e.g., aFGF and bFGF); epidermal growth factor (EGF), which binds the EGF receptor; transforming growth factor (TGF, e.g., TGFα and TGF-β), which bind the TGF receptor; erythropoietin, which binds the erythropoitin receptor; growth hormone (e.g., human growth hormone), which binds the growth hormone receptor; and proinsulin, insulin, A-chain insulin, and B-chain insulin, which all bind to the insulin receptor.

Receptor binding moieties are useful for detecting and imaging receptor clustering on the surface of a cell. Useful ectodomains include those of the Notch protein, Delta protein, integrins, cadherins, and other cell adhesion molecules.

Antibody Binding Moieties

Other polypeptide binding moieties include immunoglobulin binding moieties that include at least one immunoglobulin domain, and typically at least two such domains. An "immunoglobulin domain" refers to a domain of a antibody molecule, e.g., a variable or constant domain. An "immunoglobulin superfamily domain" refers to a domain that has a three-dimensional structure related to an immunoglobulin domain, but is from a non-immunoglobulin molecule. Immunoglobulin domains and immunoglobulin superfamily domains typically include two β-sheets formed of about seven β-strands, and a conserved disulphide bond (see, e.g., Williams and Barclay Ann. Rev Immunol., 6:381 (1988)). Proteins that include domains of the Ig superfamily domains include T cell receptors, CD4, platelet derived growth factor receptor (PDGFR), and intercellular adhesion molecule (ICAM).

One type of immunoglobulin binding moiety is an antibody. The term "antibody," as used herein, refers to a full-length, two-chain immunoglobulin molecule and an antigen-binding portion and fragments thereof, including synthetic variants. A typical antibody includes two heavy (H) chain variable regions (abbreviated herein as VH), and two light (L) chain variable regions (abbreviated herein as VL). The VH and VL regions can be further subdivided into regions of hypervariability, termed "complementarity determining regions" (CDR), interspersed with regions that are more conserved, termed "framework regions" (FR). The extent of the framework region and CDR's has been precisely defined (see, Kabat, E. A., et al. (1991) Sequences of Proteins of Immunological Interest, Fifth Edition, U.S. Department of Health and Human Services, NIH Publication No. 91-3242, and Chothia, C. et al. J. Mol. Biol., 196:901 (1987)). Each VH and VL is composed of three CDR's and four FRs, arranged from amino-terminus to carboxy-terminus in the following order: FR1, CDR1, FR2, CDR2, FR3, CDR3, FR4.

An antibody can also include a constant region as part of a light or heavy chain. Light chains can include a kappa or lambda constant region gene at the COOH-terminus (termed CL). Heavy chains can include, for example, a gamma constant region (IgG1, IgG2, IgG3, IgG4; encoding about 330 amino acids). A gamma constant region can include, e.g., CH1, CH2, and CH3. The term "full-length antibody" refers to a protein that includes one polypeptide that includes VL and CL, and a second polypeptide that includes VH, CH1, CH2, and CH3.

The term "antigen-binding fragment" of an antibody, as used herein, refers to one or more fragments of a full-length antibody that retain the ability to specifically bind to a target. Examples of antigen-binding fragments include, but are not limited to: (i) a Fab fragment, a monovalent fragment consisting of the VL, VH, CL and CH1 domains; (ii) a F(ab')$_2$ fragment, a bivalent fragment comprising two Fab fragments linked by a disulfide bridge at the hinge region; (iii) a Fd fragment consisting of the VH and CH1 domains; (iv) a Fv fragment consisting of the VL and VH domains of a single arm of an antibody, (v) a dAb fragment (Ward et al., Nature 341:544 (1989)), which consists of a VH domain; and (vi) an isolated complementarity determining region (CDR). Furthermore, although the two domains of the Fv fragment, VL and VH, are coded for by separate genes, they can be joined, using recombinant methods, by a synthetic linker that enables them to be made as a single protein chain in which the VL and VH regions pair to form monovalent molecules (known as single chain Fv (scFv); see e.g., Bird et al., Science 242:423 (1988); and Huston et al., Proc. Natl. Acad. Sci. USA, 85:5879 (1988)). Such single chain antibodies are also encompassed within the term "antigen-binding fragment."

Polysaccharide Binding Moieties

In certain embodiments, the binding moiety is a polysaccharide, linked, for example, using any of a variety of chemistries, by a single bond, e.g., a covalent bond, at one of the two ends, to a functional group on the magnetic particle. The polysaccharides can be synthetic or natural. Mono-, di-, tri- and polysaccharides can be used as the binding moiety. These include, e.g., glycosides, N-glycosylamines, O-acyl derivatives, O-methyl derivatives, osazones, sugar alcohols, sugar acids, sugar phosphates when used with appropriate attachment chemistry to the magnetic particle.

A method of accomplishing linking is to couple avidin to a magnetic particle and react the avidin-magnetic particle with commercially available biotinylated polysaccharides, to yield polysaccharide-magnetic particle conjugates. For example, sialyl Lewis based polysaccharides are commercially available as biotinylated reagents and will react with avidin-CLIO (see Syntesome, Gesellschaft fur medizinische Biochemie mbH.). The sialyl Lewis×tetrasaccharide ($Sle^x$) is recognized by proteins known as Selectins, which are present on the surfaces of leukocytes and function as part of the inflammatory cascade for the recruitment of leukocytes.

Still other targeting moieties include a non-proteinaceous element, e.g., a glycosyl modification (such as a Lewis antigen) or another non-proteinaceous organic molecule.

Assays

Aggregation-Based Assays

In some embodiments, the magnetic particles described herein may be caused to aggregate, e.g., in the presence of a multivalent analyte, a multimeric form of analyte, an antibody, a nucleic acid molecule, or other binding molecule or entity. The nature and extent of aggregation depends on several variables, including the binding moieties present on the magnetic particles, the binding molecule or entity used, the size of the magnetic particle, and assay buffer conditions. Aggregation alters the microscopic magnetic environment of the water protons in the solvent, resulting in a change, e.g., a decrease (e.g., in the case of smaller magnetic particles) or an increase (e.g., in the case of larger magnetic particles) in the spin-spin relaxation time (T2) of adjacent water protons in an aqueous solution (or protons in a non-aqueous solvent). In some instances, conditions are chosen to maximize the change in T2 (or other magnetic relaxation rate, e.g., T1, $T1_{1rho}$, $T2_{rho}$, or T2*, T1/T2 or T1-T2 hybrid) upon addition of analyte to a sample containing magnetic particles. The larger the change in T2 or other magnetic relaxation rate upon addition of analyte, the less precision is required in the measurement of the magnetic relaxation rate in order to be able to detect the presence, or in some instances, the concentration, of the analyte. In some embodiments requiring only a binary readout—e.g., determining the presence or absence of an analyte, e.g., as when detecting fungal pathogens—it may be desirable to detect the T2* relaxation rate. In other embodiments, more than one relaxation rate is determined for a given sample.

The $T_2$ measurement is a single measure of all spins in the ensemble, lasting typically 4-10 seconds, which allows the solvent to travel hundreds of microns, a long distance relative to the microscopic non-uniformities in the sample. Each solvent molecule samples a volume in the sample and the $T_2$ signal is an aggregate of all (nuclear spins on) solvent molecules in the sample; in other words, the $T_2$ measurement is a net measurement of the entire environment experienced by a solvent molecule, and is an average measurement of all microscopic non-uniformities in the sample.

The observed $T_2$ relaxation rate for the solvent atoms in the sample is dominated by the magnetic particles, which possess high magnetic dipole moments. In the absence of magnetic particles, the observed $T_2$ relaxation rates for a sample are typically long (e.g., $T_2$ (water)=~2000 ms; $T_2$ (blood)=~1500 ms). As particle concentration increases, the microscopic non-uniformities in the sample increase and the diffusion of solvent through these microscopic non-uniformities leads to an increase in spin decoherence and a decrease in the $T_2$ value. The observed $T_2$ depends upon the particle concentration in a non-linear fashion, and the relaxivity per particle.

Figure 8:
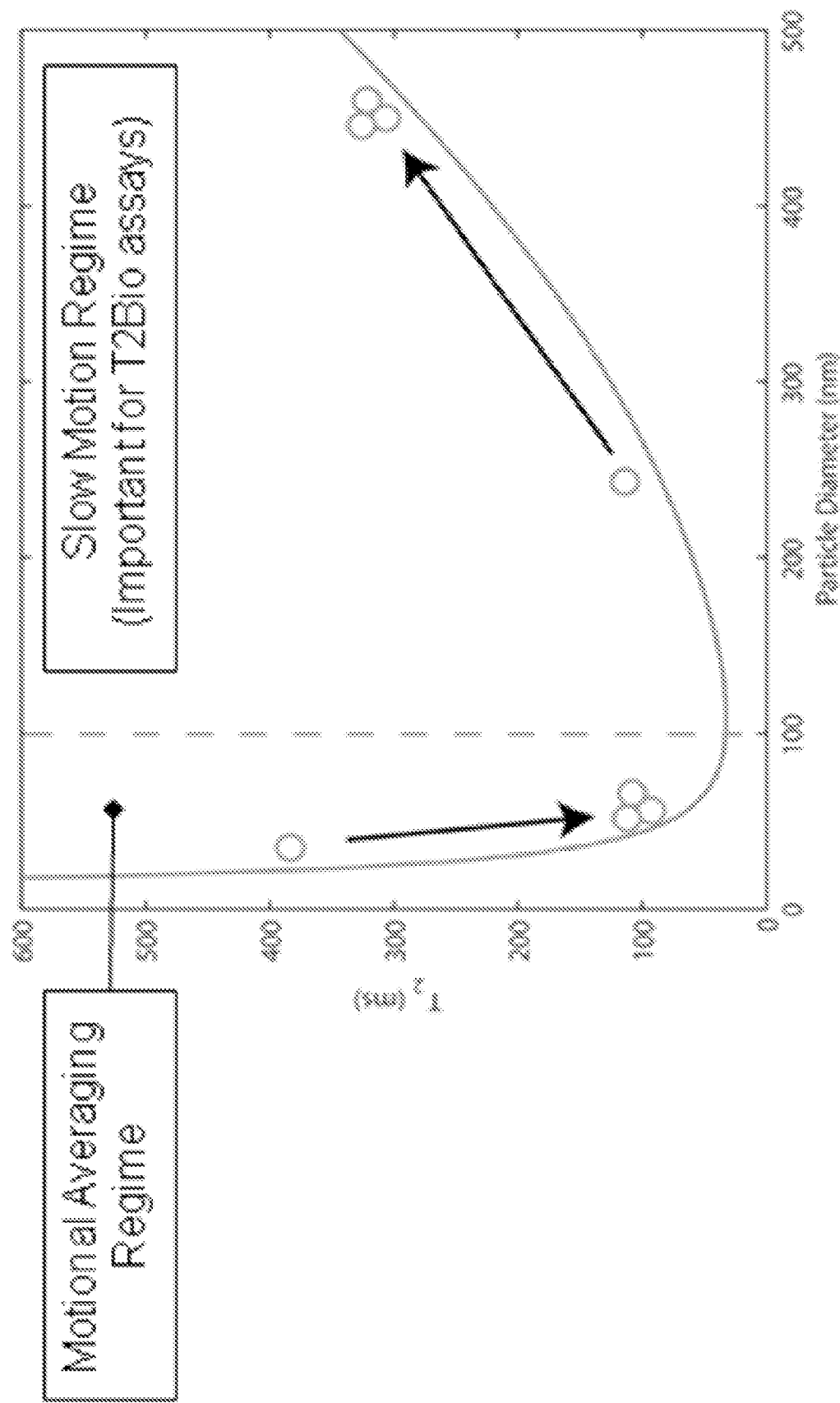
FIG. 8 is a graph depicting the two regimes for particle clustering and $T_2$ effects based on particle size.

In the aggregation assays described herein, the number of magnetic particles may remain constant during the assay. The spatial distribution of the particles changes when the particles cluster. Aggregation changes the average "experience" of a solvent molecule, because particle localization into clusters is promoted rather than more even particle distributions. At a high degree of aggregation, many solvent molecules do not experience microscopic non-uniformities created by magnetic particles and the $T_2$ approaches that of solvent. As the fraction of aggregated magnetic particles increases in a sample, the observed $T_2$ is the average of the non-uniform suspension of aggregated and unaggregated magnetic particles. The assays of the invention are designed to maximize the change in $T_2$ with aggregation to increase the sensitivity of the assay to the presence of analytes, and to differences in analyte concentration. There are two regimes for particle clustering and $T_2$ effects based on particle size (see FIG. 8; the boundary is typically ca. 100 nm diameter particles). For any given assay of a sample, the particle count for 250 nm sized magnetic particles can be ca. $1 \times 10^7$ particles, whereas for 30 nm sized magnetic particles can be ca. $1 \times 10^{13}$. This is because the smaller particles have a lower relaxivity per particle (for the same type of material), resulting in an inherent sensitivity disadvantage. In some embodiments, the magnetic particles are selected such that $T_2$ increases with an increase in the fraction of aggregated particles, while in other embodiments, the magnetic particles are selected such that $T_2$ decreases with an increase in the fraction of aggregated particles.

Various aggregation or disaggregation assays may be used to generate a change in T2 or other magnetic relaxation rate upon introduction of analyte. In some embodiments, addition of analyte results in an increase in magnetic particle aggregation relative to a control experiment in which analyte is absent. Exemplary assays are an agglomerative sandwich immunoassay, in which two populations of magnetic particles bind to different epitopes of an analyte; a hybridization-mediated agglomeration, in which two populations of magnetic particles bind to a first and second portion of an oligonucleotide, e.g., an oligonucleotide from a *Candida* pathogen; or agglomeration caused by a multivalent analyte, i.e., an analyte with multiple similar or identical sites available for binding by the binding moieties coupled to one population of magnetic beads.

In other embodiments, addition of analyte results in a decrease in magnetic particle aggregation relative to a control experiment in which analyte is absent. One exemplary assay is an aggregation inhibition assay, in which magnetic particles are mixed with free analyte, followed by addition of a multivalent binding molecule that causes aggregation of the magnetic particles, wherein the aggregation is inhibited in the presence of free analyte. For example, the magnetic particles may be decorated with moieties that include the analyte molecule, e.g., creatinine, and the multivalent molecule may be, e.g., a bivalent antibody specific for the analyte. When antibody is added in the absence of free analyte (control), it causes the magnetic particles to aggregate because each antibody is capable of binding two magnetic particles. In the presence of free analyte, aggregation is inhibited because some of the antibody molecules bind free analyte instead of magnetic particles.

In an alternative aggregation inhibition assay, a mixture of the free analyte and multivalent binding molecule is added to the magnetic particles. When the multivalent binding molecule is added in the absence of free analyte (control), it causes the magnetic particles to aggregate, whereas in the presence of the mixture of free analyte and multivalent binding molecule, aggregation is inhibited.

In yet another alternative aggregation inhibition assay, the magnetic particles may be decorated with moieties that bind free analyte, e.g., antibodies specific for the analyte, e.g., tacrolimus. The magnetic particles are mixed with free analyte, followed by addition of a multivalent binding molecule that causes aggregation of the magnetic particles, e.g., a multimeric form of the free analyte, e.g., analyte-conjugated BSA, transferrin, dextran, or other suitable aggregation enhancer. When the multivalent binding molecule is added in the absence of free analyte (control), it causes the magnetic particles to aggregate because each multivalent binding molecule is capable of binding multiple magnetic particles. In the presence of free analyte, aggregation is inhibited because some of the binding moieties on the magnetic particles are occupied by free analyte and are therefore unavailable to be bound by the multivalent binding molecules.

Competitive disaggregation assays are also possible. These assays may be performed similarly to the aggregation inhibition assays described herein, but in which free analyte is added only after the magnetic particles have had an opportunity to aggregate in the presence of a multivalent binding molecule, e.g., an antibody or a multimeric form of the free analyte. Such assays require that the initial aggregation of the magnetic particles be partially or fully reversible as a function of the concentrations of the magnetic particles, multivalent binding molecule, and free analyte.

Other variations of the assays described herein that are known in the art may be used in connection with the devices and methods described herein.

Non-Agglomeration-Based Assays

In some embodiments, the magnetic particles described herein may be utilized in an assay that does not feature particle agglomeration. For example, the magnetic particles may be used to capture or concentrate an analyte, e.g., by passing a sample containing the analyte over magnetic particles that include binding moieties specific for the analyte.

The magnetic particles derivatized with a binding moiety can be held in position by an external magnetic field while sample containing the corresponding analyte is circulated past the "trapped" magnetic particles allowing for capture and/or concentrate the analyte of interest. The particles may be pulled to the side or bottom of the assay vessel, or a magnetizable mesh or magnetizable foam with appropriate pore size can be present in the reaction vessel, creating very high local magnetic gradients. An advantage of having the mesh/metal foam in the reaction vessel is that the distance each magnetic particle needs to travel to be "trapped" or "captured" can be very short, improving assay kinetics.

Another non-agglomerative assay is to have surfaces derivatized with ligands complementary to the binding moiety present on the magnetic particle and using a capture/depletion/flow through format. Specific binding of magnetic particles to a surface depletes magnetic particles from the bulk particle suspension used in the assay, thus leading to a change in the T2 value in the reaction volume interrogated by the MR reader. Pre-incubation of the particles with the sample containing analyte can reduce/inhibit the specific binding/capture/depletion of the magnetic particle by the derivatized surface in proportion to the concentration of analyte in the sample. One example of this type of assay approach has been demonstrated using PhyNexus affinity chromatography micropipette tips. The 200 ul PhyTips contain a 20 ul volume of resin bed trapped between 2 frits. The resin bed consists of 200 um cross-linked agarose beads derivatized with avidin, protein A, protein G, etc. A programmable electronic pipettor can aspirate and dispense various volumes at various flow rates. The magnetic particles flow through the pores created by the packed agarose bead resin bed. By repeatedly passing the appropriate magnetic particle suspension over the trapped resin bed to allow for productive interactions to occur between, say, an avidin-derivatized agarose bead resin bed and biotin-derivatized magnetic particles, some of the magnetic particles will specifically bind to and be depleted from the particles suspension. By measuring the T2 of the particle suspension before and after exposure to the agarose resin bed, the amount of particle depletion can be quantified.

Another non-agglomerative assay format is similar to that described above, but uses derivatized magnetizable foam to replace the resin bed. The advantage of the magnetizable foam as the solid phase substrate is that when placed in a magnetic field, the magnetizable foam generates very high local magnetic field gradients over very short distances which can attract the derivatized magnetic particles and bring them in contact with the complementary binding partner on the magnetizable foam and improve the chances of a specific productive interaction. By optimizing the pore size and surface area of the magnetizable foam, the assay kinetics can be vastly improved because the particles need to travel much shorter distances to find a complimentary surface to bind. The particle concentration in the flow-through reaction volume will be reduced inversely proportional to the analyte concentration in the sample and can be quantified using the MR reader. The magnetizable foam can include metal, e.g., nickel, and can directly bind his-tagged moieties, or can be treated with aminosilane and traditional covalent attachment of binding moieties can be covalently linked. This process has been demonstrated using aminosilane-treated nickel metal foam with 400 um pores decorated with anti-creatinine antibodies and shown to specifically bind creatinine-derivatized magnetic particles.

Reaction Kinetics

The reaction of magnetic particles and specific analytes to form aggregates can be used to produce a diagnostic signal in the assays of the invention. In many instances, incubation of the reaction mixture for a period of time is sufficient to form the aggregates. The methods, kits, cartridges, and devices of the invention can be configured to shorten the amount of time needed to capture a particular analyte, or produce aggregates of magnetic particles. While altering the overall concentration of magnetic particles would appear to be a simple and direct approach to increasing aggregation rates, this approach is complicated by (i) nonspecific aggregation that can arise with high magnetic particle concentrations, and (ii) the need to produce an observable signal change (i.e., change in relaxation signal) in response to aggregation in the presence of a low concentration of analyte. Reaction kinetics can be improved, for example, by mechanically induced aggregation, by acoustically induced aggregation, by ultrasonically induced aggregation, by electrostatically induced aggregation, or by trapping (e.g., exposing the nanoparticles to a magnetic field, using a porous membrane, employing a foam, e.g., magnetizable, or centrifugation) the magnetic particles in a portion of the liquid sample.

Trapping

The magnetic particles derivatized with a binding moiety can be held in position by an external magnetic field while sample containing the corresponding analyte is circulated past the "trapped" magnetic particles allowing for capture and/or concentrate the analyte of interest. The capture and/or aggregation can be facilitated by exposure to a magnetic field (i.e., MAA or gMAA) as described herein.

Alternatively, the kinetics of magnetic particle aggregation can be increased by sequestering the magnetic particles in a compartment defined by a porous membrane, such as a tea bag, that permits flow of analytes into and out of the compartment. The increase in the local concentration of magnetic particles can increase the reaction kinetics between magnetic particles and analytes, and the kinetics of aggregation. After mixing the solution and magnetic particles for a predetermined period of time, the magnetic particles are released from the compartment and the sample is measured.

In certain instances, the particles may be pulled to the side or bottom of the assay vessel, e.g., conduit, or a magnetizable mesh or magnetizable foam with appropriate pore size can be present in the reaction vessel, e.g., conduit, creating very high local magnetic gradients. The magnetizable foam generates very high local magnetic field gradients over very short distances which can attract the derivatized magnetic particles and bring them in contact with the complementary binding partner on the magnetizable foam and improve the chances of a specific productive interaction. An advantage of having the mesh/metal foam in the reaction vessel, e.g., conduit, is that the distance each magnetic particle needs to travel to be "trapped" or "captured" can be very short, improving assay kinetics. For example, to a conduit can be added a magnetizable mesh foam having pores, e.g., of 100 to 1000 microns, a liquid sample, and magnetic particles for detecting an analyte in the liquid sample. The conduit is exposed to a magnetic field to magnetize the mesh. The magnetic particles are then attracted to the magnetized mesh and become trapped within the pores of the mesh. The concentration of the magnetic particles within the mesh increases the reaction kinetics between the magnetic particles and the analyte diffusing into and out of the mesh (the reaction tube is optionally agitated to expedite the diffusion of analyte onto the trapped magnetic particles). The mesh is then demagnetized (e.g., by heating the mesh or exposing the mesh to an alternating magnetic field), thereby permitting the release of magnetic particles complexed to analyte. Larger aggregates of magnetic particles can then be formed, completing the reaction.

In an analogous approach, the kinetics of magnetic particle aggregation can be increased by centrifugally pulling the magnetic particles down to the bottom of the reaction vessel, e.g., conduit. The increase in the local concentration of magnetic particles can increase the aggregation kinetics. To facilitate separation by centrifugation, the particles are, desirably, greater than about 30 nm in diameter.

Multiplexing

One method of the system to multiplex includes employing single or multiple NMF regions within the same straw having derivatized magnetic nanoparticles pre-loaded into the unique foam regions, whereby an external small magnet holds the particles within the specific NMF region. Thus, for a given NMF region there are nanoparticles with binding moieties specific for a single analyte. The sample suspected of having one than one analyte is exposed to all of the NMF regions within this multiple NMF system. Analytes are bound to the specific binding moieties on the nanoparticles held in the specific NMF regions. The NMF region can optionally be exposed to magnetization/demagnetization cycles to enhance cluster formation. Once the clusters are formed, fluid flow through the conduit can be conducted and the nanoparticles are released serially to the detector for the determination of presence/absence of the nanoparticle-analyte clusters.

Alternatively, single or multiple NMF regions can be derivatized with an antibody or analyte of interest. The derivatized particles having binding moieties are pre-loaded into the specific NMF region and held in that region with an external small magnet. The sample is allowed to flow through the conduit and enters NMF regions and specific sample analytes compete with analytes that are attached to the NMF for binding sites (binding moiety) on the nanoparticle. Optionally, magnetization/demagnetization cycling occurs to enhance binding and clustering. The flow through the conduit is then conducted and the nanoparticles are released to the detector module for determination of presence/absence of analyte molecule.

Alternatively, universal particles may be designed for example with universal binding moieties, i.e anti-species Ig antibodies, streptavidin, or with an oligonucleotide capable of binding to a conserved sequence. Employment of these universal particles in the conduit based system allows for more than one analyte as follows: i) the NMF is derivatized with a binding moiety specific for a particular or unique analyte, ii) the sample suspected of having the analyte is passed through the NMF and the analyte binds to the binding moiety on the NMF, iii) a separate analyte binding agent (one that binds the analyte at a separate location than the binding moiety attached to the NMF) is exposed to the NMF-binding moiety-analyte, iv) after binding of the second agent, the binding complex (NMF-binding moiety-analyte-second binding agent) is formed, v) the universal particle (designed to specifically bind to the second binding agent) is allowed to bind to the already formed complex, and vi) the nanoparticle is then removed by denaturation or competition and then the nanoparticle is detected by the detector. One could envision more than one NMF regions with a conduit for binding, forming complexes, and detecting nanoparticles in this way. Specifically, an antibody specific for the analyte could be attached to the NMF, the second binding agent could be an non-human species immunoglobin, and the nanoparticle could be derivatized with an antibody specific to the selected species antibody. Alternatively, a specific oligonucleotide could be attached to the NMF, the target analyte anneals to the attached oligo nucleotide, and a universal oligonucleotide sequence is attached to the nanoparticle. Optional wash steps may occur.

Alternatively, in a competitive format, i) an analyte is attached to NMF, ii) an antibody specific to the bound analyte is also derivatized with an oligonucleotide (i.e. an oligonucleotide is attached to the non-binding portion of the antibody), iii) a nanoparticle with a specific sequence to the oligonucleotide is allowed to form a complex (NMF-analyte-antibody/oligonucleotide-universal oligonucleotide nanoparticle). Heat detaturation of the complex would allow for detection of the liberated nanoparticle. Optional wash steps may occur.

Medical Conditions

Embodiments of the invention may be used in the detection or monitoring of one or more analytes in the diagnosis, management, and/or treatment of any of a wide range of medical conditions. Various categories of medical conditions include, for example, disorders of pain; of alterations in body temperature (e.g., fever); of nervous system dysfunction (e.g., syncope, myalgias, movement disorders, numbness, sensory loss, delirium, dementia, memory loss, or sleep disorders); of the eyes, ears, nose, and throat; of circulatory and/or respiratory functions (e.g., dyspnea, pulmonary edema, cough, hemoptysis, hypertension, myocardial infarctions, hypoxia, cyanosis, cardiovascular collapse, congestive heart failure, edema, or shock); of gastrointestinal function (e.g., dysphagia, diarrhea, constipation, GI bleeding, jaundice, ascites, indigestion, nausea, vomiting); of renal and urinary tract function (e.g., acidosis, alkalosis, fluid and electrolyte imbalances, azotemia, or urinary abnormalities); of sexual function and reproduction (e.g., erectile dysfunction, menstrual disturbances, hirsutism, virilization, infertility, pregnancy associated disorders and standard measurements); of the skin (e.g., eczema, psoriasis, acne, rosacea, cutaneous infection, immunological skin diseases, or photosensitivity); of the blood (e.g., hematology); of genes (e.g., genetic disorders); of drug response (e.g., adverse drug responses); and of nutrition (e.g., obesity, eating disorders, or nutritional assessment). Other medical fields with which embodiments of the invention find utility include oncology (e.g., neoplasms, malignancies, angiogenesis, paraneoplasic syndromes, or oncologic emergencies); hematology (e.g., anemia, hemoglobinopathies, megaloblastic anemias, hemolytic anemias, aplastic anemia, myelodysplasia, bone marrow failure, polycythemia vera, myloproliferative diseases, acute myeloid leukemia, chronic myeloid leukemia, lymphoid malignancies, plasma cell disorders, transfusion biology, or transplants); hemostasis (e.g., disorders of coagulation and thrombosis, or disorders of the platelet and vessel wall); and infectious diseases (e.g., sepsis, septic shock, fever of unknown origin, endocarditis, bites, burns, osteomyelitis, abscesses, food poisoning, pelvic inflammatory disease, bacterial (e.g., gram positive, gram negative, miscellaneous (nocardia, actimoyces, mixed), mycobacterial, spirochetal, rickettsia, or mycoplasma); chlamydia; viral (DNA, RNA), fungal and algal infections; protozoal and helminthic infections; endocrine diseases; nutritional diseases; and metabolic diseases.

Other medical conditions and/or fields with which embodiments of the invention find utility include those mentioned in Harrison's Principles of Internal Medicine, Kasper et al., ISBN 0071402357, McGraw-Hill Professional, 16$^{th}$ edition (2004), as well as those mentioned in Robbins Basic Pathology, Kumar, Cotran, and Robbins, eds., ISBN 1416025340, Elsevier, 7$^{th}$ edition (2005).

Medical tests (e.g., blood tests, urine tests, and/or other human or animal tissue tests) that may be performed using various embodiments of the invention described herein include, for example, general chemistry tests (e.g., analytes include albumin, blood urea nitrogen, calcium, creatinine, magnesium, phosphorus, total protein, and/or uric acid); electrolyte tests (e.g., analytes include sodium, potassium, chloride, and/or carbon dioxide); diabetes tests (e.g., analytes include glucose, hemoglobin A1C, and/or microalbumin); lipids tests (e.g., analytes include apolipoprotein A1, apolipoprotein B, cholesterol, triglyceride, low density lipoprotein cholesteral, and/or high density lipoprotein cholesterol); nutritional assessment (e.g., analytes include albumin, prealbumin, transferrin, retinol binding protein, alpha1-acid glycoprotein, and/or ferritin); hepatic tests (e.g., analytes include alanine transaminase, albumin, alkaline phosphatase, aspartate transaminase, direct bilirubin, gamma glutamyl transaminase, lactate dehydrogenase, immunoglobulin A, immunoglobulin G, immunoglobulin M, prealbumin, total bilirubin, and/or total protein); cardiac tests (e.g., analytes include apolipoprotein A1, apolipoprotein B, cardiac troponin-1, creatine kinase, creatine kinase MB isoenzyme, high sensitivity CRP, mass creatine kinase MB isoenzyme myoglobin, and/or N-terminal pro-brain natriuretic peptide); tests for anemia (e.g., analytes include ferritin, folate, homocysteine, haptoglobin, iron, soluble transferrin receptor, total iron binding capacity, transferrin, and/or vitamin B12); pancreatic tests (e.g., analytes include amylase and/or lipase); nephropathies (e.g., analytes include albumin, alpha1-microglobulin, alpha2-macroglobulin, beta2-microglobulin, cystatin C, retinol binding protein, and/or transferrin); bone tests (e.g., analytes include alkaline phosphatase, calcium, and/or phosphorous); cancer marker monitoring (e.g., analytes include total PSA); thyroid tests (e.g., analytes include free thyroxine, free triiodothyronine, thyroxine, thyroid stimulating hormone, and/or triiodothyronine); fertility tests (e.g., analytes include beta-human chorionic gonadotropin); therapeutic drug monitoring (e.g., analytes include carbamazepine, digoxin, digitoxin, gentamicin, lidocaine, lithium, N-acetyl procainamide, phenobarbital, phenyloin, procainamide, theophylline, tobramycin, valproic acid, and/or vancomycin); immunosuppressive drugs (e.g., analytes include cyclosporine A, sirolimus, and/or tacrolimus); tests for complement activity and/or autoimmune disease (e.g., analytes include C3 complement, C4 complement, C1 inhibitor, C-reactive protein, and/or rheumatoid factor); polyclonal/monoclonal gammopathies (e.g., analytes include immunoglobulin A, immunoglobulin G, immunoglobulin M, 1 g light chains types kappa and/or lambda, immunoglobulin G subclasses 1, 2, 3, and/or 4); tests for infectious disease (e.g., analytes include antistreptolysin O); tests for inflammatory disorders (e.g., analytes include alpha1-acid glycoprotein, alpha1-antitrypsin, ceruloplasmin, C-reactive protein, and/or haptoglobin); allergy testing (e.g., analytes include immunoglobulin E); urine protein tests (e.g., analytes include alpha1-microglobulin, immunoglobulin G, 1 g light chains type kappa and/or lambda, microalbumin, and/or urinary/cerebrospinal fluid protein); tests for protein—CSF (e.g., analytes include immunoglobulin G and/or urinary/cerebrospinal fluid protein); toxicology tests (e.g., analytes include serum acetaminophen, serum barbiturates, serum benzodiazepines, serum salicylate, serum tricyclic antidepressants, and/or urine ethyl alcohol); and/or tests for drugs of abuse (e.g., analytes include amphetamine, cocaine, barbiturates, benzodiazepines, ecstasy, methadone, opiate, phencyclidine, tetrahydrocannabinoids, propoxyphene, and/or methaqualone). Specific cancer markers that can be detected using the methods, devices, cartridges, and kits of the invention include, without limitation, 17-beta-hydroxysteroid dehydrogenase type 1, Abl interactor 2, Actin-related protein 2/3 complex subunit 1A, Albumin, Aldolase A, Alkaline phosphatase, placental type, Alpha 1 antitrypsin, Alpha-1-acid glycoprotein 1, Alpha-2-HS-glycoprotein, Alpha lactalbumin, Alpha-2-macroglobulin, Alpha-fetoprotein (AFP), Angiogenin ribonuclease RNase A family 5, Angiopoietin 1, Angiopoietin 2, Antigen identified by monoclonal antibody Ki-67, Antileukoproteinase 1 (SLPI), Apolipoprotein A1, ATP7B, β2-microglobulin, B-cell CLL/lymphoma 2, BCL2-associated X protein, BRCA1, BRCA2, BrMS1, Butyrate-induced transcript 1, CA15.3/CA27-29, Cancer antigen 125, Cancer antigen 15.3, Cancer antigen 19.9, Cancer antigen 602, Cancer antigen 72-4/TAG-72, Cancer associated galactotransferase antigen, Cancer associated serum antigen (CASA), Carcinoembryonic antigen (CEA), Catenin beta 1, Cathepsin D, Cathepsin member 8, CC chemokine 4 (HCC-4), CCL21 (small inducible cytokine A21), CCL5, CD15, CD24, CD34, CD44, Cell division protein kinase 5, ceruloplasmin, Cervical cancer 1 protooncogene protein p40, c-Ets1, Chaparonin containing TCP1, subunit 3, Chemokine (c-c motif) ligan 4 small inducible cytokine A4 (CCL4, MIP-1-beta), Chemokine ligand 5, Chitinase-3 like protein 1 (YKL-40), Chloride intracellular channel 4 (CLIC4), Choriogonadotropin beta chain, Claudin-3, Claudin-4, clusterin, Coagulation factor II (prothrombin), Coagulation factor III, Coagulation factor XIII a chain, Coagulation factor XIII b chain, Collagen I c-terminal peptide, Colony stimulating factor 2, Colony stimulating factor 3, Complement component 3, c-reactive protein, Creatinine kinase brain (CKB), CTD small phosphatase-like, CyclinD1, Cyclin dependent kinase 6 (CDK 6), Cyclin-dependent kinase inhibitor 1 (p21), Cyclooxygenase-1, Cytochrome c oxidase Va, Cytochrome c-1, Desmin, Dystroglycan 1, Endoglin, Endothelin 1, Epidermal growth factor receptor (EGFR), Epidermal growth factor (EGF), Erythropoietin, E-selectin, EST translocation variant 4 (EST 4), Extracellular matrix metalloproteinase inducer (EMMPRIN), Ferritin H, Ferritin L, Fibroblast growth factor 2, fibronectin, Fit-3 ligand, Fluorodeoxyglucose-PET (FDG-PET) with CA125, Fms-related tyrosine kinase 1 (VEGFR-1), GADD45A, Geminin, Glyphosate N-acetyltransferase, Granulin-epithelin precursor (GEP), Growth differentiation factor 15, Haptoglobin 1, Haptoglobulin-a-subunit, HE4 (human epidiymis protein), Her2, HER2-neu, hK10, hK11, hKl3, hk6, hk7, hK8, HLA class II Doβ, hLMH1, hLMH2, HNF-1β, Human chorionic gonadotropin-β subunit, Human chorionic gonadotrpin (hCG), IGFBP-2, IL-2R alpha (soluble interleukin 2 receptor alpha), Immunoglobulins, Immunosuppressive acidic protein (IAP), Indoleamine 2,3-dioxygenase, Insulin-like growth factor binding protein 1, Insulin-like growth factor binding protein 2, Insulin-like growth factor binding protein 3, Integrin α-V, Integrin αvβ6, Intercellular adhesion molecule, Interfereon alpha 1, Interleukin 1 alpha, Interleukin 1 beta, Interleukin 10, Interleukin 12A, Interleukin 16, Inter-α-trypsin inhibitor fragment, Kallikrein 8, Keratin, Keratin 18, Keratin, type I cytoskeletal 19 (cytokeratin 19), Kit ligand, KRAS, Lactotransferrin, Laminin-β3, Leptil-selectin, Luteinizing hormone releasing hormone receptor, Mac-2 binding protein 90 k, Macrophage colony stimulating factor, Macrophage migration inhibitory factor, Mammary serum antigen, Mammoglobin B, M-CAM, MIR21, Mesothelin, MMP3, Mucin-type glycoprotein antigen, Myosin X, Nerve growth factor beta, Netrin-1, Neuroendocrine secretory protein-55, Neutrophil defensin 1, Neutrophil defensin 3, Nm23-H1, Nonmetallic cells protein 2, Non-metastatic cells 1 protein (NM23A), O-acyltransferase domain containing 2, OVX1, OX40, P53, Paraoxonase 2, Pcaf, p-glycoprotein, Phopshribosylaminoimidazole carboxylase, Platelet derived growth factor receptor alpha, Platelet derived growth factor receptor beta, Platelet endothelial cell adhesion molecule (PECAM-1), Platelet factor 4, Pregnancy associated plasma protein-A, Pregnancy zone protein, Procol-lys 1,2 oxoglute 5-digixyg 3, Procol-lys 1,2 oxoglute 5-digoxyg 1, Progesterone receptor (PR), Prolactin, Prostate secretory protein PSP94, Prostate specific antigen (PSA), Prostatin, Protein kinase C binding protein 1, p-selectin, Pyrroline-5-carboxylate reductase 1, Regulator of G protein signaling 12, Reticulocalbin, S-100 alpha chain, s-adenosylhomocysteine hydrolase, Serum amyloid A protein, Seven transmembrane domain protein, Sex determining factor Y-box-4, Sialyl SSEA-1, Small inducible cytokine A18 (CCL18, MIP-4), Small inducible cytokine A2 (CCL2), Small inducible cytokine A3 (CCL3) (macrophage inflammatory protein 1-alpha, Small inducible cytokine B5 (CXCL5), Somatostatin, Somatotropin growth factor, growth factor, Squamous cell carcinoma antigen 1, Squamous cell carcinoma antigen 2, Steroid hormone receptors, Survivin, Syndecan-1, Synuclein gamma, Tetranectin, Tetraspanin 9, TGF-α, Thymidine phosphorylase (TP), Thyroglobulin (Tg), Tissue inhibitor of metalloproteinase 2, Tissue-specific transplantation antigen P35B, Tissue-type plasminogen activator (tPA), Topoisomerase II, Transferring receptor p90 CD71, Transforming growth factor alpha, Transforming growth factor beta 1, Translocase of outer mitochondrial membrane, T ransthyretin, Transthyretin (realbumin) fragment, Trophoblast glycoprotein, Tropomyosin 1 alpha chain (alpha-tropomysoin), Trypsin, Tubulin β2, Tubulin β3, Tumor necrosis factor (ligand) superfamily member 5 (CD154), Tumor necrosis factor (ligand) superfamily member 6 (Fas ligand), Tumor necrosis factor alpha, Tumor necrosis factor receptor p75/p55, Tumor necrosis factor receptor super family member 6 (fas), Tumor necrosis factor receptor-associate protein 1, Tumor protein p53, Ubiquitin congujating enzyme E2C (Ubiquitin cong enz), Urinary angiostatin (uAS), Vascular endothelial growth factor (VEGF), Vascular smooth muscle growth-promoting factor (VSGPIF-Spondin), VEGF (165) b, V-erb-b2, Vitamin D binding protein, Vitamin K dependent protein C, Vitronectin, Von Willebrand factor, Wilms tumor 1 (WT-1), WW domain binding protein 11, X box binding protein-1, and YKL-40. See Polanski et al., Biomarker Insights, 1:1 (2006); Chemeva et al., Biotechnol. & Biotechnol. EQ. 21/2007/2:145 (2007); Alaoui-Jamali et al., J. Zhejiang Science B 7:411 (2006); Basil et al., Cancer Res. 66:2953 (2006); Suh et al., Expert Rev. Mol. Diagn. 10:1069 (2010); and Diamandis, E. P., Molecular and Cellular Proteomics 3:367 (2004).

Other analytes which can be detected using the devices, systems, and methods of the invention include those mentioned in the Tietz Textbook of Clinical Chemistry and Molecular Diagnostics, Burtis, Ashwood, and Bruns, ISBN 0721601898, Elsevier, 4$^{th}$ edition (2006).

The methods, kits, cartridges, and systems of the invention can be configured to detect a predetermined combination panel of analytes that may be used to understand the medical condition of the subject. For example, a combination panel may include detection of pathogens, therapeutic agents used to treat the suspected pathogen/s, and a potential biomarker to monitor the therapeutic pharmacologic progress (efficacy or pharmacokinetic), or monitoring the presence of the pathogen or pathogen by-products. Further, one could envision a disease treatment panel configured for use to detect a disease or a disease biomarker, the level or concentration of a therapeutic drug for use in treating the suspected disease, a potential biomarker to monitor the therapeutic pharmacologic progress (efficacy or pharmacokinetic), and general chemistry biomarker or other physiological marker of the disease or effect of treatment. In this way, panels of analyte detection can be used to inform and lead to appropriate medical decision making.

For example, the systems and methods of the invention can be used to monitor immuno-compromised subjects following allogenic transplantation. In transplant subjects that receive solid organ, bone marrow, hematopoietic stem cell, or other allogeneic donations, there is a need to monitor the immune status, organ function, and if necessary, rapidly and accurately identify opportunistic infections. Tacrolimus (also FK-506, Prograf, or Fujimycin) is an immunosuppressive drug whose main use is after allogeneic organ transplant to reduce the activity of the subject's immune system and so lower the risk of organ rejection. It reduces interleukin-2 (IL-2) production by T-cells. It is also used in a topical preparation in the treatment of severe atopic dermatitis (eczema), severe refractory uveitis after bone marrow transplants, and the skin condition vitiligo. It is a 23-membered macrolide lactone discovered in 1984 from the fermentation broth of a Japanese soil sample that contained the bacteria *Streptomyces tsukubaensis*. It has similar immunosuppressive properties to cyclosporin, but is much more potent in equal volumes. Immunosuppression with tacrolimus was associated with a significantly lower rate of acute rejection compared with cyclosporin-based immunosuppression (30.7% vs. 46.4%) in one study. Long term outcome has not been improved to the same extent. Tacrolimus is normally prescribed as part of a post-transplant cocktail including steroids, mycophenolate and IL-2 receptor inhibitors. Dosages are titrated to target blood levels. Side effects can be severe and include infection, cardiac damage, hypertension, blurred vision, liver and kidney problems, seizures, tremors, hyperkalemia, hypomagnesaemia, hyperglycemia, diabetes mellitus, itching, insomnia, and neurological problems such as confusion, loss of appetite, weakness, depression, cramps, and neuropathy. In addition tacrolimus may potentially increase the severity of existing fungal or infectious conditions such as herpes zoster or polyoma viral infections, and certain antibiotics cross-react with tacrolimus.

Measuring serum creatinine is a simple test and it is the most commonly used indicator of renal function. A rise in blood creatinine levels is observed only with marked damage to functioning nephrons. Therefore, this test is not suitable for detecting early stage kidney disease. A better estimation of kidney function is given by the creatinine clearance test. Creatinine clearance can be accurately calculated using serum creatinine concentration and some or all of the following variables: sex, age, weight, and race as suggested by the American Diabetes Association without a 24 hour urine collection. Some laboratories will calculate the creatinine clearance if written on the pathology request form; and, the necessary age, sex, and weight are included in the subject information.

There is a need to monitor creatinine and tacrolimus levels from the same blood sample from a subject as the monitoring of the drug concentration and the renal function can assist and guide the physician to optimal therapy post-transplantation. Optimizing therapy is a tight balance of preventing rejection but also to ensure immune function to fight opportunistic infections and overall results in enhanced subject compliance to the immunosuppressive therapy. In large part, transplant recipients succumb to transplant rejection, graft versus host disease, or opportunistic infections. In the first two, immunosuppressive agents can ablate or inhibit the reactions. However, if the subject has an underlying infection, then clinical management is challenging. For a specific example, a heart, lung transplant subject presenting with fever of unknown origin enters a health care facility. The subject is started on broad spectrum antibiotics until the culture results are known. If the condition worsens, and the culture reveals a specific infection, for example *candida*, a specific antifungal, fluconazole, can be administered to the known subject. However, this antifungal may alter the levels of the immunosuppressive agent given to almost all allogenic transplant recipients, tacrolimus. Upon testing for both tacrolimus and creatinine levels, the physician halts the tacrolimus, believing that the fluconazole will defeat the infection, and in a rapid manner. Under this regimen, the subject may worsen if the *candida* species is resistant to fluconazole, and the subject is then started on an appropriate anti-fungal agent. However, since the tacrolimus may be halted, the immunosuppressive therapy is unmanaged and the subject may become unresponsive to any additional therapy and death may ensue. Thus, if there was a test to simultaneously monitor creatinine (kidney function), tacrolimus blood levels, and accurate identification of opportunistic infections, the above subject may have been saved.

The systems and methods of the invention can include a multiplexed, no sample preparation, single detection method, automated system to determine the drug level, the toxicity or adverse effect determinant, and the pathogen identification having a critical role in the immunocompromised subject setting. For example, a cartridge having portals or wells containing 1) magnetic particles having creatinine specific antibodies decorated on their surface, 2) magnetic particles having tacrolimus specific antibodies on their surface, and 3) magnetic particles having specific nucleic acid probes to identify pathogen species could be employed to rapidly determine and provide clinical management values for a given transplant subject. Opportunistic infections that can be monitored in such subjects, and any other patient populations at risk of infection, include, without limitation, fungal; *candida* (resistant and non-resistant strains); gram negative bacterial infections (e.g., *E. coli, stenotrophomonas maltophilia, Klebsiella pneumonia/oxytoca*, or *Pseudomonas aeruginosa*); and gram positive bacterial infections (e.g., *Staphylococcus* species: *S. aureus, S. pneumonia, E. faecalis*, and *E. faecium*). Other opportunistic infections that can be monitored include coaglulase negative *staphylococcus, Corynebacterium* spp., *Fusobacterium* spp., and *Morganella morganii*, and viral organisms, such as CMV, BKV, EBC, HHV-6, HIV, HCV, HBV, and HAV.

The systems and methods of the invention can also be used to monitor and diagnose cancer patients as part of a multiplexed diagnostic test. One specific form of cancer, colorectal cancer, has demonstrated positive promise for personalized medical treatment for a specific solid tumor. Pharmacogenetic markers can be used to optimize treatment of colorectal and other cancers. Significant individual genetic variation exists in drug metabolism of 5FU, capecitabine, irinotecan, and oxaliplatin that influences both the toxicity and efficacy of these agents. Examples of genetic markers include UGT1A1*28 leads to reduced conjugation of SN-38, the active metabolite of irinotecan, resulting in an increased rate of adverse effects, especially neutropenia. To a lesser extent, increased 5-FU toxicity is predicted by DPYD*2A. A variable number of tandem repeats polymorphism in the thymidylate synthase enhancer region, in combination with a single nucleotide polymorphism C>G, may predict poorer response to 5-FU. Efficacy of oxaliplatin is influenced by polymorphisms in components of DNA repair systems, such as ERCC1 and XRCC1. Polymorphic changes in the endothelial growth factor receptor probably predict cetuximab efficacy. Furthermore, the antibody-depended cell-mediated cytotoxic effect of cetuximab may be reduced by polymorphisms in the immunoglobin G fragment C receptors. Polymorphic changes in the VEGF gene and the hypoxia inducible factor 1alpha gene are also believed to play a role in the variability of therapy outcome. Thus, identification of such polymorphisms in subjects can be used to assist physicians with treatment decisions. For example, PCR-based genetics tests have been developed to assist physicians with therapeutic treatment decisions for subjects with non-small cell lung cancer (NSCLC), colorectal cancer (CRC) and gastric cancer. Expression of ERCC1, TS, EGFR, RRM1, VEGFR2, HER2, and detection of mutations in KRAS, EGFR, and BRAF are available for physicians to order to identify the optimal therapeutic option. However, these PCR tests are not available on site, and thus the sample must be delivered to the off-site laboratory. These solid tumors are often biopsied and FFPE (Formalin-Fixed, Paraffin-Embedded (tissue)) samples are prepared. The systems and methods of the invention can be used without the 5-7 day turnaround to get the data and information and use of fixed samples required for existing methods. The systems and methods of the invention can provide a single platform to analyze samples, without sample prep, for multiple analyte types, as in cancer for chemotherapeutic drugs, genpotyping, toxicity and efficacy markers can revolutionize the practice of personalized medicine and provide rapid, accurate diagnostic testing.

The systems and methods of the invention can also be used to monitor and diagnose neurological disease, such as dementia (a loss of cognitive ability in a previously-unimpaired person) and other forms of cognitive impairment. Without careful assessment of history, the short-term syndrome of delirium (often lasting days to weeks) can easily be confused with dementia, because they have all symptoms in common, save duration, and the fact that delirium is often associated with over-activity of the sympathetic nervous system. Some mental illnesses, including depression and psychosis, may also produce symptoms that must be differentiated from both delirium and dementia. Routine blood tests are also usually performed to rule out treatable causes. These tests include vitamin B12, folic acid, thyroid-stimulating hormone (TSH), C-reactive protein, full blood count, electrolytes, calcium, renal function, and liver enzymes. Abnormalities may suggest vitamin deficiency, infection or other problems that commonly cause confusion or disorientation in the elderly. The problem is complicated by the fact that these cause confusion more often in persons who have early dementia, so that "reversal" of such problems may ultimately only be temporary. Testing for alcohol and other known dementia-inducing drugs may be indicated. Acetylcholinesterase inhibitors-Tacrine (Cognex), donepezil (Aricept), galantamine (Razadyne), and rivastigmine (Exelon) are approved by the United States Food and Drug Administration (FDA) for treatment of dementia induced by Alzheimer disease. They may be useful for other similar diseases causing dementia such as Parkinsons or vascular dementia. N-methyl-D-aspartate blockers include memantine (Namenda), which is a drug representative of this class. It can be used in combination with acetylcholinesterase inhibitors. Amyloid deposit inhibitors include minocycline and clioquinoline, which are antibiotics that may help reduce amyloid deposits in the brains of persons with Alzheimer disease. Depression is frequently associated with dementia and generally worsens the degree of cognitive and behavioral impairment. Antidepressants effectively treat the cognitive and behavioral symptoms of depression in subjects with Alzheimer's disease, but evidence for their use in other forms of dementia is weak. Many subjects with dementia experience anxiety symptoms. Although benzodiazepines like diazepam (Valium) have been used for treating anxiety in other situations, they are often avoided because they may increase agitation in persons with dementia and are likely to worsen cognitive problems or are too sedating. Buspirone (Buspar) is often initially tried for mild-to-moderate anxiety. There is little evidence for the effectiveness of benzodiazepines in dementia, whereas there is evidence for the effectiveness of antipsychotics (at low doses). Selegiline, a drug used primarily in the treatment of Parkinson's disease, appears to slow the development of dementia. Selegiline is thought to act as an antioxidant, preventing free radical damage. However, it also acts as a stimulant, making it difficult to determine whether the delay in onset of dementia symptoms is due to protection from free radicals or to the general elevation of brain activity from the stimulant effect. Both typical antipsychotics (such as haloperidol) and atypical antipsychotics such as (risperidone) increases the risk of death in dementia-associated psychosis. This means that any use of antipsychotic medication for dementia-associated psychosis is off-label and should only be considered after discussing the risks and benefits of treatment with these drugs, and after other treatment modalities have failed. In the UK around 144,000 dementia sufferers are unnecessarily prescribed antipsychotic drugs, around 2000 subjects die as a result of taking the drugs each year. Dementia can be broadly categorized into two groups: cortical dementias and subcortical dementias. Cortical dementias include: Alzheimer's disease, vascular dementia (also known as multi-infarct dementia), including Binswanger's disease, dementia with Lewy bodies (DLB), alcohol-induced persisting dementia, Korsakoff's syndrome, Wernicke's encephalopathy, frontotemporal lobar degenerations (FTLD), including Pick's disease, frontotemporal dementia (or frontal variant FTLD), semantic dementia (or temporal variant FTLD), progressive non-fluent aphasia, Creutzfeldt-Jakob disease, dementia pugilistica, Moyamoya disease, thebestia (often mistaken for a cancer), posterior cortical atrophy or Benson's syndrome. Subcortical dementias include dementia due to Huntington's disease, dementia due to hypothyroidism, dementia due to Parkinson's disease, dementia due to vitamin B1 deficiency, dementia due to vitamin B12 deficiency, dementia due to folate deficiency, dementia due to syphilis, dementia due to subdural hematoma, dementia due to hypercalcaemia, dementia due to hypoglycemia, AIDS dementia complex, pseudodementia (a major depressive episode with prominent cognitive symptoms), aubstance-induced persisting dementia (related to psychoactive use and formerly absinthism), dementia due to multiple etiologies, fementia due to other general medical conditions (i.e., end stage renal failure, cardiovascular disease etc.), or dementia not otherwise specified (used in cases where no specific criteria is met). Alzheimer's disease is a common form of dementia. There are three companies that a currently offer for research only diagnostic testing of proteins (Satoris), splice variants (Exonhit), or protein expression levels (Diagenic) in subjects suffering from dementia, Lewy Body disease, or mild cognitive impairment. Since dementia is fundamentally associated with many neurodegenerative diseases, the ability to test for these proteins, as biomarkers of the disease, along with drug or drug metabolite levels in a single platform will assist a physician to adjust the dosage, alter a regimen, or generally monitor the progression of the disease. These tests are currently run off-site at locations far from the subject and care giver. Thus, to have the ability to monitor the drug levels and the biomarker in the same detection system, on-site will provide a huge advantage to this debilitating and devastating disease. The method of the invention can be a multiplexed, no sample preparation, single detection method, automated system to determine the drug level, the toxicity or adverse effect determinant, and the potential biomarker of the progression of the disease. For example, a cartridge having portals or wells containing 1) magnetic particles having protein biomarker specific antibodies decorated on their surface, 2) magnetic particles having specific antibodies on their surface, and 3) magnetic particles having nucleic acid specific probes to identify protein expression levels could be employed to rapidly determine and provide clinical management values for a given dementia subject.

The systems and methods of the invention can also be used to monitor and diagnose infectious disease in a multiplexed, automated, no sample preparation system. Examples of pathogens that may be detected using the devices, systems, and methods of the invention include, e.g., *Candida* (resistant and non-resistant strains), e.g., *C. albicans, C. glabrata, C. krusei, C. tropicalis*, and *C. parapsilosis; A. fumigatus; E. coli, Stenotrophomonas maltophilia, Klebsiella pneumonia/oxytoca, P. aeruginosa; Staphylococcus* spp. (e.g., *S. aureus* or *S. pneumonia*); *E. faecalis, E. faecium,* Coaglulase negative *staphylococcus* spp., *Corynebacterium* spp., *Fusobacterium* spp., *Morganella morganii, Pneumocystis jirovecii*, previously known as *pneumocystis carinii, F. hominis, streptococcus pyogenes, Pseudomonas aeruginosa*, Polyomavirus JC polyomavirus (the virus that causes progressive multifocal leukoencephalopathy), *Acinetobacter baumanni, Toxoplasma gondii, Cytomegalovirus, Aspergillus* spp., Kaposi's Sarcoma, cryptosporidium, *Cryptococcus neoformans*, and *Histoplasma capsulatum*, among other bacteria, yeast, fungal, virus, prion, mold, actinomycetes, protozoal, parasitic, protist and helminthic infectious organisms.

The systems and methods of the invention can be used to identify and monitor the pathogenesis of disease in a subject, to select therapeutic interventions, and to monitor the effectiveness of the selected treatment. For example, for a patient having or at risk of a viral infection, the systems and methods of the invention can be used to identify the infectious virus, viral load, and to monitor white cell count and/or biomarkers indicative of the status of the infection. The identity of the virus can be used to select an appropriate therapy. The therapeutic intervention (e.g., a particular antiviral agent) can be monitored as well to correlate the treatment regiman to the circulating concentration of antiviral agent and viral load to ensure that the patient is responding to treatment.

The systems and methods of the invention can be used to monitor a viral infection in a subject, e.g., with a viral panel configured to detect Cytomegalovirus (CMV), Epstein Barr Virus, BK Virus, Hepatitis B virus, Hepatitis C virus, Herpes simplex virus (HSV), HSV1, HSV2, Respiratory syncytial virus (RSV), Influenza; Influenza A, Influenza A subtype H1, Influenza A subtype H3, Influenza B, Human Herpes Virus 6, Human Herpes Virus 8, Human Metapneumovirus (hMPV), Rhinovirus, Parainfluenza 1, Parainfluenza 2, Parainfluenza 3, and Adenovirus. The methods of the invention can be used to monitor a suitable therapy for the subject with a viral infection (e.g., Abacavir, Aciclovir, Acyclovir, Adefovir, Amantadine, Amprenavir, Ampligen, Arbidol, Atazanavir, Atripla, Boceprevir, Cidofovir, Combivir, Darunavir, Delavirdine, Didanosine, Docosanol, Edoxudine, Efavirenz, Emtricitabine, Enfuvirtide, Entecavir, Famciclovir, Fomivirsen, Fosamprenavir, Foscarnet, Fosfonet, Ganciclovir, Ibacitabine, Immunovir, Idoxuridine, Imiquimod, Indinavir, Inosine, Integrase inhibitor, Interferon type III, Interferon type II, Interferon type I, Interferon, Interferon, Lamivudine, Lopinavir, Loviride, Maraviroc, Moroxydine, Methisazone, Nelfinavir, Nevirapine, Nexavir, Nucleoside analogues, Oseltamivir (Tamiflu), Peginterferon alfa-2a, Penciclovir, Peramivir, Pleconaril, Podophyllotoxin, Raltegravir, Reverse transcriptase inhibitor, Ribavirin, Rimantadine, Ritonavir, Pyramidine, Saquinavir, Stavudine, Tea tree oil, Tenofovir, Tenofovir disoproxil, Tipranavir, Trifluridine, Trizivir, Tromantadine, Truvada, Valaciclovir (Valtrex), Valganciclovir, Vicriviroc, Vidarabine, Viramidine, Zalcitabine, Zanamivir (Relenza), or Zidovudine), and to monitor the circulating concentration of the therapeutic administered to the subject.

The systems and methods of the invention can also be used to monitor HIV/AIDS patients. When clinicians suspect acute infection (e.g., in a subject with a report of recent risk behavior in association with symptoms and signs of the acute retroviral syndrome), a test for HIV RNA is usually performed. High levels of HIV RNA detected in plasma through use of sensitive amplification assays (PCR, bDNA, or NASBA), in combination with a negative or indeterminate HIV antibody test, support the diagnosis of acute HIV infection. Low-level positive PCR results (<5000 copies/mL) are often not diagnostic of acute HIV infection and should be repeated to exclude a false-positive result. HIV RNA levels tend to be very high in acute infection; however, a low value may represent any point on the upward or downward slope of the viremia associated with acute infection. Plasma HIV RNA levels during seroconversion do not appear significantly different in subjects who have acute symptoms versus those who are asymptomatic. Viremia occurs approximately 2 weeks prior to the detection of a specific immune response. Subjects diagnosed with acute HIV infection by HIV RNA. Fever and flu- or mono-like symptoms are common in acute HIV infection but are nonspecific rash, mucocutaneous ulcers, or pharyngeal candidiasis and meningismus are more specific and should raise the index of suspicion testing still require antibody testing with confirmatory Western blot 3 to 6 weeks later.

Subjects undergoing HIV testing who are not suspected to be in the acute stages of infection should receive HIV antibody testing according to standard protocol. Antibody test results that are initially negative should be followed up with HIV antibody testing at 3 months to identify HIV infection in individuals who may not yet have seroconverted at the time of initial presentation. Plasma HIV RNA levels indicate the magnitude of HIV replication and its associated rate of CD4+ T cell destruction, while CD4+ T-cell counts indicate the extent of HIV-induced immune damage already suffered. Regular, periodic measurement of plasma HIV RNA levels and CD4+ T-cell counts is necessary to determine the risk of disease progression in an HIV-infected individual and to determine when to initiate or modify antiretroviral treatment regimens.

As rates of disease progression differ among individuals, treatment decisions should be individualized by level of risk indicated by plasma HIV RNA levels and CD4+ T-cell counts. Current WHO guidelines and recommendations for HIV therapy includes a combination of the following drugs, AZT (zidovudine), 3TC (lamivudine), ABC (abacavir), ATV (atazanavir), d4T (stavudine), ddI (didanosine), NVP (nevirapine), EFV (efavirenz), FTC (emtricitabine), LPV (lopinavir), RTV (ritonavir), TDF (tenofovir disoproxil fumarate) in established regimens. Drug therapy for HIV is to commence in subjects who have a CD4 count <350 cell/mm3 irrespective of clinical symptoms. At least one of the four following regimens for antiretroviral naïve subjects is begun: 1) AZT+3TC+EFV, 2) AZT+3TC+NVP, 3) TDF+3TC or FTC+EFV, or 4) TDF+3TC or FTC+NVP. These regimens avoid d4T (stavudine) to limit the disfiguring, unpleasant, and potentially life-threatening toxicities of this drug. Treatment failure is usually determined by viral load, a persistent value of 5,000 copies/ml confirms treatment failure. In cases whereby viral load measurement is not available, immunological criteria (CD4 cell count) can be used to determine therapeutic progress. In cases of treatment failure, a boosted protease inhibitor plus two nucleoside analogs are added to the regimen and is considered second line antiretroviral therapy. ATV plus low dose RTV, or LPV with low dose RTV is also considered second line therapy. Often the goal in treatment failure cases is simpler timed regimens and fixed doses.

For subjects failing the second line treatment regimens should be maintained on a tolerated regimen for the duration. The use of potent combination antiretroviral therapy to suppress HIV replication to below the levels of detection of sensitive plasma HIV RNA assays limits the potential for selection of antiretroviral-resistant HIV variants, the major factor limiting the ability of antiretroviral drugs to inhibit virus replication and delay disease progression. Therefore, maximum achievable suppression of HIV replication should be the goal of therapy. The most effective means to accomplish durable suppression of HIV replication is the simultaneous initiation of combinations of effective anti-HIV drugs with which the subject has not been previously treated and that are not cross-resistant with antiretroviral agents with which the subject has been treated previously. Each of the antiretroviral drugs used in combination therapy regimens should always be used according to optimum schedules and dosages. The available effective antiretroviral drugs are limited in number and mechanism of action, and cross-resistance between specific drugs has been documented. Therefore, any change in antiretroviral therapy increases future therapeutic constraints.

Monitoring HIV/AIDS subjects for viral load, drug levels, CD4 cell counts, and toxicity patterns in a single platform diagnostic method would provide distinct advantages to a subject. The systems and methods of the invention can be used in a multiplexed, no sample preparation, single detection method, automated system to determine the drug level, the toxicity or adverse effect determinants, and the potential biomarker of the progression of the disease. For example, a cartridge having portals or wells containing 1) magnetic particles having CD4 cell specific antibodies decorated on their surface, 2) magnetic particles having toxicity biomarker specific antibodies on their surface, and 3) magnetic particles having nucleic acid specific probes to identify viral load levels could be employed to rapidly determine and provide clinical management values for a given HIV/AIDS subject.

The systems and methods of the invention can also be used to monitor and diagnose immune disease in a subject (e.g., Crohn's disease, ileitis, enteritis, inflammatory bowel disease, irritable bowel syndrome, ulcerative colitis, as well as non-gastrointestinal immune disease). The relatively recent development of genetically engineered agents has the potential to alter the treatment of immune disease radically, and Remicade (also known as Infliximab, an anti-TNF antibody) was introduced as a new therapeutic class with high efficacy, rapid onset of action, prolonged effect, and improved tolerance. However these agents are expensive and at least one-third of the eligible patients fail to show any useful response. Finding a means to predict those who will respond, and to anticipate relapse is, therefore, of obvious importance. T helper-type 1 (Th1) lymphocytes orchestrate much of the inflammation in Crohn's disease mainly via production of TNF-alpha, which appears to play a pivotal role as a pro-inflammatory cytokine. It exerts its effects through its own family of receptors (TNFR1 and TNFR2), the end results of which include apoptosis, c-Jun N-terminal kinase/stress-activated protein kinase (JNK/SAPK) activation and NF-kappaB activation. Activated NF-kappaB enters the nucleus and induces transcription of genes associated with inflammation, host defense and cell survival. The promoter region of the TNF gene lies between nucleotides $-1$ and $-1300$, and encompasses numerous polymorphic sites associated with potential binding sites for various transcription factors. Carriers of the TNF allele 2 (TNF2) (which contains a single base-pair polymorphism at the $-308$ promoter position) produce slightly more TNF-alpha in their intestinal mucosa than non-TNF2 carriers. TNF polymorphisms also appear to influence the nature and frequency of extra-intestinal manifestations of inflammatory bowel disease (IBD). A number of routes of inhibition of TNF are being investigated. Most extensively evaluated is the use of remicade. Several large controlled trials indicate that remicade has a role in treating patients with moderate to severely active Crohn's disease and in fistulating Crohn's disease. Small studies have shown possible associations between poor response to remicade and increasing mucosal levels of activated NF-kappaB, homozygosity for the polymorphism in exon 6 of TNFR2 (genotype Arg196Arg), positivity for perinuclear antineutrophil cytoplasmic antibodies (ANCA), and with the presence of increased numbers of activated lamina propia mononuclear cells producing interferon-gamma and TNF-alpha. Thus, monitoring Crohn's disease patients for TNF-alpha and toxicity patterns in a single platform diagnostic method would have distinct advantages. The method of the invention can be a multiplexed, no sample preparation, single detection method, automated system to determine the drug level, the toxicity or adverse effect determinants, and the potential biomarker of the progression of the disease. For example, a cartridge having portals or wells containing 1) magnetic particles having anti-TNF-alpha specific antibodies decorated on their surface, 2) magnetic particles having toxicity biomarker specific antibodies on their surface, and 3) magnetic particles having specific probes to identify disease markers of progression could be employed to rapidly determine and provide clinical management values for a given Crohn's disease patient.

The systems and methods of the invention can also be used to monitor and diagnose infectious disease and inflammation in a multiplexed, automated, no sample preparation system. Such systems and methods could be used to monitor, for example, bacteremia, sepsis, and/or Systemic Inflammatory Response Syndrome (SIRS). Early diagnosis is clinically important as this type of infection, if left untreated, can lead to organ dysfunction, hypoperfusion, hypotension, refractory (septic) shock/SIRS shock, and/or Multiple Organ Dysfunction Syndrome (MODS). For a typical patient, many bacterial or fungal infections are the result of incubation at the time of admission to a healthcare setting and are termed healthcare-associated infections (HAI), also known as nosocomial, hospital-acquired or hospital-onset infections. Healthcare-associated infections are most commonly caused by viral, bacterial, and fungal pathogens and are commonly transmitted via wounds, invasive devices (catheters, tracheostomy, intubation, surgical drains) or ventilators and are found as urinary tract infections, surgical site infections, or a form of pneumonia. Within hours after admission, a patient's flora begins to acquire characteristics of the surrounding bacterial pool. Most infections that become clinically evident after 48 hours of hospitalization are considered hospital-acquired and the pathogens should be investigated in all febrile patients who are admitted for a nonfebrile illness or those who develop clinical deterioration unexplained by the initial diagnosis. More careful and selective use of antimicrobial agents, such as antibiotics, is also desirable to decrease the selection pressure for the emergence of resistant strains. Infections that occur after the patient is discharged from the hospital can be considered healthcare-associated if the organisms were acquired during the hospital stay. Patient-related risk factors for invasion of colonizing pathogen include severity of illness, underlying immunocompromised state and/or the length of in-patient stay. Risk factors for the development of catheter-associated bloodstream infections in neonates include catheter hub colonization, exit site colonization, catheter insertion after the first week of life, duration of parenteral nutrition, and extremely low birth weight (<1000 g) at the time of catheter insertion. In patients in the PICU risks, for catheter-associated bloodstream infections increase with neutropenia, prolonged catheter dwell time (>7 days), use of percutaneously placed CVL (higher than tunneled or implanted devices), and frequent manipulation of lines. *Candida* infections are increasingly important pathogens in the NICU. Risk factors for the development of candidemia in neonates include gestational age less than 32 weeks, 5-min Apgar scores of less than 5, shock, disseminated intravascular coagulopathy, prior use of intralipids, parenteral nutrition administration, CVL use, H2 blocker administration, intubation, or length of stay longer than 7 days. Risk factors for the development of ventilator-associated pneumonia (VAP) in pediatric patients include reintubation, genetic syndromes, immunodeficiency, and immunosuppression. In neonates, a prior episode of bloodstream infection is a risk factor for the development of VAP. Risk factors for the development of healthcare-associated urinary tract infection in pediatric patients include bladder catheterization, prior antibiotic therapy, and cerebral palsy. Among the categories of bacteria most known to infect immunocompromised patients are MRSA (Methicillin resistant *Staphylococcus aureus*), gram-positive bacteria and *Helicobacter*, which is gram-negative. While there are antibiotic drugs that can treat diseases caused by Gram-positive MRSA, there are currently few effective drugs for *Acinetobacter*. Common pathogens in bloodstream infections are coagulase-negative staphylococci, *Enterococcus*, and *Staphylococcus aureus*. In addition, *Candida albicans* and pathogens for pneumonia such as *Pseudomonas aeruginosa, Staphylococcus aureus, Klebsiella pneumoniae*, and *Haemophilus influenza* account for many infections. Pathogens for urinary tract infections include *Escherichia coli, Candida albicans*, and *Pseudomonnas aeruginosa*. Gram-negative enteric organisms are additionally common in urinary tract infections. Surgical site infections include *Staphylococcus aureus, Pseudomonas aeruginosa*, and coagulase-negative staphylococci. The infectious agent can be selected from, without limitation, pathogens associated with sepsis, such as *Acinetobacter baumannii, Aspergillus fumigatis, Bacteroides fragilis, B. fragilis,* blaSHV, *Burkholderia cepacia, Campylobacter jejuni/coli, Candida guilliermondii, C. albicans, C. glabrata, C. krusei, C. Lusitaniae, C. parapsilosis, C. tropicalis, Clostridium pefringens,* Coagulase negative Staph, *Enterobacter aeraogenes, E. cloacae, Enterobacteriaceae, Enterococcus faecalis, E. faecium, Escherichia coli, Haemophilus influenzae, Kingella Kingae, Klebsiella oxytoca, K. pneumoniae, Listeria monocytogenes,* Mec A gene (MRSA), *Morganella morgana, Neisseria meningitidis, Neisseria* spp. non-meningitidis, *Prevotella buccae, P. intermedia, P. melaminogenica, Propionibacterium acnes, Proteus mirabilis, P. vulgaris, Pseudomonas aeruginosa, Salmonella enterica, Serratia marcescens, Staphylococcus aureus, S. haemolyticus, S. maltophilia, S. saprophyticus, Stenotrophomonas maltophilia, S. maltophilia, Streptococcus agalactie, S. bovis, S. dysgalactie, S. mitis, S. mutans, S. pneumoniae, S. pyogenes,* and *S. sanguinis*; or any other infectious agent described herein. In certain instances, the method and system will be designed to ascertain whether the infectious agent bears a Van A gene or Van B gene characteristic of vancomycin resistance; mecA for methicillin resistance, NDM-1 and ESBL for more general resistance to beta-lactams.

Sepsis or septic shock are serious medical conditions that are characterized by a whole-body inflammatory state (systemic inflammatory response syndrome or SIRS) and the presence of a known or suspected infection. Sepsis is defined as SIRS in the presence of an infection, septic shock is defined as sepsis with refractory arterial hypotension or hypoperfusion abnormalities in spite of adequate fluid resuscitation, and severe sepsis is defined as sepsis with organ dysfunction, hypoperfusion, or hypotension. In addition to symptoms related to the provoking infection, sepsis is characterized by presence of acute inflammation present throughout the entire body, and is, therefore, frequently associated with fever and leukocytosis or low white blood cell count and lower-than-average temperature, and vomiting. It is currently believed that sepsis is the host's immune response to an infection and it is thought that this response causes most of the symptoms of sepsis, resulting in hemodynamic consequences and damage to organs. SIRS is characterized by hemodynamic compromise and resultant metabolic derangement. Outward physical symptoms of this response frequently include a high heart rate (above 90 beats per minute), high respiratory rate (above 20 breaths per minute), elevated WBC count (above 12,000) and elevated or lowered body temperature (under 36° C. (97° F.) or over 38° C. (100° F.)). Sepsis is differentiated from SIRS by the presence of a known pathogen. For example, SIRS and a positive blood culture for a pathogen indicates the presence of sepsis. Without a known infection, it's not possible to classify the above symptoms as sepsis, only SIRS. SIRS causes widespread activation of acute-phase proteins, affecting the complement system and the coagulation pathways, which then cause damage to the vasculature as well as to the organs. Various neuroendocrine counter-regulatory systems are then activated as well, often compounding the problem. Even with immediate and aggressive treatment, this may progress to multiple organ dysfunction syndrome and eventually death. The laboratory component of sepsis diagnosis can include several markers are considered at once and/or measured serially. A number of studies have examined the value of combining currently available markers like GRO-alpha, High mobility group-box 1 protein (HMBG-1), IL-1 receptor, IL-1 receptor antagonist, IL-1b, IL-2, IL-4, IL-6, IL-8, IL-10, IL-12, IL-13, IL-18, macrophage inflammatory protein (MIP-1), macrophage migration inhibitory factor (MIF), osteopontin, RANTES (regulated on activation, normal T-cell expressed and secreted; or CCL5), TNF-α, C-reactive protein (CRP), CD64, and monocyte chemotactic protein 1 (MCP-1). Additionally, the systems and methods can be designed to monitor certain proteins characteristic of sepsis, such as adenosine deaminase binding protein (ABP-26), inducible nitric oxide synthetase (iNOS), lipopolysaccharide binding protein (LBP), and procalcitonin (PCT). Sepsis is usually treated in the intensive care unit with intravenous fluids and antibiotics. If fluid replacement is insufficient to maintain blood pressure, specific vasopressor medications can be used. Mechanical ventilation and dialysis may be needed to support the function of the lungs and kidneys, respectively. To guide therapy, a central venous catheter and an arterial catheter may be placed. Sepsis patients may require preventive measures for deep vein thrombosis, stress ulcers and pressure ulcers, and some patients may benefit from tight control of blood sugar levels with insulin (targeting stress hyperglycemia), low-dose corticosteroids, or activated drotrecogin alfa (recombinant protein C). For an immunocompromised patient, or a patient with a suspected infection that may be experiencing sepsis or SIRS, such methods and systems of the invention provide a diagnostic platform for the rapid identification of one or more pathogens, and whether or not the pathogens are resistant to certain therapies (for the selection of an appropriate antimicrobial therapy). The platform as described allows for the simultaneous determination of the levels of the factors (e.g., GRO-alpha, High mobility group-box 1 protein (HMB G-1), IL-1 receptor, IL-1 receptor antagonist, IL-1b, IL-2, IL-4, IL-6, IL-8, IL-10, IL-12, IL-13, IL-18, macrophage inflammatory protein (MIP-1), macrophage migration inhibitory factor (MIF), osteopontin, RANTES (regulated on activation, normal T-cell expressed and secreted; or CCL5), TNF-α, C-reactive protein (CRP), CD64, and monocyte chemotactic protein 1 (MCP-1)) and/or proteins (e.g., adenosine deaminase binding protein (ABP-26), inducible nitric oxide synthetase (iNOS), lipopolysaccharide binding protein (LBP), and procalcitonin (PCT)) thought to be involved in SIRS, allowing for the optimization for the treatment of sepsis and SIRS. Thus, this platform reduces the empirical protocols and/or use of non-specific/general antimicrobials that may or may not be targeting the specific pathogen and/or the underlying system dysfunction for a given patient. This platform allows for rapid and accurate diagnoses, which can point to effective therapy, providing a key component to a physician's decision making and reducing morbidity and mortality.

To determine whether a patient has sepsis, it is necessary to identify the presence of a pathogen. To most effectively treat a patient, the earliest initiation of appropriate therapy is critical. Antimicrobial and other treatments for sepsis rely on the classification of pathogens at multiple levels, including the identification of an agent as 1) bacterial, viral, fungal, parasitic or otherwise; 2) gram positive, gram negative, yeast, or mold, 3) species, and 4) susceptibility.

Each of these levels of specificity improves the time to initiation of appropriate therapy, and each step further down the track will lead to a narrowing of therapeutic agents to the most specific set. Without absolute susceptibility data, empiric approaches to care rely on the information available about the pathogen (at whichever level) and the pattern of pathogen frequency and susceptibility trends in the hospital of another site of care. Thus, certain categories of pathogens are frequently presumed to be causative until there are more data to refine the pairing of pathogen and therapy. Specifically, these targets fall into the ESKAPE category (which is a series of resistant pathogens) and the SPACE category, which is a set of high virulence pathogens that require isolation of patients.

In addition to identifying these pathogens in multiple sample types (blood, tissue, urine, etc.), another method to distinguish symptomatic patients, for instance, patients with systemic inflammatory syndrome, or SIRS, from septic patients, is to use biomarkers that correlate either individually or via an index, to identify patients with infection. In cases where infections are not detected due to antimicrobial therapy interference with diagnostics, immune system control of the therapy, or otherwise, these biomarkers, which can be multiple types of analytes (cytokines, metabolites, DNA, RNA/gene expression, etc.) will indicate infection and thus sepsis.

To generate the diagnostic information required for both the presence of an infection and some level of species identification, one panel could be: (i) gram positive clusters (e.g., *S. aureus*, and CoNS (coagulase negative staph)); (ii) gram positive chains/pairs (e.g., Strep spp., mitis, *pneumonia* spp., *agalactiae* spp., *pyogenes* spp., *Enterococcus* spp. (*E. faecium, E. fecalis*); (iii) gram negative rods (e.g., *E. coli, Proteus* spp., *Klebsiella* spp., *Serratia* spp., *Acinetobacter* spp., *Stenotrophomonas* spp.); (iv) SPACE (e.g., *Serratia* spp., *Pseudomonas* spp., *Acinetobacter* spp., *Citrobacter* spp., *Enterobacter* spp.); (v) *Pseudomonas* (e.g., *Pseudomonas* spp.); (vi) ESKAPE (*E. faecium, Staphylococcus aureas, Klebsiella* spp., *Acinetobacter* spp., *Pseudomonas* spp., *Enterobacter* spp.); and (vii) Pan-Bacterial (all bacterial species).

This panel should be used in conjunction with a fungal assay for full coverage. The categories represent the information required for an effective intervention with appropriate therapy, given that each site of care will have an empirically derived approach based on a positive response to gram +, gram −, etc. The species identified in each category represent those that would fit under each heading, but are not comprehensive. Further, a pan-bacterial marker is included to cover any species that is not covered by the diagnostic method employed for each category. Further, the combination of results will also give an indication of the species, although not fully, if included as described above. Cross-referencing positives and negatives by category allow a process of elimination approach to identify some of the species, probabilistically.

In addition to pathogen panels, a standalone or companion test could be performed for biomarkers that can indicate sepsis. Examples of these markers are below, and may be used individually or in combination: IL-1β, GRO-alpha, High mobility group-box 1 protein (HMBG-1), IL-1 receptor, IL-1 receptor antagonist, IL-1b, IL-2, IL-4, IL-6, IL-8, IL-10, IL-12, IL-13, IL-18, macrophage inflammatory protein (MIP-1), macrophage migration inhibitory factor (MIF), osteopontin, RANTES (regulated on activation, normal T-cell expressed and secreted; or CCL5), IL-10, GM-CSF, MCP-1, TNF-α, hsCRP, PCT, LFB, and lactate.

The systems and methods of the invention can also be used to monitor and diagnose heart disease in a subject, such as a myocardial infarction. Cardiac markers or cardiac enzymes are proteins that leak out of injured myocardial cells and are used to assess cardiac injury. Cardiac markers include, without limitation, the enzymes SGOT, LDH, the MB subtype of the enzyme creatine kinase, and cardiac troponins (T and I). The cardiac troponins T and I which are released within 4-6 hours of an attack of myocardial infarction (and remain elevated for up to 2 weeks) have nearly complete tissue specificity and are now the preferred markers for assessing myocardial damage. Elevated troponins in the setting of chest pain may accurately predict a high likelihood of a myocardial infarction in the near future. The diagnosis of myocardial infarction is typically based upon subject history, ECG, and cardiac markers. When damage to the heart occurs, levels of cardiac markers rise over time, which is why blood tests for them are taken over a 24-hour period. Because these enzyme levels are not elevated immediately following a heart attack, patients presenting with chest pain are generally treated with the assumption that a myocardial infarction has occurred and then evaluated for a more precise diagnosis. A MI is a medical emergency which requires immediate medical attention. Treatment attempts to salvage as much myocardium as possible and to prevent further complications, thus the phrase "time is muscle". Oxygen, aspirin, and nitroglycerin are usually administered as soon as possible. Thus, in the acute setting, monitoring Troponin I and T, as well as potential other biomarkers of cardiac ischemia, in addition to drug therapy and toxicity patterns in a single platform diagnostic method would have distinct advantages. The systems and methods of the invention can be used to provide a multiplexed, no sample preparation, single detection method, automated system to determine the drug level, the toxicity or adverse effect determinants, and the potential biomarker of the progression of the disease. For example, a cartridge having portals or wells containing 1) magnetic particles having anti-troponin I or troponin T specific antibodies decorated on their surface, 2) magnetic particles having toxicity biomarker specific antibodies on their surface, and 3) magnetic particles having specific probes to identify disease markers of progression could be employed to rapidly determine and provide clinical management values for a given myocardial infarction patient.

Plant Conditions

Embodiments of the invention may be used in the detection or monitoring of one or more analytes in the identification, detection, management, and/or treatment of any of a wide range of plant conditions, including detection or identification of the presence or absence of plant cells, e.g., algae or algae by-products. Various categories of plant conditions include, for example, presence or concentration of plant growth hormone, insecticide, man-made toxin, environmental toxin, insect resistance, insect susceptibility, or a nucleic acid sequence associated therewith.

The assay could be configured to detect for various genes that signify plants that have been genetically modified; for example, detecting the gene that regulates the uptake of glyphosate, i.e., glyphosate-resistant varieties.

Molecular Diagnostic Assays

Embodiments of the invention may be used in conjunction with one or more molecular diagnostic assays, e.g., to detect or monitor one or more analytes in the diagnosis, management, and/or treatment of any of a wide range of medical or plant conditions, or in the detection or monitoring of non-biological samples, e.g., oil. Exemplary molecular diagnostic assays are mutation detection (e.g., SNPs, translocations, large deletions, small deletions, insertions, or substitutions), expression analysis (e.g., up/down), CHP analysis, RNA transcription, or other molecular diagnostic assays known in the art.

Industrial Microbiological Testing

The device and the methods of the invention can be employed in the industrial microbiological testing to ensure process, raw materials, and the production/manufacturing environment are not contamination with microorganisms. For example, food (food plants), beverage, pharmaceuticals, personal care products, environmental processes or general testing, and industrial processes are among the sectors of this particular use. Routine testing for the presence/absence and identification of microorganisms can reduce liability in final product testing, ensures the product meet any product label claims, ensures a safe and stable product, and ensures reliability of product production from more than one manufacturing location. With respect to environmental processes, i.e. testing for the presence or absence of microorganisms in drinking water, waste water, or surface water, these processes requires output information in the form of a screening, i.e. presence or absence and often not identification of a particular species.

The conduit of the invention can be configured for use in the systems and methods of the invention and prepared with at least one whole blood sample from the patient; magnetic particles for detecting each of the analytes to be detected (one or more small molecules; one or more metabolites of the one or more small molecules; metabolic biomarker such as described for the hepatic function panel); and dilution and wash buffers. Liver function tests are done on a patient's serum or plasma sample and clinical biochemistry laboratory blood analysis furnishes crucial data regarding the condition of the patient's liver. A "hepatic function panel" is a blood test wherein low or high levels of one or more enzymes may point to liver diseases or damage. For example, the hepatic function panel can include one or more of the following analyte detection assays: one or more small molecules; one or more metabolites of the one or more small molecules; a biologic, metabolic biomarkers; genotyping, gene expression profiling; and proteomic analysis. A hepatic function panel can include analysis of one or more of the following proteins in a patient or subject biological sample: 1) albumin (the major constituent of the total protein in the liver; while the remnant is called globulin; albumin must be present as 3.9 to 5.0 g/dL, hypoalbuminaemia indicates poor nutrition, lower protein catabolism, cirrhosis or nephrotic syndrome); 2) aspartate transaminase (AST) (also known as serum glutamic oxaloacetic transaminase or aspartate aminotransferase, is an enzyme in liver parenchymal cells and is normally 10 to 34 IU/L; elevated levels are indicative of acute liver damage); 3) alanine transaminase (ALT) (also known as serum glutamic pyruvic transaminase or alanine aminotransferase, is an enzyme is present in hepatocytes at levels between 8 to 37 IU/L; elevated levels are indicative of acute liver damage in viral hepatitis or paracetamol overdose; the ratio of AST to ALT is used to differentiate between the reasons of liver damage); 4) alkaline phosphatase (ALP) (an enzyme that is present in the cells lining the biliary ducts of the liver; the normal range is 44 to 147 IU/L and the level rises in case of infiltrative diseases of the liver, intrahepatic cholestasis or large bile duct obstruction); 5) Gamma glutamyl transpeptidase (GGT) (a more sensitive marker for cholestatic damage than ALP, is very specific to the liver; the standard range is 0 to 51 IU/L; both acute and chronic alcohol toxicity raise GGT; the reason of an isolated elevation in ALP can be detected by GGT); 6) total bilirubin (TBIL) (an increase in the total bilirubin can lead to jaundice and can be attributed to cirrhosis, viral hepatitis, hemolytic anemias, or internal hemorrhage); 7) direct bilirubin; 8) prothrombin time (PTT) (hepatic cell damage and bile flow obstruction can cause changes to blood clotting time); 9) alpha-fetoprotein test (elevated levels indicate hepatitis or cancer); 10) lactate dehydrogenase; and 11) mitochondrial antibodies (if present may indicate chronic active hepatitis, primary biliary cirrhosis, or other autoimmune disorders).

The proteins described above would be analyzed in the hepatic function panel using the systems and methods of the invention.

An additional hepatic function panel may include genotyping of cytochrome P450 enzymes. The cytochrome P450 superfamily (CYP) is a large and diverse group of enzymes. The function of most CYP enzymes is to catalyze the oxidation of organic substances. The substrates of CYP enzymes include metabolic intermediates such as lipids and steroidal hormones, as well as xenobiotic substances such as drugs and other toxic chemicals. CYPs are the major enzymes involved in drug metabolism and bioactivation. Cytochrome P450 genotyping tests are used to determine how well a patient or subject metabolizes a drug. The results of cytochrome P450 tests can be used to divide individuals into four main types: (i) Poor metabolizers—Certain drugs are metabolized more slowly than normal and the medication will have a longer half life and possibly increase the likelihood that it will cause side effects, (ii) Normal metabolizers—Drugs will be metabolized at an average rate and thus is indicative that there is a benefit from treatment and points to fewer side effects than are other individuals who don't metabolize those particular medications as well, (iii) Intermediate metabolizers—Drugs may or may not be metabolized at an average rate. At least one gene involved in drug metabolism is suspected to function abnormally. There then is a predisposition to metabolize certain drugs differently, (iv) Ultra rapid metabolizers—Drugs are metabolized faster and more efficiently than the average. Since the metabolic rate is higher than average, some medications are inactivated sooner or are excreted sooner than normal and the medication may not have the desired efficacy.

Currently, genotyping the genes responsible for these enzymes across a population has been shown that polymorphic differences in these enzymes can lead to variation in efficacy and toxicity of some drugs. Assessing cytochrome P450 status in a patient sample can be accomplished by measuring the enzyme activity of the sample, or determining if a genetic difference occurs in one of the genes of this metabolic system in the genome. Genotyping requires a cell sample representative of the patient or subject's genome and the analysis is aimed at determining genetic differences in these clinically important genes. Possible hepatic metabolic enzymes that may be part of a hepatic function panel include CYP2C19, CYP2D6, CYP2C9, CYP1A2, NAT2 (N-acetyltransferase 2), DPD (Dihydropyrimidine dehydrogenase), UGT1A1 (UDP-glucuronosyltransferase), 5HTT (Serotonin Transporter). The invention features a multiplexed analysis of a single blood sample (e.g., a single blood draw, or any other type of patient sample described herein) from a patient to determine a) liver enzymatic status, as well as b) the genotype of key metabolic enzymes to then be able to design pharmacotherapy regimes for optimal therapeutic care using the systems and methods of the invention. The systems and methods of the invention can include one or more multi-well cartridges prepared with at least one whole blood sample from the patient; magnetic particles for detecting each of the analytes to be detected; analyte antibodies; multivalent binding agents; and/or dilution and wash buffers for use in a multiplexed assay as described above.

Nephrotoxicity

Renal toxicity is a common side effect of use of xenobiotics and early, rapid detection of early stages of nephrotoxicity may assist in medical decision making. Early reports of detection of renal toxicity suggest that increased mRNA expression of certain genes can be monitored. However, others have suggested that markers of renal toxicity can be detected in urine. These markers include: kim-1, lipocalin-2, neutrophil gelatinase-associated lipocalin (NGAL), timp-1, clusterin, osteopontin, vimentin, and heme oxygenase 1 (HO-1). More broadly, detection of DNA, heavy metal ions or BUN levels in urine can be useful clinical information. Thus, the methods and utility of the instant invention also includes the ability to detect these markers of renal toxicity in a whole blood sample. One could envision that a hepatic function panel may also include one or two hallmark biomarkers of nephrotoxicity or visa versa.

Freely circulating DNA. In some cases it is beneficial to detect DNA that is free in the circulation in certain patients or subjects. In these cases, the system is configured to gently analyze a blood sample from these patients or subjects while not allowing breaking or lysing of any intact cells and analysis in the form of amplification is only on the free circulating DNA. In a particular embodiment, probes that amplify chromosome 21, as well as probes on the X chromosome can be used and a resulting ratio of these two signals can be then correlated with the presence/absence of Down's syndrome, i.e a higher value detected for the chromosome 21 signal relative to the signal arising from the X chromosome. Further, this ratio may be ascertained directly from a umbilical cord or a pregnant woman.

The following examples are put forth so as to provide those of ordinary skill in the art with a complete disclosure and description of how the devices, systems, and methods described herein are performed, made, and evaluated, and are intended to be purely exemplary of the invention and are not intended to limit the scope of what the inventors regard as their invention.

EXAMPLE 1

Multiplexed Creatinine, Tacrolimus, and *Candida* Panel Assay

In transplant patients that receive solid organ, bone marrow, hematopoietic stem cell, or other allogeneic donations, there is a need to monitor the immune status, organ function, and if necessary, rapidly and accurately identify opportunistic infections. Tacrolimus (also FK-506 or Fujimycin) is an immunosuppressive drug whose main use is after allogeneic organ transplant to reduce the activity of the patient's immune system and so lower the risk of organ rejection. It is also used in a topical preparation in the treatment of severe atopic dermatitis (eczema), severe refractory uveitis after bone marrow transplants, and the skin condition vitiligo. Dosages are titrated to target blood levels. Side effects can be severe and include infection, cardiac damage, hypertension, blurred vision, liver and kidney problems, seizures, tremors, hyperkalemia, hypomagnesemia, hyperglycemia, diabetes mellitus, itching, insomnia, and neurological problems such as confusion, loss of appetite, weakness, depression, cramps, and neuropathy. In addition, tacrolimus may potentially increase the severity of existing fungal or infectious conditions such as herpes zoster or polyoma viral infections, and certain antibiotics cross-react with tacrolimus.

Creatinine is a metabolic by-product of muscle metabolism (it is derived from creatine and phosphocreatine). For the majority of patients, the muscle turnover varies little from day to day, and the serum creatinine is more or less constant. Creatinine is filtered and excreted by the kidney. Measuring serum creatinine is a simple test and it is the most commonly used indicator of renal function, and a rise in blood creatinine levels is observed with marked damage to functioning nephrons. Alternatively, a creatinine clearance test may be used. Creatinine clearance can be accurately calculated using serum creatinine concentration and some or all of the following variables: sex, age, weight, and race, as suggested by the American Diabetes Association, without a 24 hour urine collection. Currently there are tests to monitor either creatinine or tacrolimus alone, but there is a need to monitor creatinine and tacrolimus levels from the same blood sample simultaneously. In addition, it would be useful to be able to detect *Candida* pathogens simultaneously. Data from these markers (creatinine, tacrolimus, and *Candida* pathogens) can assist and guide the physician to optimal therapy post-transplantation. Optimizing therapy is a tight balance of preventing rejection but also ensuring immune function to fight opportunistic infections and overall results in enhanced patient compliance to the immunosuppressive therapy. Simultaneous data from more than one analyte analysis will improve patient management.

In large part, transplant recipients succumb to transplant rejection, graft vs. host disease, or opportunisitic infections. In the first two, immunosuppressive agents can ablate or inhibit the reactions. However, if the patient has an underlying infection, then clinical management is challenging. For example, a heart-lung transplant patient presenting with fever of unknown origin enters a health care facility. The patient is started on broad spectrum antibiotics until the culture results are known. If the condition worsens, and the culture reveals a specific infection, e.g., *Candida*, a specific antibiotic, fluconazole, can be administered to the known patient. However, this antibiotic may alter the levels of the immunosuppressive agent given to almost all allogenic transplant recipients, tacrolimus. Upon testing for both tacrolimus and creatinine levels, the physician halts the tacrolimus, believing that the fluconazole will defeat the infection, and in a rapid manner. Under this regimen, the patient worsens because the particular *Candida* strain is resistant to fluconazole, and the patient is then started on an appropriate anti-fungal agent. However, since the tacrolimus was halted, the immunosuppression is unmanaged, and organ rejection begins. If too late to get the clinical situation under control, and the patient is unresponsive to any additional therapy, the patient may die.

To address these concerns and significantly improve patient management and outcomes, a multiplexer device as described herein (FIGS. 3 and 7A-7F) may be used to simultaneously monitor creatinine, tacrolimus, and accurate identification of opportunistic infections in a patient. A multi-well cartridge is prepared with at least one whole blood sample from the patient; magnetic particles corresponding to each of the analytes to be detected (creatinine, tacrolimus, and a plurality of *Candida* pathogens); creatinine antibodies; tacrolimus multimers; and dilution and wash buffers.

EXAMPLE 2

Creatinine Assay

Figure 9:
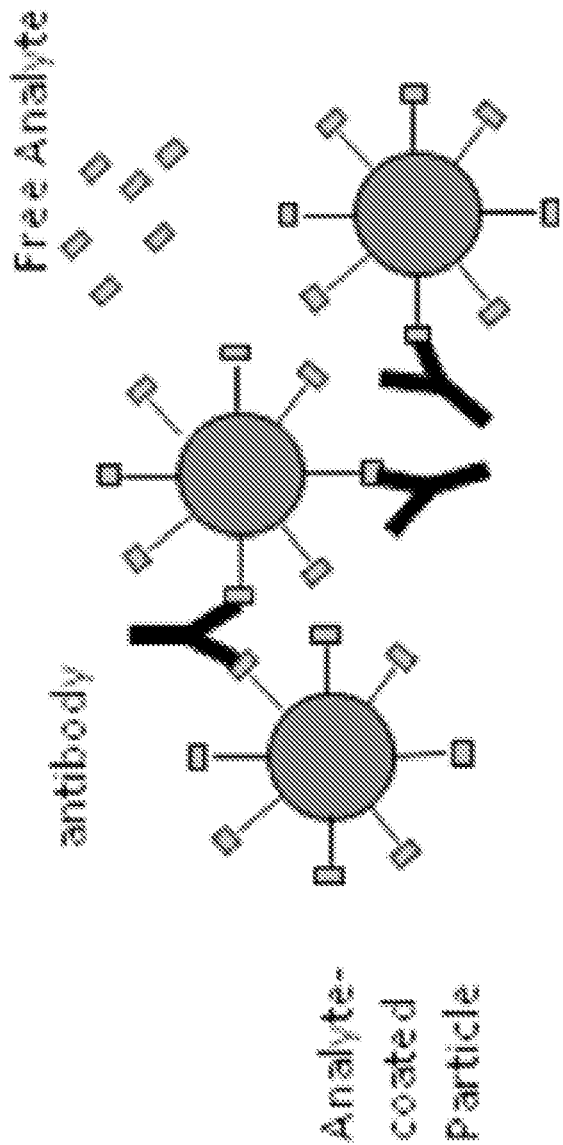
FIG. 9 is a schematic diagram of the creatinine inhibition assay architecture.

In the assay used for creatinine, magnetic particles that have been decorated with creatinine linked to their surfaces are incubated with a mixture of free creatinine and creatinine antibody. The creatinine-decorated magnetic particles are designed to aggregate in the presence of the creatinine antibody. The free creatinine competes with the magnetic particles for the creatinine antibody. Thus, the binding of free creatinine to the antibody blocks agglomeration of the magnetic particles, and low levels of free creatinine are marked by the formation of agglomerates. These agglomerates alter the spin-spin relaxation rates of sample when exposed to a magnetic field, and the change in the T2 relaxation times (measuring a change in the magnetic resonance signal from the surrounding water molecules) can be directly correlated to presence and/or concentration of the analyte in the target sample. The creatinine inhibition assay architecture is depicted in FIG. 9.

To prepare the creatinine particles, magnetic particles are prepared with sequential BSA, creatinine coating, PEG cap and block. The creatinine-coated magnetic particles are diluted to 0.4 mM Fe in creatinine assay buffer (100 mM Tris pH 7.0, 800 mM NaCl, 1% BSA, 0.1% Tween, and 0.05% Proclin), vortexed thoroughly, and allowed to equilibrate for 24 hours at 4-8° C. before use in the assay.

An anti-creatinine mouse monoclonal antibody is employed as a multivalent binding agent for the creatinine-conjugated magnetic particles. The antibody is placed in a tube and diluted to 0.8 μg/ml in assay buffer and vortexed thoroughly.

Briefly, creatinine antibodies for use with the devices and methods described herein were developed as follows. A modified creatine molecule was devised (TRF-creatinine) for immunization in BALB-C and AJ mice.

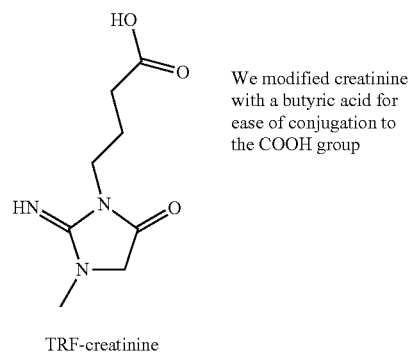

TRF-creatinine

Thirty four stable antibody producing clones were generated. These clones arose from either BALB-C (spleen cells) (n=17) or AJ mice (n=17). The two genetically different mouse lines were selected for their known genetic differences in their immune systems. Criteria and a selection process were developed for screening and identification of an optimal monoclonal antibody for use in the assay. The first screening included testing the ability of the antibody to bind to BSA or transferrin. The antibody selection process includes reactivity to the multimeric binding agent, the ability of creatinine to compete for binding to the antibody in an ELISA assay, identification of interfering molecules that potentially found in the patient sample that may lead to detection interference, the ability of the antibody to be conjugated to the magnetic nanoparticle or be functional in a T2 magnetic relaxation switch assay, and finally identification of any complicating features of complex biological fluid patient samples interfering with the T2 detection assay.

Using the established antibody selection criteria outlined above, seven monoclonal antibodies were identified and selected for these qualities as potential candidates in the assay.

The cartridge is then inserted into the cartridge slot of the device and coupled to the pin manifold, which in turn is fluidically connected to an aliquotor. An automatic, programmable pump is fluidically connected to the system to control the amount and timing of each sample.

An aliquot of the blood sample is fluidically transported to the concentration, extraction, and lysis unit, wherein it is optionally processed. For the creatinine assay, no extraction or lysis is required. The optimal creatinine concentration in the assay is ca. 4 mg/dL creatinine; for samples with expected creatinine levels >4 mg/dL, sample dilution may be performed prior to introduction to the concentration, extraction, and lysis unit using 1 part sample to 4 parts assay buffer. For samples with expected creatinine levels <<4 mg/dL, sample concentration may be performed using the concentration, extraction, and lysis unit.

At this stage, the creatinine sample may either bypass the amplification unit or pass through the amplification unit with all zones set to temperature fixed temperature.

Next, sample containing the creatinine magnetic particles is introduced to the multiplexing and gMAA unit, where it flows down the conduit to a designated location proximal to one or more magnets, as shown, e.g., in FIGS. 7A-7B. Flow is paused.

With the one or more magnets in the "on" or "up" position, i.e., creating a magnetic field gradient inside the conduit of sufficient strength to hold the magnetic particles in a particular volume in the conduit proximal to the magnet, flow is resumed and the buffer is separated from the magnetic particles, which are held in the conduit proximal to the magnet.

Other magnetic particles with other specificities, e.g., for tacrolimus and *Candida*, are then serially introduced to the multiplexer conduit and held in discrete volumes within the conduit proximal to the corresponding one or more magnets associated with those volumes. The order of loading proceeds from distal to proximal, relative to the conduit inlet, so that the flowing samples of magnetic particles of different specificities do not pass conduit sites already having held magnetic particles with corresponding magnets in the "on" position. The magnetic particles of different specificities may be loaded in any order desired.

In the meantime, the optionally processed sample containing the free creatinine analyte is mixed with the sample containing the creatinine antibodies, e.g., in the mixing manifold directly upstream of the multiplexer conduit. The mixture is then fluidically transported to the creatinine magnetic particles held in the conduit and allowed to incubate together with the particles. A faster flow rate is used to flow the mixture past held magnetic particles having other specificities, and the flow rate is slowed as the mixture approaches the corresponding held magnetic particles. Optionally, the one or more magnets holding the particles in the volume of the conduit are used to assist with MAA, e.g., gMAA or hMAA, as the antibodies in the mixture cause the magnetic particles to agglomerate. For example, gMAA may be performed, e.g., by rotation of one or more proximal magnets about the volume of the conduit containing the mixture, or by alternation of two or more magnets on opposite sides of the conduit in the "on" and "off" positions.

While at least one of the magnets proximal to the creatinine mixture is in the "on" position, flow is resumed, and the magnetic particles are held in the same volume of the conduit, while other buffer components are flushed.

Assay buffer is fluidically transported to the held creatinine particles, which are released into the assay buffer by moving the one or more proximal magnets into the "off" position. The sample is then fluidically transported out of the multiplexer, to the heating manifold for incubation for 5 minutes at 37° C., and finally to the T2 detector, where the T2 relaxation rate of the sample is measured. Any T2 detector may be used, e.g., an MR Reader (T2 MR, Reader with 2200 Fluke Temperature Controller, with NDxlient software 0.9.14.1/hardware Version 0.4.13 Build 2, Firmware Version 0.4.13 Build 0) designed specifically for serum samples and modified as needed to interface with the fluidic device described herein.

Figure 10:
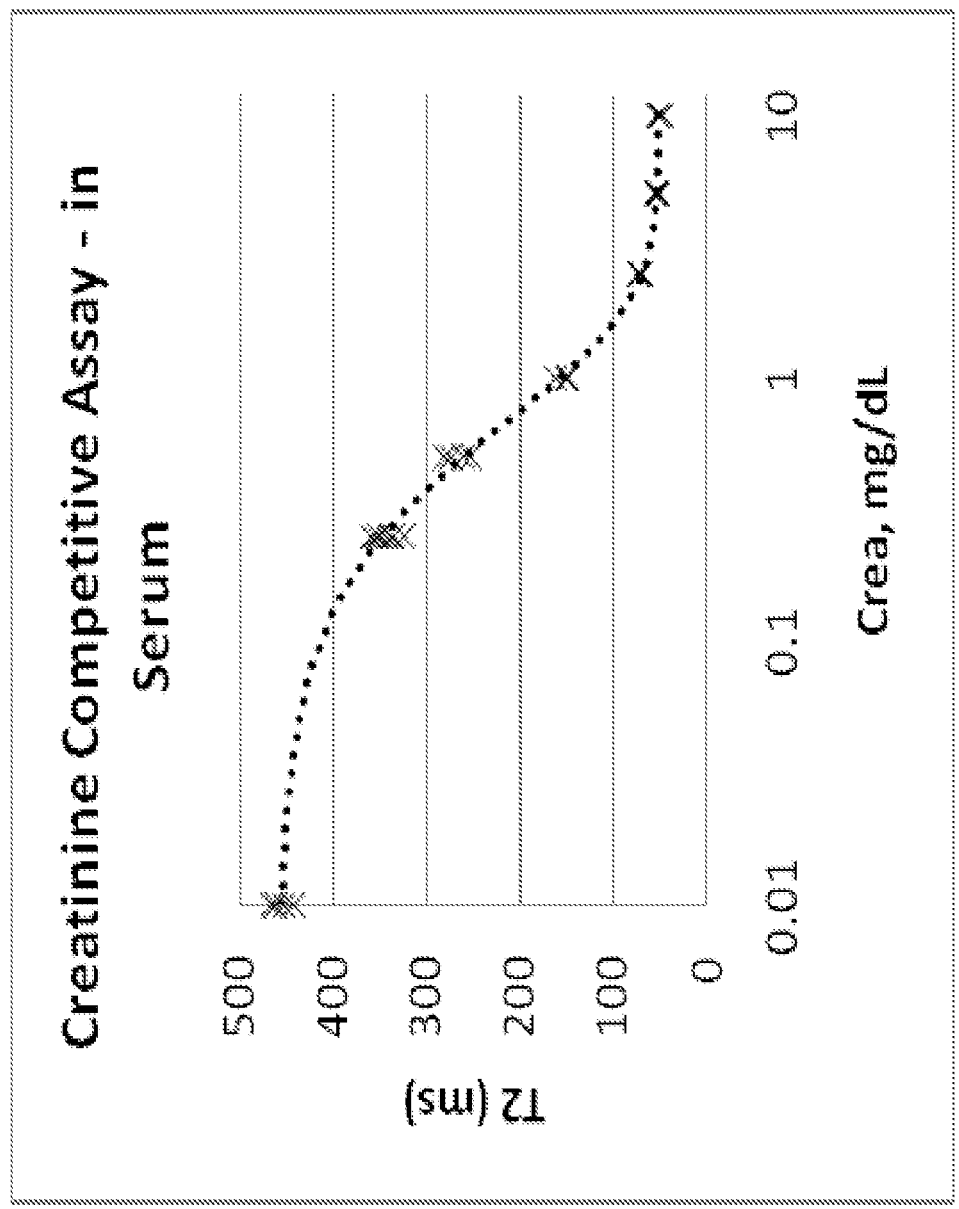
FIG. 10 is a standard curve for determining the concentration of creatinine in a sample.

The creatinine assay is conducted in parallel for a control sample and for any other creatinine samples being tested. The T2 relaxation rates thereby obtained are compared to a standard curve (see, e.g., FIG. 10) to determine the concentration of creatinine in the sample. In general, with the magnetic particles used in this assay, the T2 relaxation rate drops as the creatinine concentration increases (FIG. 10).

EXAMPLE 3

Tacrolimus Assay

Figure 11:
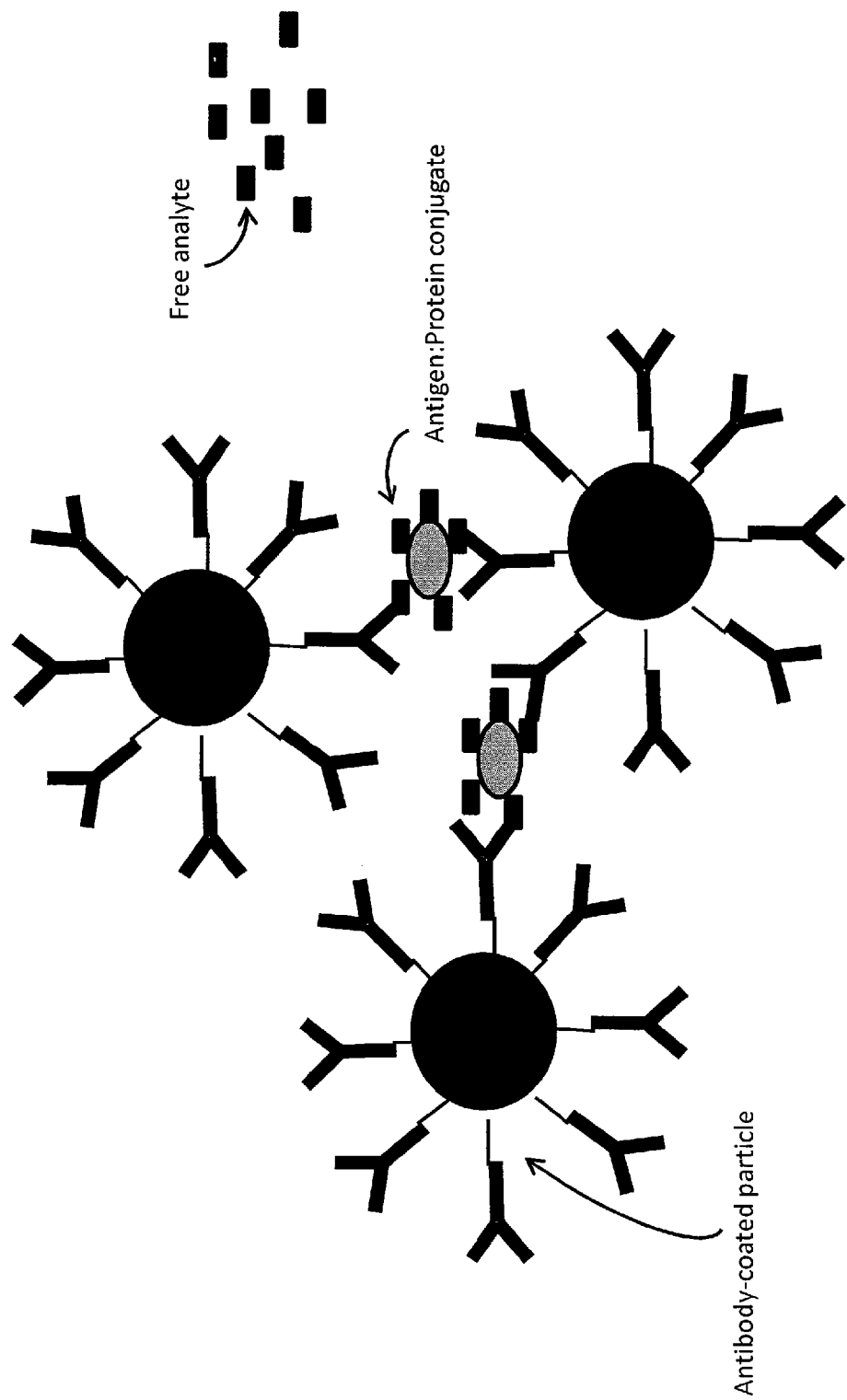
FIG. 11 is a schematic diagram of the tacrolimus inhibition assay architecture.

In the assay used for tacrolimus, magnetic particles that have been decorated with antibodies to tacrolimus linked to their surfaces are incubated with a mixture of free tacrolimus and a multimeric form of tacrolimus (BSA-tacrolimus multivalent binding agent). The magnetic particles are designed to aggregate in the presence of the multimeric form of tacrolimus. The free tacrolimus competes with the multimeric form of tacrolimus for the magnetic particles. Thus, the binding of free tacrolimus to the magnetic particles blocks agglomeration of the magnetic particles, and low levels of free tacrolimus are marked by the formation of agglomerates. These agglomerates alter the spin-spin relaxation rates of sample when exposed to a magnetic field, and the change in the T2 relaxation times (measuring a change in the magnetic resonance signal from the surrounding water molecules) can be directly correlated to presence and/or concentration of the analyte in the target sample. The tacrolimus inhibition assay architecture is depicted in FIG. 11.

Solutions of magnetic particles, antibody, and sample are, where indicated, subject to dilution with a tacrolimus assay buffer that includes 100 mM Glycine pH 9, 0.05% Tween 80, 1% BSA, 150 mM NaCl, and 0.1% Chaps.

To prepare the magnetic particles specific for tacrolimus, magnetic particles are prepared by sequential aminated coating (PEG or BSA), antibody covalent attachment, PEG cap and PEG/protein block. The magnetic particles are diluted to 0.4 mM Fe in tacrolimus assay buffer, vortexed thoroughly, and allowed to equilibrate for 24 hours at 4-8° C. before use in the assay.

The multivalent binding agent is formed from COOH-modified tacrolimus covalently conjugated to BSA. The sample containing multimeric tacrolimus is diluted to 0.02 µg/ml in assay buffer and vortexed thoroughly before use in the assay.

The assay then proceeds similarly to the creatinine assay as described above, except that the red blood cells in the whole blood sample must be lysed in the concentration, extraction, and lysis unit in order to release free tacrolimus, which is generally bound to a binding protein inside of red blood cells in the whole blood sample.

Figure 12:
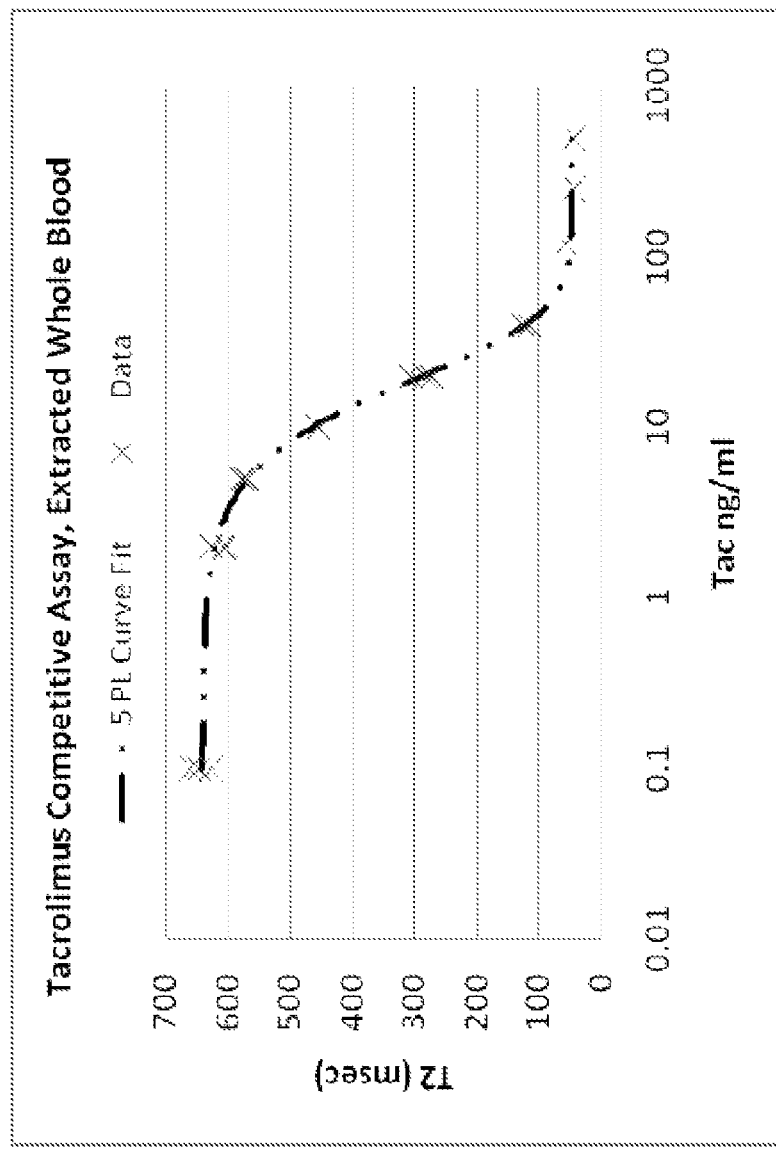
FIG. 12 is a standard curve for determining the concentration of tacrolimus in a sample.

The tacrolimus assay is conducted in parallel for a control sample and for any other tacrolimus samples being tested. The T2 relaxation rates thereby obtained are compared to a standard curve (see, e.g., FIG. 12) to determine the concentration of tacrolimus in the sample. In general, with the magnetic particles used in this assay, the T2 relaxation rate drops as the tacrolimus concentration increases (FIG. 12).

EXAMPLE 4

Candida Assay

Figure 13:
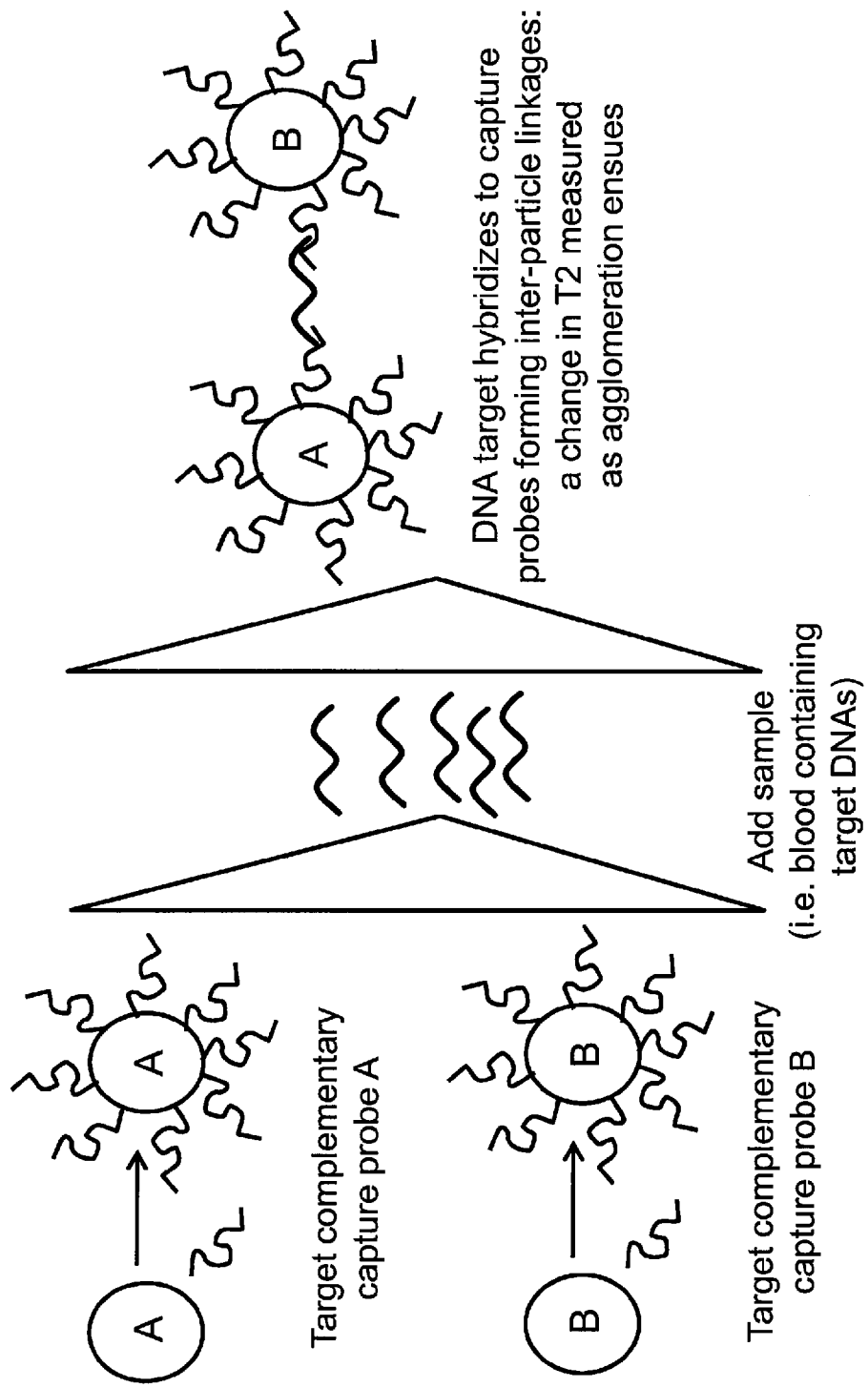
FIG. 13 is a schematic diagram of the *Candida* aggregation assay architecture.

In the assay used for *Candida*, two pools of magnetic particles are used for detection of each *Candida* species. In the first pool, a species specific *Candida* capture oligonucleotide probe is conjugated to the magnetic particles. In the second pool, an additional species-specific capture oligonucleotide probe is conjugated to the magnetic particles. Upon hybridization, the two particles will hybridize to two distinct species-specific sequences within the sense strand of the target nucleic acid, separated by approximately 10 to 100 nucleotides. (Alternatively, the two capture oligonucleotides can be conjugated to a single pool of particles, resulting in individual particles having specificity for both the first and second regions.) The oligonucleotide-decorated magnetic particles are designed to aggregate in the presence of nucleic acid molecules from a particular species of *Candida*. Thus, unlike the inhibition assays used for creatinine and tacrolimus, the *Candida* assay features an increase in agglomeration in the presence of the target *Candida* amplicons. The hybridization-mediated agglomerative assay architecture is depicted in FIG. 13.

Carboxylated magnetic particles are used in the *Candida* assays. Magnetic particles are conjugated to oligonucleotide capture probes to create oligonucleotide-particle conjugates. In one version of an assay method employing the systems and device of this method, for each target amplicon, two populations of oligonucleotide-particle conjugates are prepared. Oligonucleotide-particle conjugates are prepared using standard EDC chemistry between aminated oligonucleotides and carboxylated particles, or, optionally, by coupling biotin-TEG modified oligonucleotides to streptavidin particles. Coupling reactions are typically performed at a particle concentration of 1% solids.

Post-conjugation, functional oligonucleotide densities are measured by hybridizing Cy5-labeled complements to the particles, washing the particles three times to remove non-hybridized oligo; and eluting by heating to 95° C. for 5 minutes. The amount of Cy5 labeled oligonucleotide is quantified via fluorescence spectroscopy.

The coupling reactions are performed at 37° C. overnight with continuous mixing using a rocker or roller. The resulting particle conjugates are washed twice with 1× reaction volume of Millipore water; twice with 1× reaction volume of 0.1 M Imidazole (pH 6.0) at 37° C. for 5 minutes; three times with 1× reaction volume of 0.1 M sodium bicarbonate at 37° C. for 5 minutes; then twice with 1× reaction volume of 0.1 M sodium bicarbonate at 65° C. for 30 minutes. The resulting particle conjugates are stored at 1% solids in TE (pH 8), 0.1% Tween-20).

The panel of *Candida* species detected includes *C. albicans, C. glabrata, C. krusei, C. tropicalis,* and *C. parapsilosis*. The sequences are amplified using universal primers recognizing highly conserved sequence within the genus *Candida*. The capture oligonucleotides are designed to recognize and hybridize to species-specific regions within the amplicon.

An aliquot of a blood sample is first subjected to lysis as follows:

(i) A whole blood sample is mixed with an excess (1.25×, 1.5×, or 2×) volume of ammonium chloride hypotonic or detergent (non-ionic detergents such as Triton, e.g., Triton X-15, X-35, X-45, X-100, X-102, X-114, X-165, X-305, X-405, or X-705, Igepal (NP40), e.g., Igepal CA-210, CA-520, CA-630, or CA-720, Brij, e.g., Brij-30, Brij-L23, or Brij-58, Tween, e.g., Tween-20, Tween-40, Tween-60, or Tween-80; zwitterionic detergents such as CHAPS, CHAPSO, or sulfobetaine; ionic detergents such as SDS, deoxycholate, or CTAB) lysis solution. Addition of lysis solution disrupts all RBCS, but has less effect on the disruption of WBC, yeast, or bacteria cells. RBC cell membranes and cellular debris are removed. Intact cells are reconstituted with 100 µl TE (Tris EDTA, pH=8) to a final volume of about 100 µl; and (ii) To the approximately 100 µl sample, 120 mg of 0.5 mm beads are added. The sample is agitated for 3 minutes at about 3K rpm, thereby forming a lysate.

An aliquot of ca. 50 µl of lysate is then fluidically transported to the amplification unit (FIG. 6) and subjected to amplification by addition of the lysate to a amplification master mix including nucleotides; buffer (5 mM (NH$_4$)SO$_4$, 3.5 mM MgCl$_2$, 6% glycerol, 60 mM Tricine, pH=8.7 at 25° C.; primers (forward primer in 4× excess (300 mM forward; 0.75 mM reverse) to allow for asymmetric single strand production in the final product); and thermostable polymerase (HemoKlenTaq (New England Biolabs)). After an initial incubation at 95° C. for 3 minutes, the mixture is subjected to amplification cycles: 62° C. annealing; 68° C. elongation; 95° C.—for 40 cycles. Note: there is a 6° C. difference in the annealing and elongation temperatures; the annealing and elongation may be combined into a single step to reduce the total amplification turn-around time.

The amplification primers and capture probes which can be used in the *Candida* assay are provided below in Table 4.

TABLE 4

| PCR Primers | |
|---|---|
| Pan Candida- PCR Forward Primer | GGC ATG CCT GTT TGA GCG TC (SEQ ID NO. 1) |
| Pan Candida- PCR Reverse Primer | GCT TAT TGA TAT GCT TAA GTT CAG CGG GT (SEQ ID NO. 2) |
| Capture Probes | |
| Candida albicans Probe #1 | ACC CAG CGG TTT GAG GGA GAA AC (SEQ ID NO. 3) |
| Candida albicans Probe #2 | AAA GTT TGA AGA TAT ACG TGG TGG ACG TTA (SEQ ID NO. 4) |

TABLE 4-continued

| | |
|---|---|
| Candida krusei Probe #1 | CGC ACG CGC AAG ATG GAA ACG (SEQ ID NO. 5) |
| Candida krusei Probe #2 | AAG TTC AGC GGG TAT TCC TAC CT (SEQ ID NO. 6) |
| Candida krusei probe | AGC TTT TTG TTG TCT CGC AAC ACT CGC (SEQ ID NO: 7) |
| Candida glabrata Probe #1 | CTA CCA AAC ACA ATG TGT TTG AGA AG (SEQ ID NO. 8) |
| Candida glabrata Probe #2 | CCT GAT TTG AGG TCA AAC TTA AAG ACG TCT G (SEQ ID NO. 9) |
| Candida parapsilosis/ tropicalis Probe #1 | AGT CCT ACC TGA TTT GAG GTC NitInd[1]AA (SEQ ID NO. 10) |
| Candida parapsilosis/ tropicalis Probe #2 | CCG NitInd[1]GG GTT TGA GGG AGA AAT (SEQ ID NO. 11) |
| Candida tropicalis | AAA GTT ATG AAATAA ATT GTG GTG GCC ACT AGC (SEQ ID NO: 12) |
| Candida tropicalis | ACC CGG GGGTTT GAG GGA GAA A (SEQ ID NO: 13) |
| Candida parapsilosis | AGT CCT ACC TGA TTT GAG GTC GAA (SEQ ID NO: 14) |
| Candida parapsilosis | CCG AGG GTT TGA GGG AGA AAT (SEQ ID NO: 15) |
| inhibition control 5' | GG AAT AAT ACG CCG ACC AGC TTG CAC TA (SEQ ID NO: 16) |
| inhbition control 3' | GGT TGT CGA AGG ATC TAT TTC AGT ATG ATG CAG (SEQ ID NO: 17) |

[1]NitInd is 5' 5-Nitroindole, a base that is capable of annealing with any of the four DNA bases.
2. Note that oligo Ts are added as spacers.

The assay then proceeds similarly to the creatinine and tacrolimus assays as described above, except that multiple sets of magnetic particles (specific for each strain of Candida to be tested) are loaded in the conduit of the multiplexer unit, and samples containing amplification amplicons are fluidically transported to the corresponding magnetic particles held in the conduit and allowed to incubate together with the particles, resulting in aggregation in the presence of amplification amplicon (rather than inhibition of aggregation, as with the creatinine and tacrolimus assays).

Optionally, the assay is carried out in the presence of a control sequence, along with magnetic particles decorated with probes for confirming the presence of the control sequence.

Optionally, detection of presence or concentration of fluconazole in a patient sample, e.g., a whole blood sample, may also be included in the multiplexed assay.

The multiplexer device may be preprogrammed in such a manner that, upon placement of the whole blood sample and other reagents in the appropriate positions in the sample cartridge, the entire multiplexed assay is performed rapidly and automatically, producing a simultaneous or near-simultaneous set of results indicating presence and/or concentrations of creatinine, tacrolimus, various strains of Candida, and optionally fluconazole in a patient sample. These results may be used to diagnose, manage, or treat a medical condition, e.g., organ rejection or opportunistic infection. A patient may be monitored, e.g., continuously or intermittently, by analyzing a series of blood samples over time. In addition, the method may be used, e.g., to determine an appropriate dose of a therapeutic agent in a patient, as described herein.

EXAMPLE 5

Preparation of Nanoparticles for Detection of Nucleic Acid Analytes

Preparation of single probe particles: 800 nm carboxylated iron oxide superparamagnetic particles, consisting of numerous iron oxide nanocrystals embedded in a polymer matrix including a total particle diameter of 800 nm (see Demas et al., New J. Phys. 13:1 (2011)) were washed using a magnetic rack prior to use. The magnetic particles were resuspended in 66 µL of nuclease-free water, 20 µL of 250 mM MES buffer pH 6, and 4 µL of aminated probe (obtained from IDT), at 1 mM concentration per mg of particle to be prepared. A 3' aminated probe particle and a 5' aminated probe particle were prepared (e.g., the probe for C. parapsilosis). The probe was added to the particle and the suspension was vortexed using a vortexer equipped with a foam holder to hold the tube. The vortexer was set to a speed that keeps the particles well-suspended without any splashing. N-ethyl-N'-(3-dimethylaminopropyl) carbodiimide hydrochloride (EDC) was then dissolved in water and immediately added to the vortexing particle-probe mixture. The tube was then closed and incubated with rotation in an incubator at 37° C. for 2 hours. The tube was then placed in a magnetic rack and the reaction fluid was removed. The particles were washed with a series of washes (125 µL/mg particle) as follows: water, water, 0.1M imidazole, pH 6.0 with a 5 minute incubation with rotation at 37° C., water, 0.1 M sodium bicarbonate, pH 8.0 with a 5 minute incubation with rotation at 37° C. water. The particles were then subjected to a 1 hour heat-stress at 60-65° C. in 0.1M sodium bicarbonate pH 8.0 with rotation. After the heat-stress, the bicarbonate was removed by placing the tube in a magnetic rack. The particles were then resuspended in the storage buffer (Tris-EDTA, 0.1% tween 20) and vortexed. The storage buffer was removed and a final 100 µl of storage buffer was added to the particle preparation. The particles were stored at 2-8° C., qualified using an iron test to determine the iron concentration of the particles, and tested against target nucleic acid (e.g., *C. paraplsilosis* ITS2 oligo titration). In the *Candida* assay, the particles are diluted in 8×SSPE supplemented with 0.09% sodium azide as a preservative.

Preparation of dual probe particles: For the preparation of a dual probe particle, the procedure is the same as above, except that equal volumes of a second probe (e.g., 3' aminated *C. albicans*) and the first probe (e.g., 3' aminated *C. tropicalis*) were mixed prior to addition to the magnetic particles. Similarly, equal volumes of the 5' aminated probes were mixed prior to addition to the magnetic particles.

EXAMPLE 6

Working Example of Fluidic System

As a test of the devices and methods described herein, a fluidics experiment was performed. First, the T2 relaxation rate of a 5-10 µl volume of resuspended magnetic particles was tested and determined to be 30 milliseconds. The sample was then pulled into a tube of 0.03" ID using a syringe, and a 1"×1" square magnet with an additional bar magnet attached was placed in proximity to the sample in the tube for one minute. Without removing the magnet, the liquid sample was expelled from the tube and the T2 relaxation rate was determined to be about 70 ms. The liquid was then pulled back into the tube, the magnet was released, and the liquid was once again expelled. The T2 relaxation rate was measured once again and found to be about 40 milliseconds. These results confirm that magnetic particles may be manipulated and held in a fluidics device and detected in a small volume.

EXAMPLE 7

Assays Using Magnetizable Metal Foam

In some assays, it is advantageous to use a magnetizable foam, e.g., a metal foam, to improve the reaction kinetics of magnetic particle clustering reactions.

Figures 14A, 14B, 14C, 14D:
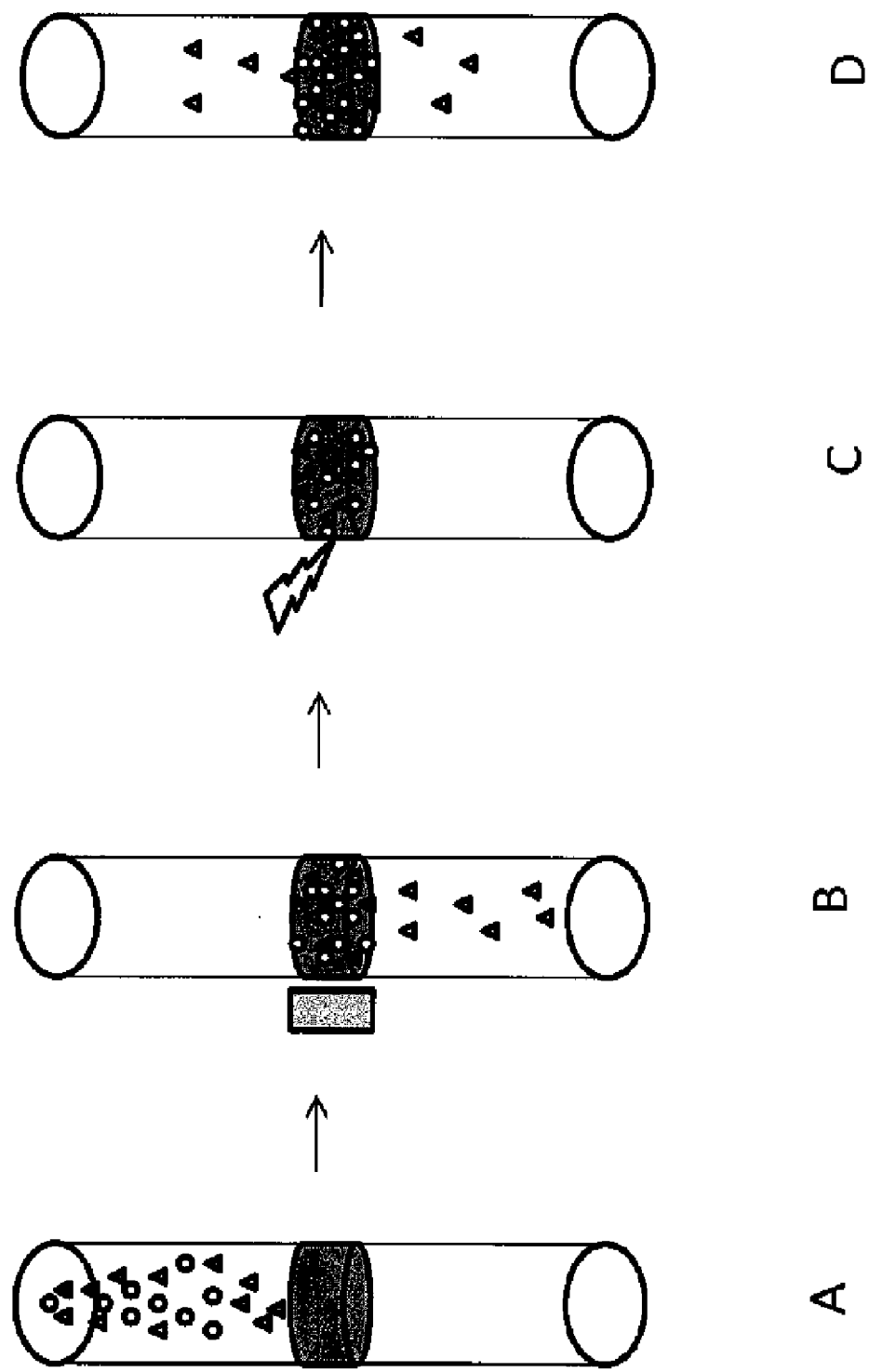
FIGS. 14A-14D are schematic views of a conduit containing an immobilized portion of magnetizable metal foam (shaded), magnetic particles (circles), and analyte (triangles).

For example, a magnetizable metal foam, e.g., made of nickel, may be inserted into a conduit and immobilized by exposure to heat, which shrinks the conduit around the metal foam, resulting in a tight seal. A sample containing magnetic particles and analytes is then introduced at one end of the conduit (FIG. 14A).

Next, the conduit is exposed to a magnet (FIG. 14B), and the magnetic particles are attracted to the metal foam and become magnetically trapped within its pores, or crevices. The average diameter of the pores in the metal foam is, e.g., between 100-1000 microns. Analyte molecules can be carried to the metal foam via binding to a magnetic particle, or the fluid can be forced through the metal foam to reach trapped magnetic particles. While trapped in the metal foam, the magnetic particles have enhanced interactions, as they are now confined and are closer to other magnetic particles, and cluster formation is enhanced.

The metal foam is then demagnetized (FIG. 14C), i.e., the magnetic field of the metal foam becomes negligible. The magnetic particles and analyte cluster complexes largely remain in the metal foam, as the diffusion of magnetic particle clusters is relatively low, although some natural diffusion of the analyte in to and out of the metal foam occurs (FIG. 14D).

Finally, the magnetic particle/analyte specific clusters are removed by gently forcing (e.g., by limited shearing) the complexes out of the metal foam and determining one or more spin-spin relaxation rates of the sample, e.g., the T2 relaxation rate, when exposed to a separate magnetic field, e.g., in an NMR detector.

Figure 15:
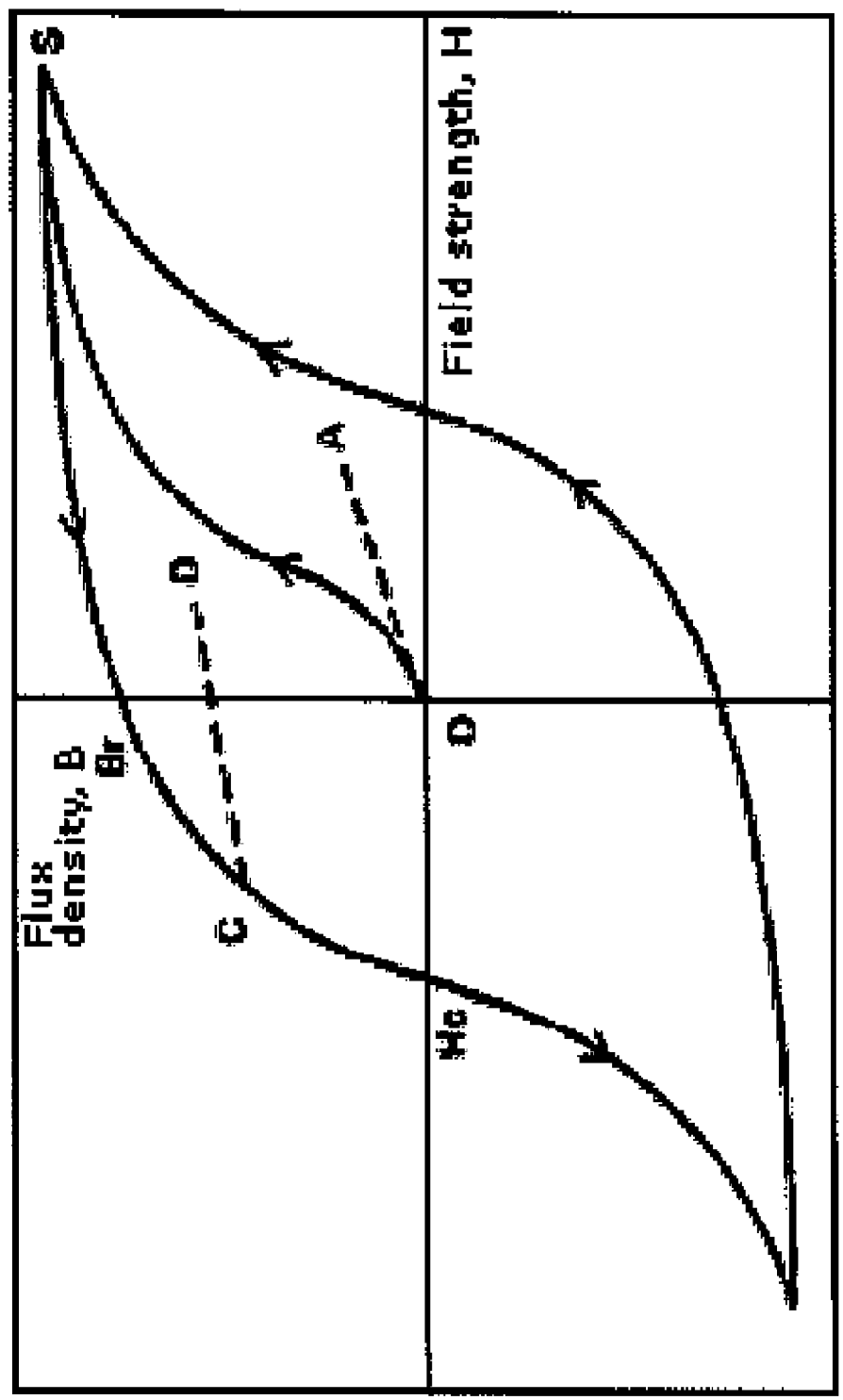
FIG. 15 is a graph depicting a hysteresis curve of demagnetization.

The metal foam may be demagnetized in a number of ways. The best results are achieved in an environment with no DC field. Since the earth has a DC field, it is helpful to perform the process in a DC magnetically shielded volume. The demagnetization process of the metal foam follows a hysteresis curve (FIG. 15). In some embodiments, the metal foam is "soft" and has a narrow or slim hysteresis curve.

Methods to demagnetize the metal foam include the following:

1) Heating the material above its Curie temperature.
2) Exposing the magnetized metal foam to an alternating magnetic field. The metal foam can be exposed to an artificially created alternating magnetic field with slow removal of the exposure to ensure demagnetization; this can be done once or repeatedly. This method has the effect of forcing the metal foam along its hysteresis curve, e.g., as shown in FIG. 15, for any given flux density (Br). As the alternating field is applied, the flux density is reduced and reaches successively lower extremes; i.e., with each cycle of exposure to the alternating magnetic field, the remnant flux density is lowered. The peak field applied should be larger than any domain moment coercivity (He in FIG. 15).
3) As described in 2), but rather than displacing the material from the alternating field source, the field source can be attenuated.

Preparation and Derivatization of Nickel Metal Foam

To prepare small circular pieces of nickel metal foam (NMF), NMF material is incubated with deionized water and then frozen. The frozen water in the NMF crevices support the foam so that it will not collapse or create differential edges. Next, a punch is used to create uniform-sized pieces of NMF; a hammer and punch (e.g., a circular tube having a circular cutting edge at one end) is used to cut out circular pieces, e.g., 2-3 mm in size, of the frozen foam. A wire is then used to poke out the pieces, which are dried in a glassware oven.

To derivatize the NMF pieces and prepare them for use in the devices and methods described herein, the following steps are performed. First, NMF pieces are cleaned with 2M $H_2SO_4$ in a sonicator, and sulfuric acid solution is used to clean the NMF and to roughen the NMF surfaces in order to assist in subsequent attachment of the amino groups of aminosilane. The acid-washed NMF pieces are then rinsed with deionized water to remove any residual acid solution, and the NMF pieces are dried in a glassware oven. Next the NMF pieces are derivatized with aminosilane, and 70 kD aminodextran is covalently attached. The aminodextran is then crosslinked with gluteraldehyde, and the derivatized NMF pieces are incubated with salmon sperm to block non-specific binding.

EXAMPLE 8

Working Example Using NMF in a Fluidics Assay

To test the use of NMF in a fluidics assay, the following experiments were performed.

Preparation and Derivatization of Nickel Metal Foam

Cleaning of NMF: 2 cm×2 cm pieces of NMF (Recemat #4753) were treated with a heat gun at 550° F. for one minute on each side to burn off any impurities. The NMF pieces were sonicated in a horn in 2M HCl for 20 cycles and soaked in HCl for one hour. The pieces were then washed ten times in deionized water, three times in acetone, and three times in MeOH. The NMF pieces were dried in an oven for two hours at 100° C.

Aminosilane treatment to add amino groups to NMF (Weetall method): APTES was diluted to 10% in 70% MeOH/30% deionized water. The pH was adjusted to 4.0 with HCl. The clean NMF pieces were placed in a glass vial covered by the APTES solution and incubated at 100° C. for four hours in a drying oven. The NMF pieces were placed on a Kimwipe and dried overnight at 100° C. in the drying oven. The NMF pieces were then washed three times in deionized water at room temperature ("RT"), three times in deionized acetone at RT, and three times in MeOH RT. The NMF pieces were dried at 100° C. for one hour and stored in a glass vial at RT.

Covalent attachment of lysine fixable FITC dextran to amilosilane-treated NMF: EM-grade glutaraldehyde was diluted tenfold from 25% to 2.5% in deionized water, and the aminosilanated NMF pieces were incubated in the gluteraldehyde solution for two hours at RT. The NMF pieces were then washed ten times in deionized water. Lysine-fixable FITC dextran was diluted to 5 mg/ml in deionized water, and the NMF pieces were incubated in the dextran solution for two hours with vortexing every 15 minutes. The NMF pieces were washed five times in deionized water and stored in PBS with 0.002% sodium azide.

Cross-linking of lysine-fixable aminodextran covalently attached to NMF: The NMF pieces from the previous step were placed in a solution of 0.25% EM-grade glutaraldehyde in deionized water for two hours at RT. The NMF pieces were then washed five times in deionized water, and the cross-linking reaction was quenched with 1% glycine and 1% ethanolamine in PBS at 37° C. for 30 minutes. The NMF pieces were washed ten times with deionized water.

Passivation of derivatized NMF: The NMF pieces were incubated with 100 ug/ml salmon sperm DNA in TE at 95° C. for one hour and then washed three times with deionized water. The pieces were incubated in Surmodics MicroArray stabilizer at 37° C. for one hour and then washed three times in deionized PBS.

Preparation of NMF-Containing Fluidics Device

Figure 16:
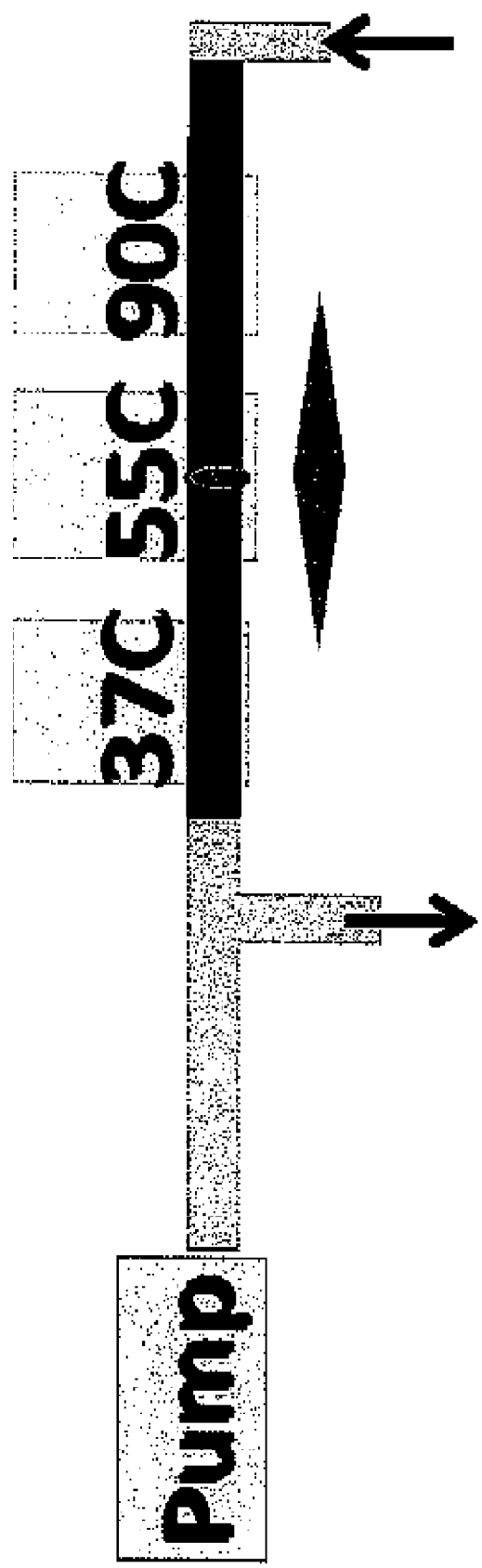
FIG. 16 is a schematic view of a fluidics device containing an NMF insert and having multiple heating zones, e.g., for use in amplification.

NMF obtained as described in the preceding section of this Example was placed in PBS, wrapped in parafilm, and frozen at −80° C. for two hours. ~2-3 mm disks were punched out of the frozen NMF using a punch. An NMF insert was then placed into the center of a 6 cm conduit (FEP shrink tubing, McMaster-Carr #8703K68). The conduit was shrunk around the NMF insert to lock it into position. Next, a 90-degree elbow fixture was attached to one end of the conduit to act as sip tube, and a tubing connector was attached to the other end. A sample processing unit was attached via a length of tubing to the tubing connector, and the conduit was placed into a trough in aluminum heating fingers and allowed to equilibrate for 20 minutes. The configuration is shown in FIG. 16.

Fluidics Assay

Magnetic particles, each derivatized with approximately equal concentrations of 3' and 5' Albicans/Tropicalis probes, were placed in hyb buffer (10% formamide, 4×SSPE, 0.05% Tween 20 in 1×TE) at Fe[0.2 mM] which relates the concentration of the particles. These magnetic particles are able to bind to either the 3' or 5' ends of a template oligonucleotide and thus aggregate in the presence of such a template oligonucleotide.

Template oligonucleotide was provided in TE at a concentration of $4 \times 10^{10}$ oligos/µl.

20 µl of the particle solution was mixed with either 20 µl of the template oligonucleotide solution or 20 µl of TE as a negative control, and the mixture was placed at the sip tube intake. 20 µl of the mixture was aspirated into the conduit. After a three second delay, the sample was moved to the 90° C. heating station for three minutes. Next, the sample was moved to the NMF insert (not in magnetic field) at 58° C. The sample was moved rapidly back and forth through the NMF for 30 seconds to mimic mixing or shaking. The sample was then slowly moved through the NMF while the NMF was alternately exposed to magnetic field for five seconds and demagnetized for five seconds. The 90° C. heating and 58° C. cooling steps were repeated seven times, ~150 seconds total.

The sample was then aspirated past the dispense valve. The dispense valve was opened and the sample was dispensed into a amplification tube, heated for five minutes at 37° C., and a T2 measurement was taken.

The above-described protocol was run three times each with template oligonucleotide and with negative control. Results are shown in Table 5 and demonstrate substantial aggregation of the magnetic particles in the presence of the template oligonucleotides.

TABLE 5

| Oligo/µl | Run #1 (T2 in ms) | Run #2 (T2 in ms) | Run #3 (T2 in ms) |
| --- | --- | --- | --- |
| 0 (neg. ctrl.) | 90.81 | 102.88 | 110.73 |
| $4 \times 10^{10}$ oligos/µl | 890.92 | 1025.45 | 1034.85 |

EXAMPLE 9

Further Working Example Using NMF in a Fluidics Assay

Additional experiments were performed as described in Example 8, except that the amount of template oligonucleotide used was 0, $10^{10}$, $10^{11}$, or $10^{12}$ template oligonucleotides, and two runs were performed for each amount of template oligonucleotide. The conduit was flushed out with TE and 0.1% Tween thoroughly between each sample. Results are shown in Table 6 and demonstrate that T2 increases with increasing concentration of template oligonucleotide.

TABLE 6

| Log oligo/rxn. | Run #1 (T2 in ms) | Run #2 (T2 in ms) |
| --- | --- | --- |
| 0 (neg. ctrl.) | 79.92 | 70.16 |
| 10 | 131.06 | 89.88 |
| 11 | 252.74 | 210.16 |
| 12 | 1091.99 | 1033.38 |

EXAMPLE 10

Fluidic Device Incorporating a Bead-Beater to Extract and Purify DNA

In order to diagnose the presence of a pathogen, e.g., *Candida*, in whole blood using a fluidic device as described herein, it is desirable to modify and adapt standard steps such as pipetting, centrifugation, and vortexing to the fluidic device context. For example, extraction and purification of DNA from a target pathogen may be performed using a micro-scale syringe-based bead-beating/DNA capture device, e.g., the PureLyse™ device manufactured by Claremont BioSolutions. Such devices, while originally intended for lysing and capturing DNA from microorganisms grown in culture, may be adapted for use with whole blood samples in a fluidic device as described below.

The PureLyse™ device includes a chamber trapping ~100 µm beads of a zirconium-silica mix, with a motor-driven impeller which rotates at ~40,000 RPM when attached to a battery pack. A luer-lok fixture allows the device to be connected to a syringe. An aspiration/expulsion tube is attached to the other side of the chamber, e.g., via a second luer-lok fixture.

A whole blood sample containing *Candida* is aspirated into the chamber, the impellor motor is activated, and the sample is passed back and forth through the chamber numerous times while bead-beating to lyse the cells and release the DNA. When the bead-beating is performed in the presence of a binding buffer, the DNA is driven onto the beads. The remaining sample can be flushed out of the chamber and the concentrated DNA eluted from the beads using a small amount (100-200 µl) of elution buffer.

The eluted DNA is then ready for amplification. amplification reagents are added, and a thermocycling protocol is followed, e.g., as described herein or using methods known in the art.

A detection assay is then performed, e.g., as described in Examples 8 and 9, using derivatized magnetic particles containing 3' and 5' Albicans/Tropicalis probes.

Parameters that may be varied include, e.g.:
Lysis (e.g., detergent, hypotonicity, sonication)
Bead beating (e.g., time, number of passes, speed of passes, size of beads, capacity of beads)
Concentration of DNA (e.g., no buffer, binding buffer, chaotropic salts)
DNA elution (e.g., washes, elution buffer, volume of elution)
Amplification suitability of extracted *Candida* DNA (e.g., amplification, sensitivity)
Syringe pump (e.g., programming, integration with rest of fluidic device)

In some embodiments, the bead-beater is placed close to the conduit and connected to a remote syringe pump via tubing. This can enable the conduit and the bead-beater to be incorporated into a disposable cartridge format.

In one exemplary configuration, shown in FIG. 17, a blood sample, e.g., in a vacutainer, is added to one or more wells of defined volume, which may include pre-loaded lysis buffer to lyse the blood. Diluent and concentrated binding buffer/chaotropic salt solutions are also pre-loaded into the fluidic device. A syringe pump then aspirates blood/lysis buffer mix into the chamber containing diluents and binding buffer and mixes.

Next, sample is passed through the bead-beater 2-10 times to effect lysis of *Candida* cells and release of *Candida* DNA. The *Candida* DNA remains on the beads in the bead-beater, while the remaining sample is moved to waste or back to reservoir.

The syringe pump then aspirates 150 µl of elution buffer with master mix (master mix is 60 mM Tricine (pH 8.7 at 25° C.), 3.5 mM magnesium chloride, 6% glycerol, 5 mM ammonium sulfate, 5,000 units/10 µL polymerase) and the bead-beater is run for one minute in the presence of elution buffer plus master mix.

Elution buffer containing *Candida* DNA and master mix is then moved to the main conduit, which includes an NMF insert, and the sample is amplification-cycled by moving it to the appropriate heat stations.

Next, magnetic particles are added or preloaded onto the NMF insert, and magnetic cycling is performed to promote clustering.

Finally, the sample is incubated at 37° C. and moved to the MR reader to perform a T2 measurement.

EXAMPLE 11

Working Example Using NMF in a Fluidics Assay to Detect Whole Blood Amplicon To confirm that the fluidics assay described in Examples 8 and 9 is capable of detecting an amplification amplicon from whole blood, additional experiments were performed as described in Example 8, except that oligonucleotides were provided as follows.

1 ml of whole blood, spiked with 0, 33, or 100 cells/mL of *Candida albicans*, was lysed and centrifuged. The supernatant was removed, and the pellet underwent bead beating as described in Example 10. 20 µl of residual solution was added to a amplification reaction, and amplification was performed to generate a whole blood amplicon. 20 µl of the amplicon from the amplification reaction was added to 20 µl of the magnetic beads, as described in Example 8, and the fluidics assay of Example 8 was performed twice for each concentration of *Candida*.

Results are shown in Table 7 and confirm that whole blood amplicons from low levels of *Candida* can be detected using the above-described fluidics assay.

TABLE 7

| Amp CFU/ml | Run #1 (T2 in ms) | Run #2 (T2 in ms) |
|---|---|---|
| 0 (neg. ctrl.) | 45.36 | 47.08 |
| 33 | 65.14 | 62.9 |
| 100 | 267.62 | 265.28 |

EXAMPLE 12

T2 Dependence on Nanoparticle Concentration

In some assays, an NMR detector may be used to detect the presence and/or concentration of nanoparticles rather than detecting, e.g., aggregation or disaggregation of nanoparticles. In general, T2 decreases with increasing concentration of nanoparticles, and thus a standard curve of T2 value versus concentration may be generated for each type of nanoparticle under given conditions. The standard curve may then be used to determine nanoparticle concentration based on observed T2 measurements. Various assays described herein may be adapted accordingly to measure nanoparticle concentration rather than, for example, change in aggregation state.

To demonstrate this principle, a standard curve of T2 was generated using a series of dilutions of a stock solution of ~251 nm nanoparticles. The nanoparticles were stored in glycine buffer at a concentration of 5.9 mM Fe. The dilution buffer was PBS, 0.1% BSA, 0.1% Tween-20, pH. 7.3.

Figure 18:
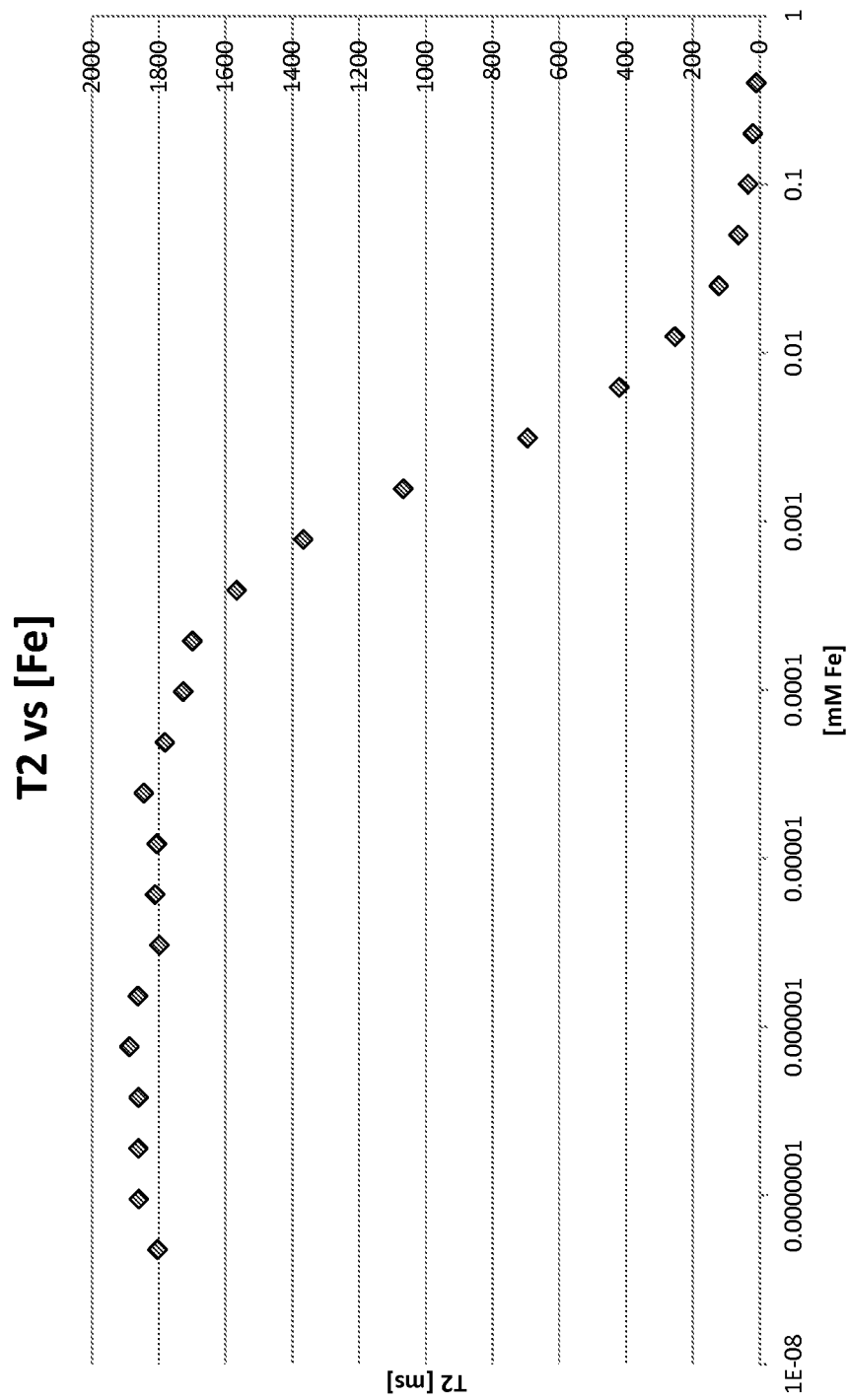
FIG. 18 is a graph showing the dependence of T2 signal on nanoparticle concentration.

A T2 assay was conducted for each diluted sample. The results are shown in FIG. 18 and demonstrate the dependence of the T2 signal on the nanoparticle concentration.

EXAMPLE 13

Nucleic Acid-Based Assays Based on Detection of Nanoparticle Concentration

In one embodiment, an assay, e.g., a panel assay, is designed to detect the presence of one or more particular species, e.g., of *Candida*, other pathogenic organisms, or other analytes, in the context of a fluidic system. An amplification reaction is first conducted to produce nucleic acid amplicon material. The amplicon may be generated from multiple pairs of species-specific primers, or alternatively may be universally primed, i.e., generated from a pair of primers that bind to regions of pathogen DNA, e.g., *Candida* DNA, that are common across species.

Figures 19A, 19B, 19C:
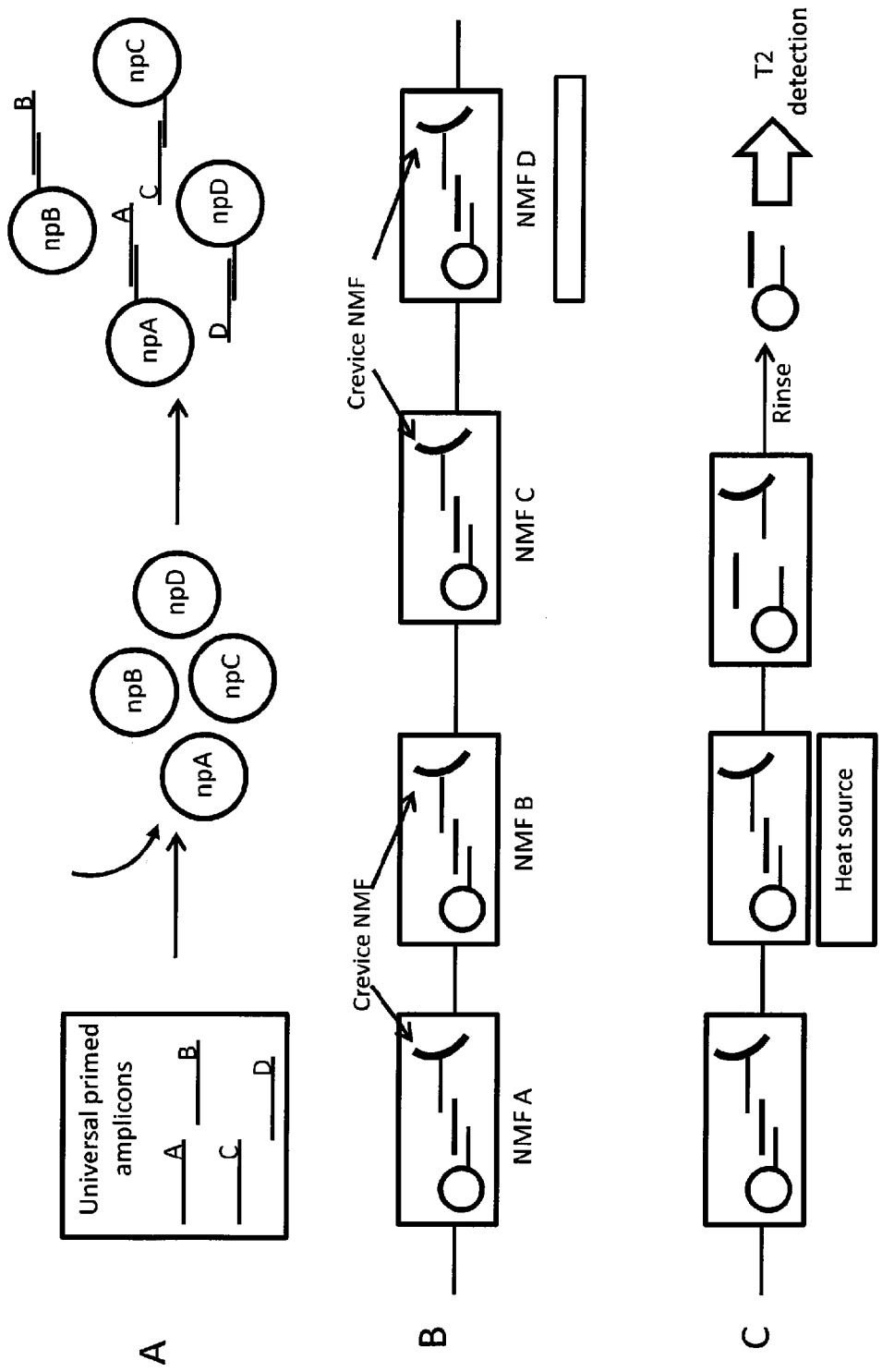
FIGS. 19A-19C are schematic views of a method of separating and detecting amplicons derived from four distinct species of *Candida*.

Next, nanoparticles that have been derivatized with species-specific oligonucleotides that will specifically anneal to the amplicon are added and allowed to incubate with the amplicon. For example, nanoparticle population A is derivatized with an oligonucleotide that is specific for *Candida* species A, nanoparticle population B is derivatized with an oligonucleotide that is specific for *Candida* species B, and likewise for additional nanoparticle populations that may be included in the assay. If amplicon from species A is present, it binds to nanoparticle population A, and likewise for additional species being detected in the assay (FIG. 19A). In this manner, nanoparticle-amplicon complexes are formed. The ratios of nanoparticles to amplicon molecules may be selected to optimize desired binding, e.g., to ensure that most amplicons interact with nanoparticles.

Derivatizable foam sites, e.g., magnetizable or non-magnetizable, e.g., made of nickel metal foam (NMF) or PhyNexus resin, are located at separate sites downstream of the site of nanoparticle addition. In this and the following Examples, NMF is used, but a non-metal or non-magnetizable foam or other material may also be suitable, as no magnet is required. Each NMF foam site is derivatized with sequence-specific oligonucleotides that bind to a second amplicon site that is different from the nanoparticle-oligonucleotide site. For example, NMF A is specific for *Candida* species A, NMF B is specific for *Candida* species B, and likewise for additional species being detected in the assay.

As the solution flows through the NMF locations, each nanoparticle-amplicon complex binds to its corresponding NMF site. For example, if amplicon corresponding to species A is present, nanoparticle population A will bind to NMF A, and likewise for additional species being detected in the assay. The annealing of each oligonucleotide coupled to nanoparticles or NMF is species dependent, and thus the NMF locations separate and/or enrich the amplicon mixture into separate locations in the conduit (FIG. 19B). Optionally, the solution containing nanoparticle-amplicon complexes is passed repeatedly through the NMF sites, e.g., in alternating directions, in order to optimize binding and separation. Optionally, one or more rinsing steps are also included.

The detection of the captured amplicon proceeds, for example, as follows. A small heater is moved close to one NMF location, and it creates a temperature that causes the amplicon-NMF complex to melt. The melting temperature and oligonucleotides may be preselected to result only in melting of the amplicon-NMF complex, or also to result in melting of the nanoparticle-amplicon complex. Free nanoparticle/amplicon are then rinsed through the other NMF locations and ultimately to an NMR detector unit, e.g., a T2 MR reader, to detect the presence, absence, and/or concentration of the nanoparticles (FIG. 19C). In this assay, the T2 signal is not dependent on T2 clustering, but rather is dependent on the nanoparticles providing a magnetic sink and thus changing the T2 signal.

The detection of the other captured amplicons then proceeds by moving the heating source to another NMF location, melting off the nanoparticle-amplicon complex, rinsing to the T2 MR reader, and detecting the T2 change.

An essential feature of the method described in the present Example is that each NMF site only traps the corresponding nanoparticle population in the presence of the corresponding amplicon. If the corresponding amplicon is absent, no specific nanoparticle-NMF binding occurs.

In some instances, e.g., in conjunction with real-time amplification, the concentration of nanoparticles may be used to determine the amount or concentration of pathogen present in the initial sample. In other instances, the assay may only be configured to detect presence or absence of a particular species of pathogen or other analyte, i.e., a "binary" or "yes/no" readout.

Any number of species may be detected as described in the present Example, e.g., 1, 2, 3, 4, 5, or more distinct species. The species may belong to a single genus, e.g., *Candida*, or may belong to multiple genera. In addition, the method of the present Example, or other examples described below, may be used in conjunction with detection using other methologies, e.g., detection of an antigen using an antibody, and/or detection of aggregation or disaggregation of nanoparticles.

EXAMPLE 14

Additional Nucleic Acid-Based Assays Based on Detection of Nanoparticle Concentration In some instances, it may not be necessary or desirable to determine the presence or absence of each of numerous pathogenic species. Typically, the primary goal of assaying for the presence of a pathogen such as *Candida* is to determine the optimal course of treatment, not to determine the identity of a particular *Candida* species per se. Accordingly, a simpler and/or less expensive version of the assay of Example 13 may be employed.

For example, assume that *Candida* species A and B are both optimally treated with drug 1 (e.g., Fluconazole), and *Candida* species C and D are both optimally treated with drug 2 (e.g., Micafungin, trade name Mycamine). According to the assay as described in Example 13 and FIGS. 19A-19C, four separate nanoparticle populations and four separate corresponding foam sites, e.g., NMF sites, may be generated. Each nanoparticle population is derivatized with an oligonucleotide that is specific for the corresponding *Candida* species, and each NMF site is derivatized with a second, different oligonucleotide that is specific for the corresponding *Candida* species.

As an alternative approach, a first nanoparticle population may be derivatized with two distinct oligonucleotides—one specific for species A and one specific for species B. A second nanoparticle population may be likewise derivatized with two distinct oligonucleotides—one specific for species C and one specific for species D. Similarly, two NMF sites are generated—one with oligonucleotides specific for species A and B and one with oligonucleotides specific for species C and D. The assay is otherwise run in accordance with Example 13. The result is that the first NMF site separates and/or enriches the amplicon mixture into two pools—one corresponding species A or B, and one corresponding to species C or D. The subsequent detection step identifies the presence, absence, and/or concentration of species A or B, and also identifies the presence, absence, and/or concentration of species C or D.

By design, this assay is unable to distinguish between species A and B, and it is unable to distinguish between species C and D. Nevertheless, the assay allows the medical practitioner to determine whether drug 1 or drug 2 is indicated, and because fewer separate nanoparticles and NMF site are required, the assay may be less expensive, faster, or otherwise more desirable than an assay that provides additional information that is not needed in a given context.

Variations on the approach described in the present Example are possible. For example, the assay may be adapted to detect, e.g., the presence, absence, or concentration of a Gram-negative versus a Gram-positive organism, or a fungal versus a bacterial organism. In some embodiments, a single nanoparticle population and NMF site may be used to recognize 3, 4, 5, or more distinct species. In some embodiments, a non-magnetizable foam may be used instead of NMF.

EXAMPLE 15

Non-Nucleic Acid-Based Assays Based on Detection of Nanoparticle Concentration

The methods described in Examples 13 and 14 may be modified to detect non-nucleic acid-based samples, e.g., proteins, small molecules, aptamers, or other antigens. In some embodiments, antigen-binding molecules, e.g., antibodies or antigen-binding fragments thereof, may be coupled to nanoparticles and/or foam sites, e.g., NMF sites, to facilitate separation and detection of a plurality of molecules, organisms, or other analytes.

In one embodiment, monoclonal antibodies are coupled to a population of nanoparticles. The antibody is specific for a desired analyte, e.g., a protein or pathogenic organism expressing a particular receptor or other feature. Additional antibodies with desired specificities are coupled to corresponding populations of nanoparticles. In this manner, a plurality of nanoparticle populations, each specific for a desired analyte, is prepared.

Corresponding to each nanoparticle population is an NMF site derivatized with a second antibody to the corresponding analyte and located at separate sites downstream of the site of nanoparticle addition. The second antibody is capable of binding to at least one site on the analyte that is distinct from the site recognized by the monoclonal antibody coupled to nanoparticles. For example, the second antibody may be polyclonal, or it may be monoclonal and recognize a different portion of the analyte.

The assay now proceeds essentially as described in Examples 13 and 14. The derivatized nanoparticles are allowed to incubate with sample containing the analytes. If analyte A is present, it binds to nanoparticle population A, and likewise for additional species being detected in the assay. In this manner, nanoparticle-analyte complexes are formed. The ratios of nanoparticles to analyte molecules may be selected to optimize desired binding, e.g., to ensure that most analytes interact with nanoparticles.

Next, the solution containing the nanoparticle-analyte complexes flows through the NMF sites, resulting in binding of nanoparticle-analyte complexes to the corresponding NMF site. The binding of each analyte to both nanoparticles and NMF site is species dependent, and thus the NMF locations separate and/or enrich the analyte mixture into separate locations in the conduit. Optionally, the solution containing nanoparticle-analyte complexes is passed repeatedly through the NMF sites, e.g., in alternating directions, in order to optimize binding and separation. Optionally, one or more rinsing steps are also included.

For detection, the analyte-NMF interaction is disrupted, e.g., by adding competing analyte. Free nanoparticles are then rinsed through the other NMF locations and ultimately to an NMR detector unit, e.g., a T2 MR reader, to detect the presence, absence, and/or concentration of the nanoparticles. As before, in this assay, the T2 signal is not dependent on T2 clustering, but rather is dependent on the nanoparticles providing a magnetic sink and thus changing the T2 signal.

The detection of the other captured analytes then proceeds by adding corresponding competing analyte to another NMF location, disrupting the nanoparticle-analyte complex, rinsing to the T2 MR reader, and detecting the T2 change.

EXAMPLE 16

Additional Non-Nucleic Acid-Based Assays Based on Detection of Nanoparticle Concentration In some instances, the analyte to be detected does not allow for simultaneous binding of two antibodies or other binding molecules, e.g., because the analyte is too small. Accordingly, the assay of Example 15 may be modified to not require simultaneous direct binding of two antibodies or other binding molecules to the analyte.

In one embodiment, a population of nanoparticles is derivatized with a monoclonal antibody, e.g., a mouse monoclonal antibody, with only one antigen-binding fragment specific for a desired analyte. For example, either a monovalent or a bispecific antibody may be used. Additional antibodies with desired specificities are coupled to corresponding populations of nanoparticles. In this manner, a plurality of nanoparticle populations, each specific for a desired analyte, is prepared.

Corresponding to each nanoparticle population is a foam site, e.g., an NMF site, derivatized with the corresponding analyte and located at separate sites downstream of the site of nanoparticle addition. A second foam site, e.g., NMF site, is located further downstream and is derivatized, for example, with goat anti-mouse antibodies that recognize the mouse antibodies coupled to the nanoparticles.

The derivatized nanoparticles are allowed to incubate with sample containing the analytes. If analyte A is present, it binds to nanoparticle population A, and likewise for additional species being detected in the assay. In this manner, nanoparticle-analyte complexes are formed. The ratios of nanoparticles to analyte molecules may be selected to optimize desired binding, e.g., to ensure that most analytes interact with nanoparticles.

Next, for each analyte, the solution containing the nanoparticle-analyte complexes flows through the NMF site derivatized with the corresponding analyte. Only "empty"

nanoparticle-antibody complexes, i.e., those not already bound to an analyte, will bind to the derivatized NMF. Optionally, the reaction conditions are optimized so that the mouse antibody-analyte off-rate is substantially longer than the period during which the nanoparticle-mouse antibody-analyte complex incubates with the derivatized NMF. Similarly, only "full" nanoparticle-antibody complexes, i.e., those already bound to analyte, will flow through to the second NMF site derivatized with goat anti-mouse antibodies, at which site the nanoparticles will bind.

For detection of "full" nanoparticle-analyte complexes bound to the NMF site derivatized with goat anti-mouse antibodies, the antibody-antibody interaction is disrupted, e.g., by adding competing mouse antibody. Free nanoparticles are then rinsed to an NMR detector unit, e.g., a T2 MR reader, to detect the presence, absence, and/or concentration of the nanoparticles. Likewise, for detection of "empty" nanoparticle-analyte complexes bound to the NMF site derivatized with analyte, the antibody-analyte interaction is disrupted, e.g., by adding competing free analyte. Free nanoparticles are then rinsed to an NMR detector unit, e.g., a T2 MR reader, to detect the presence, absence, and/or concentration of the nanoparticles.

In some instances, the assay is run in a single fluidics conduit with multiple foam sites, e.g., NMF sites, specific for corresponding analytes, and a single NMF site furthest downstream derivatized with goat anti-mouse antibodies. The assay is then run serially for each analyte, allowing detection of one analyte to occur before the next is added.

Alternatively, the assay may be conducted in a plurality of conduits, wherein each conduit contains two NMF sites—one derivatized with a particular analyte, and one derivatized with goat anti-mouse antibodies. In this configuration, a simultaneous multiplexing assay may be run.

In alternative embodiments, the NMF site derivatized with goat anti-mouse antibodies may be located upstream of the NMF site derivatized with analyte molecules. In such an embodiment, both "empty" and "full" nanoparticles bind to the goat anti-mouse NMF site, and following elution with competing goat anti-mouse antibody, "empty" nanoparticle-antibody complexes bind to the downstream NMF site while "full" nanoparticle-antibody complexes proceed to the NMR reader for detection. "Empty" complexes may subsequently be eluted for detection as well.

In the present Example and any of the embodiments described herein, mouse antibodies may be replaced with any other type of antibodies specific for the desired analyte, and similarly, goat anti-mouse antibodies may be replaced with any other type of antibodies that recognize the analyte-specific antibodies. In some embodiments, a non-magnetizable foam may be used instead of NMF.

EXAMPLE 17

Nanoparticles with Multiple Specificities

Example 14 describes nanoparticles with multiple specificities for different species of pathogen DNA, e.g., nanoparticles that are derivatized with a plurality of distinct oligonucleotides. In an alternative embodiment, nanoparticles may be derivatized, e.g., with both oligonucleotides and antibodies. For example, a nanoparticle may be derivatized with an oligonucleotide that is specific for species A of a pathogen, e.g., *Candida*, and the same nanoparticle may also be derivatized with an antibody that is specific for a particular analyte, e.g., tacrolimus. Such particles may be used to perform assays that include combinations of the steps described, e.g., in Examples 13-16.

EXAMPLE 18

Multiplexing in a Single Conduit and in Multiple Conduits

In any of the embodiments described herein, a panel of analytes may be analyzed and detected in at least one of two ways. In one approach, the assay is multiplexed so that there are multiple analyte and/or nanoparticle binding sites throughout a single conduit. The assay is designed to detect each analyte, or a subset thereof, using fluidic transfer through the single conduit. In a second approach, conduits are arranged in parallel so that a separate conduit is used for each analyte. The latter approach may, for example, minimize non-specific binding by reducing the number of foam sites, e.g., NMF sites, to which a given population of nanoparticles and/or analytes is exposed.

In some embodiments, only one analyte is detected in a single experiment. In such cases, multiple conduits may optionally still be used, e.g., to transfer buffers or other reagents.

OTHER EMBODIMENTS

All publications, patents, and patent applications mentioned in this specification are herein incorporated by reference to the same extent as if each independent publication or patent application was specifically and individually indicated to be incorporated by reference.

While the invention has been described in connection with specific embodiments thereof, it will be understood that it is capable of further modifications and this application is intended to cover any variations, uses, or adaptations of the invention following, in general, the principles of the invention and including such departures from the present disclosure that come within known or customary practice within the art to which the invention pertains and may be applied to the essential features hereinbefore set forth, and follows in the scope of the claims.

Other embodiments are within the claims.

What is claimed is:

1. A device comprising:
   (a) a conduit comprising:
      (a1) a conduit inlet configured for introduction of a sample at a first site of said conduit; and
      (a2) a conduit outlet at a second site of said conduit; said conduit being fluidically connected to:
   (b) a first unit comprising:
      (b1) a slot for insertion of a cartridge comprising magnetic particles having binding moieties linked thereto, and
      (b2) a pin manifold fluidically connected to said conduit inlet and configured to be detachably attached to said cartridge, said pin manifold comprising a plurality of pins each capable of being fluidically connected to a sample of said cartridge;
   (c) a second unit fluidically connected to said first unit through said conduit and disposed downstream of said first unit, wherein said second unit is a sample processing unit that comprises:
      (c1) a plurality of zones comprising thermally conductive material, wherein the temperature of each said zone is maintained or modulated independently of said other zones;
      (c2) a second unit portion of said conduit for conducting flow of a sample through said zones, wherein said second unit portion of said conduit passes through each of said plurality of zones; and
      (c3) a thermal controller coupled to said plurality of zones, wherein said thermal controller is programmed to maintain or modulate said temperature of each said zone in a pre-defined manner;
   (d) a third unit fluidically connected to said second unit through said conduit and disposed downstream of said second unit, wherein said third unit comprises:
      (d1) a third unit portion of said conduit;
      (d2) a plurality of magnets disposed along at least a portion of the length of said third unit portion of said conduit, each said magnet creating a bias magnetic field, wherein:
         (d2.i) each said magnet is capable of being adjusted to create a magnetic field gradient inside said third unit portion of said conduit of sufficient strength to hold magnetic particles having binding moieties linked thereto in a particular volume in said third unit portion of said conduit proximal to said magnet;
         (d2.ii) each said magnet is capable of being adjusted to create a magnetic field gradient inside said third unit portion of said conduit of insufficient strength to hold said magnetic particles in a particular volume in said third unit portion of said conduit proximal to said magnet; and
         (d2.iii) said magnets are disposed along said third unit portion of said conduit such that said bias magnetic fields of said plurality of magnets do not overlap significantly inside said third unit portion of said conduit,
      wherein said third unit is configured to allow a plurality of analytes to bind to said binding moieties of said magnetic particles when said magnetic particles are held by said magnets in a particular volume in said third unit portion of said conduit or are released from said particular volume in said third unit portion of said conduit, and wherein said third unit is further configured to assist in agglomeration of said magnetic particles and is configured to employ gradient magnetic assisted agglomeration; and (e) a fourth unit fluidically connected to said third unit through said conduit and disposed downstream of said third unit, wherein said fourth unit comprises a nuclear magnetic resonance detector comprising:

(e1) a support defining a well for holding a sample comprising magnetic particles and analyte;

(e2) a magnet creating a bias magnetic field inside said well; and (e3) an RF coil disposed about said well, said RF coil configured to detect a signal produced by exposing said sample to said bias magnetic field and an RF excitation, thereby detecting said analyte;

wherein said conduit is configured to receive a fluidic actuation device.

2. The device of claim 1, further comprising a mixing manifold fluidically connected to said pin manifold through a plurality of pin manifold conduits, wherein said mixing manifold is further fluidically connected to said conduit and is disposed:

(a) downstream of said first unit and upstream of said second unit; or (b) downstream of said second unit and upstream of said third unit.

3. The device of claim 1, wherein said device is configured for measuring the presence or concentrations of said analyte or said plurality of analytes, and wherein said device is further configured for introduction of one or more samples comprising said analyte or said plurality of analytes.

4. The device of claim 3, said one or more samples comprising a biological sample, plant material, a plant by-product, an oil, other natural materials, or one or more samples derived therefrom.

5. The device of claim 4, wherein said biological sample is selected from the group consisting of blood, sweat, tears, urine, saliva, semen, seminal fluid, serum, plasma, cerebrospinal fluid (CSF), ascites, lymph, feces, vaginal fluid, vaginal tissue, sputum, nasopharyngeal aspirate or swab, lacrimal fluid, mucous, epithelial swab, buccal swab, tissue, tissue extract, skin, hair, organ, bone, tooth, tumor, and one or more samples derived therefrom.

6. The device of claim 5, wherein said biological sample comprises blood.

7. The device of claim 5, wherein said biological sample comprises urine.

8. The device of claim 3, wherein said analyte or said plurality of analytes are selected from the group consisting of a protein, a peptide, a polypeptide, an amino acid, a nucleic acid, an oligonucleotide, RNA, DNA, an antibody, a carbohydrate, a polysaccharide, glucose, a lipid, a gas, an electrolyte, a lipoprotein, cholesterol, a fatty acid, a glycoprotein, a proteoglycan, a lipopolysaccharide, a cell surface marker, a cytoplasmic marker, a therapeutic agent, a metabolite of a therapeutic agent, a marker for the detection of a chemical weapon, a marker for the detection of a biological weapon, an organism, a pathogen, a parasite, a protist, a fungus, a bacterium, an actinomycete, a cell, a tumor cell, a stem cell, a white blood cell, a virus, a prion, a plant component, a plant by-product, algae, an algae by-product, plant growth hormone, an insecticide, a man-made toxin, an environmental toxin, an oil component, and components derived therefrom.

9. The device of claim 8, wherein said analyte or said plurality of analytes comprise pathogens or components derived therefrom.

10. The device of claim 9, wherein said pathogens comprise fungi.

11. The device of claim 10, wherein said fungi comprise *Candida*.

12. The device of claim 11, wherein said fungi comprise a plurality of *Candida* strains.

13. The device of claim 12, wherein said fungi comprise *C. albicans, C. glabrata, C. krusei, C. tropicalis,* or *C. parapsilosis*.

14. The device of claim 3, wherein said analyte or said plurality of analytes comprise an antifungal drug.

15. The device of claim 14, wherein said antifungal drug is fluconazole.

16. The device of claim 3, wherein said analyte or said plurality of analytes further comprise fungi comprising a plurality of *Candida* strains.

17. The device of claim 3, wherein said device is configured for measuring the presence or concentrations of creatinine, tacrolimus, and a plurality of *Candida* strains, and wherein said device is further configured for measuring the presence or concentration of fluconazole.

18. The device of claim 3, wherein said binding moieties of said magnetic particles have distinct specificities for a plurality of pathogens.

19. The device of claim 3, wherein said binding moieties of said magnetic particles have distinct specificities for said plurality of analytes.

20. The device of claim 18, wherein said binding moieties of said magnetic particles have distinct specificities for a plurality of *Candida* strains.

21. The device of claim 3, wherein said measuring the presence or concentration of said analyte or said plurality of analytes is used to diagnose a medical condition or a plant condition.

22. The device of claim 21, wherein said medical condition is an adverse drug response.

23. The device of claim 21, wherein said medical condition is an infection.

24. The device of claim 21, wherein said medical condition is selected from the group consisting of pain, fever, infection, a cardiac condition, stroke, thrombosis, heart attack, a gastrointestinal disorder, a urinary tract disorder, a skin disorder, a blood disorder, and a cancer.

25. The device of claim 21, wherein said diagnosis of said plant condition comprises measuring the presence or concentration of plant growth hormone, insecticide, a man-made toxin, an environmental toxin, a nucleic acid sequence associated with insect resistance or susceptibility, algae, or algae by-products.

26. The device of claim 3, wherein said measuring the presence or concentration of said analyte or said plurality of analytes is used to determine an appropriate dose of a therapeutic agent in a patient from whom said one or more samples are derived.

* * * * *

SEQUENCE LISTING

<160> NUMBER OF SEQ ID NOS: 17

<210> SEQ ID NO 1
<211> LENGTH: 20
<212> TYPE: DNA
<213> ORGANISM: Artificial Sequence
<220> FEATURE:
<223> OTHER INFORMATION: Pan Candida- PCR Forward Primer

```
<400> SEQUENCE: 1
ggcatgcctg tttgagcgtc                                              20

<210> SEQ ID NO 2
<211> LENGTH: 29
<212> TYPE: DNA
<213> ORGANISM: Artificial Sequence
<220> FEATURE:
<223> OTHER INFORMATION: Pan Candida- PCR Reverse Primer

<400> SEQUENCE: 2
gcttattgat atgcttaagt tcagcgggt                                    29

<210> SEQ ID NO 3
<211> LENGTH: 23
<212> TYPE: DNA
<213> ORGANISM: Artificial Sequence
<220> FEATURE:
<223> OTHER INFORMATION: Candida albicans Probe #1

<400> SEQUENCE: 3
acccagcggt ttgagggaga aac                                          23

<210> SEQ ID NO 4
<211> LENGTH: 30
<212> TYPE: DNA
<213> ORGANISM: Artificial Sequence
<220> FEATURE:
<223> OTHER INFORMATION: Candida albicans Probe #2

<400> SEQUENCE: 4
aaagtttgaa gatatacgtg gtggacgtta                                   30

<210> SEQ ID NO 5
<211> LENGTH: 21
<212> TYPE: DNA
<213> ORGANISM: Artificial Sequence
<220> FEATURE:
<223> OTHER INFORMATION: Candida krusei Probe #1

<400> SEQUENCE: 5
cgcacgcgca agatggaaac g                                            21

<210> SEQ ID NO 6
<211> LENGTH: 23
<212> TYPE: DNA
<213> ORGANISM: Artificial Sequence
<220> FEATURE:
<223> OTHER INFORMATION: Candida krusei Probe #2

<400> SEQUENCE: 6
aagttcagcg ggtattccta cct                                          23

<210> SEQ ID NO 7
<211> LENGTH: 27
<212> TYPE: DNA
<213> ORGANISM: Artificial Sequence
<220> FEATURE:
<223> OTHER INFORMATION: Candida krusei probe

<400> SEQUENCE: 7 agcttttttgt tgtctcgcaa cactcgc                                     27

<210> SEQ ID NO 8
<211> LENGTH: 26
```

```
<212> TYPE: DNA
<213> ORGANISM: Artificial Sequence
<220> FEATURE:
<223> OTHER INFORMATION: Candida glabrata Probe #1

<400> SEQUENCE: 8
ctaccaaaca caatgtgttt gagaag                                          26

<210> SEQ ID NO 9
<211> LENGTH: 31
<212> TYPE: DNA
<213> ORGANISM: Artificial Sequence
<220> FEATURE:
<223> OTHER INFORMATION: Candida glabrata Probe #2

<400> SEQUENCE: 9
cctgatttga ggtcaaactt aaagacgtct g                                    31

<210> SEQ ID NO 10
<211> LENGTH: 24
<212> TYPE: DNA
<213> ORGANISM: Artificial Sequence
<220> FEATURE:
<223> OTHER INFORMATION: Candida parapsilosis/tropicalis Probe #1
<220> FEATURE:
<221> NAME/KEY: misc_feature
<222> LOCATION: (22)..(22)
<223> OTHER INFORMATION: n is 5' 5-Nitroindole

<400> SEQUENCE: 10
agtcctacct gatttgaggt cnaa                                            24

<210> SEQ ID NO 11
<211> LENGTH: 21
<212> TYPE: DNA
<213> ORGANISM: Artificial Sequence
<220> FEATURE:
<223> OTHER INFORMATION: Candida parapsilosis/tropicalis Probe #2
<220> FEATURE:
<221> NAME/KEY: misc_feature
<222> LOCATION: (4)..(4)
<223> OTHER INFORMATION: n is 5' 5-Nitroindole

<400> SEQUENCE: 11
ccgngggttt gagggagaaa t                                               21

<210> SEQ ID NO 12
<211> LENGTH: 33
<212> TYPE: DNA
<213> ORGANISM: Candida tropicalis

<400> SEQUENCE: 12
aaagttatga aataaattgt ggtggccact agc                                  33

<210> SEQ ID NO 13
<211> LENGTH: 22
<212> TYPE: DNA
<213> ORGANISM: Candida tropicalis

<400> SEQUENCE: 13
acccgggggt ttgagggaga aa                                              22

<210> SEQ ID NO 14
<211> LENGTH: 24
<212> TYPE: DNA
<213> ORGANISM: Candida parapsilosis
```

```
<400> SEQUENCE: 14
agtcctacct gatttgaggt cgaa                                              24

<210> SEQ ID NO 15
<211> LENGTH: 21
<212> TYPE: DNA
<213> ORGANISM: Candida parapsilosis

<400> SEQUENCE: 15
ccgagggttt gagggagaaa t                                                 21

<210> SEQ ID NO 16
<211> LENGTH: 28
<212> TYPE: DNA
<213> ORGANISM: Artificial Sequence
<220> FEATURE:
<223> OTHER INFORMATION: inhibition control 5'

<400> SEQUENCE: 16
ggaataatac gccgaccagc ttgcacta                                          28

<210> SEQ ID NO 17
<211> LENGTH: 33
<212> TYPE: DNA
<213> ORGANISM: Artificial Sequence
<220> FEATURE:
<223> OTHER INFORMATION: inhbition control 3'

<400> SEQUENCE: 17
ggttgtcgaa ggatctattt cagtatgatg cag                                    33
```